US010114292B2

(12) United States Patent
Inoue et al.

(10) Patent No.: US 10,114,292 B2
(45) Date of Patent: Oct. 30, 2018

(54) PATTERN FORMING METHOD, RESIST PATTERN, AND METHOD FOR MANUFACTURING ELECTRONIC DEVICE

(71) Applicant: FUJIFILM Corporation, Tokyo (JP)

(72) Inventors: Naoki Inoue, Haibara-gun (JP); Naohiro Tango, Haibara-gun (JP); Michihiro Shirakawa, Haibara-gun (JP); Kei Yamamoto, Haibara-gun (JP); Akiyoshi Goto, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 15/460,380

(22) Filed: Mar. 16, 2017

(65) Prior Publication Data

US 2017/0184974 A1 Jun. 29, 2017

Related U.S. Application Data

(63) Continuation of application No. PCT/JP2015/077124, filed on Sep. 25, 2015.

(30) Foreign Application Priority Data

Sep. 30, 2014 (JP) ................................ 2014-202570

(51) Int. Cl.

| | |
|---|---|
| ***G03F 7/004*** | (2006.01) |
| ***G03F 7/32*** | (2006.01) |
| ***G03F 7/11*** | (2006.01) |
| ***G03F 7/38*** | (2006.01) |
| ***H01L 21/027*** | (2006.01) |
| ***C08F 220/18*** | (2006.01) |
| ***C08F 220/28*** | (2006.01) |
| ***G03F 7/09*** | (2006.01) |
| ***G03F 7/16*** | (2006.01) |
| ***G03F 7/20*** | (2006.01) |
| ***G03F 7/40*** | (2006.01) |
| ***G03F 7/039*** | (2006.01) |

(52) U.S. Cl.

CPC ........... *G03F 7/327* (2013.01); *C08F 220/18* (2013.01); *C08F 220/28* (2013.01); *G03F 7/0045* (2013.01); *G03F 7/0397* (2013.01); *G03F 7/091* (2013.01); *G03F 7/11* (2013.01); *G03F 7/16* (2013.01); *G03F 7/168* (2013.01); *G03F 7/2041* (2013.01); *G03F 7/325* (2013.01); *G03F 7/38* (2013.01); *G03F 7/40* (2013.01); *H01L 21/027* (2013.01); *C08F 2220/283* (2013.01)

(58) Field of Classification Search

CPC ...... G03F 7/004; G03F 7/0397; G03F 7/0045; G03F 7/0046; G03F 7/11; G03F 7/2041; G03F 7/325; H01L 21/0274

USPC ............ 430/322, 325, 331, 434, 435, 271.1

See application file for complete search history.

(56) References Cited

U.S. PATENT DOCUMENTS

| | | | | |
|---|---|---|---|---|
| 5,804,354 | A | 9/1998 | Watanabe et al. | |
| 8,921,031 | B2 * | 12/2014 | Bae | H01L 21/3081 430/270.1 |
| 2004/0131957 | A1 | 7/2004 | Kubota et al. | |
| 2013/0244438 | A1 | 9/2013 | Bae et al. | |
| 2014/0113223 | A1 | 4/2014 | Kato et al. | |
| 2014/0212816 | A1 | 7/2014 | Bae et al. | |
| 2014/0227637 | A1 * | 8/2014 | Kato | G03F 7/095 430/14 |
| 2014/0234761 | A1 | 8/2014 | Shirakawa et al. | |
| 2015/0234278 | A1 | 8/2015 | Hatakeyama et al. | |
| 2015/0338743 | A1 * | 11/2015 | Iwato | G03F 7/11 430/18 |
| 2016/0004156 | A1 | 1/2016 | Sugiyama et al. | |
| 2016/0041467 | A1 | 2/2016 | Bae et al. | |
| 2016/0122574 | A1 * | 5/2016 | Lee | G03F 7/11 524/516 |
| 2016/0137874 | A1 * | 5/2016 | Bae | H01L 21/3081 430/273.1 |
| 2016/0299432 | A1 * | 10/2016 | Furukawa | G03F 7/11 |

(Continued)

FOREIGN PATENT DOCUMENTS

| | | | |
|---|---|---|---|
| JP | 07-179754 | A | 7/1995 |
| JP | 2002-124448 | A | 4/2002 |
| JP | 2004-046217 | A | 2/2004 |

(Continued)

OTHER PUBLICATIONS

International Preliminary Report on Patentability dated Apr. 13, 2017 issued by the International Bureau in International Application PCT/JP2015/077124 with the translation of Written Opinion.

(Continued)

*Primary Examiner* — Amanda C. Walke
(74) *Attorney, Agent, or Firm* — Sughrue Mion, PLLC

(57) ABSTRACT

Provided are a pattern forming method capable of providing good DOF and LER, a resist pattern formed by the pattern forming method, and a method for manufacturing an electronic device, including the pattern forming method. The pattern forming method includes a step a of coating an active-light-sensitive or radiation-sensitive resin composition onto a substrate to form a resist film, a step b of coating a composition for forming an upper layer film onto the resist film, followed by carrying out heating to 100° C. or higher, to form the upper layer film on the resist film, a step c of exposing the resist film having the upper layer film formed thereon, and a step d of developing the exposed resist film using a developer including an organic solvent to form a pattern.

18 Claims, No Drawings

(56) References Cited

U.S. PATENT DOCUMENTS

2017/0168382 A1 6/2017 Fukui

FOREIGN PATENT DOCUMENTS

| | | | |
|---|---|---|---|
| JP | 2013-033227 | A | 2/2013 |
| JP | 2013-061647 | A | 4/2013 |
| JP | 2013-097002 | A | 5/2013 |
| JP | 2013-097003 | A | 5/2013 |
| JP | 2014-167614 | A | 9/2014 |
| JP | 2014-178566 | A | 9/2014 |
| JP | 2015-152782 | A | 8/2015 |
| JP | 2016-40589 | A | 3/2016 |
| KR | 10-2013-0028695 | A | 3/2013 |

OTHER PUBLICATIONS

International Search Report for PCT/JP2015/077124, dated Oct. 27, 2015.
Communication dated Jan. 2, 2018, issued by the Korean Intellectual Property Office in corresponding Korean Application No. 10-2017-7006956.
Communication dated Feb. 6, 2018, from the Japanese Patent Office in counterpart Application No. 2016-551980.
Office Action dated Jun. 26, 2018 issued by the Japanese Patent Office in counterpart Japanese Application No. 2016-551980.
Office Action dated Jul. 11, 2018 from the Korean Intellectual Property Office in counterpart Korean Application No. 10-2017-7006956.

* cited by examiner

PATTERN FORMING METHOD, RESIST PATTERN, AND METHOD FOR MANUFACTURING ELECTRONIC DEVICE

CROSS-REFERENCE TO RELATED APPLICATIONS

This application is a Continuation of PCT International Application No. PCT/JP2015/077124 filed on Sep. 25, 2015, which claims priority under 35 U.S.C. § 119(a) to Japanese Patent Application No. 2014-202570 filed on Sep. 30, 2014. The above application is hereby expressly incorporated by reference, in its entirety, into the present application.

BACKGROUND OF THE INVENTION

1. Field of the Invention

The present invention relates to a pattern forming method, a resist pattern formed by the pattern forming method, and a method for manufacturing an electronic device, including the pattern forming method.

More specifically, the present invention relates to a pattern forming method which is used for a process for manufacturing a semiconductor such as an integrated circuit (IC), the manufacture of a circuit board for a liquid crystal, a thermal head, or the like, and other lithographic processes for photofabrication, as well as a resist pattern formed by the pattern forming method, a method for manufacturing an electronic device including the pattern forming method, and an electronic device manufactured by the manufacturing method.

2. Description of the Related Art

In processes for manufacturing semiconductor devices such as an IC in the related art, microfabrication by means of lithography using various resist compositions has been carried out. For example, JP2013-061647A describes "a method for forming an electronic device, including (a) a step of providing a semiconductor base including one or more layers on which a pattern is formed; (b) a step of forming a photoresist layer on the one or more layers on which a pattern is formed; (c) a step of coating a photoresist topcoat composition on the photoresist layer, in which the topcoat composition includes a basic quencher, a polymer, and an organic solvent; (d) a step of exposing the layer with chemical rays; and (e) a step of developing the exposed film with an organic solvent developer.

SUMMARY OF THE INVENTION

The present inventors have investigated the method described in JP2013-061647A, and as a result, they have found that there are some cases where depth of focus (DOF: Depth Of Focus) and line edge roughness (LER) are deteriorated.

The present invention has been made taking consideration of the above aspects, and thus has objects to provide a pattern forming method capable of providing good DOF and LER, a resist pattern formed by the pattern forming method, and a method for manufacturing an electronic device, including the pattern forming method.

The present inventors have found that the objects are accomplished by adopting the following configurations. That is, the present invention provides (1) to (8) below.

(1) A pattern forming method comprising a step a of coating an active-light-sensitive or radiation-sensitive resin composition onto a substrate to form a resist film, a step b of coating a composition for forming an upper layer film onto the resist film, followed by carrying out heating to 100° C. or higher, to form the upper layer film on the resist film, a step c of exposing the resist film having the upper layer film formed thereon, and a step d of developing the exposed resist film using a developer including an organic solvent to form a pattern.

(2) The pattern forming method as described in (1), in which the step b is a step of carrying out heating to 120° C. or higher.

(3) The pattern forming method as described in (1) or (2), in which the composition for forming an upper layer film includes at least one of a basic compound or a base generator.

(4) The pattern forming method as described in any one of (1) to (3), in which the step d is a step of carrying out development using a developer including butyl acetate.

(5) The pattern forming method as described in any one of (1) to (3), in which the step d is a step of carrying out development using a developer including 2-heptanone.

(6) The pattern forming method as described in any one of (1) to (3), in which the step d is a step of carrying out development using a developer including butyl propionate.

(7) A resist pattern formed by the pattern forming method as described in any one of (1) to (6).

(8) A method for manufacturing an electronic device, comprising the pattern forming method as described in any one of (1) to (6).

According to the present invention, it is possible to provide a pattern forming method capable of providing good DOF and LER, a resist pattern formed by the pattern forming method, and a method for manufacturing an electronic device, including the pattern forming method.

DESCRIPTION OF THE PREFERRED EMBODIMENTS

Hereinafter, specific contents for carrying out the present invention will be described.

Moreover, in citations for a group (atomic group) in the present specification, in a case where the group is denoted without specifying whether it is substituted or unsubstituted, the group includes both a group not having a substituent and a group having a substituent. For example, an "alkyl group" includes not only an alkyl group not having a substituent (unsubstituted alkyl group), but also an alkyl group having a substituent (substituted alkyl group).

"Active light" or "radiation" in the present specification means, for example, a bright line spectrum of a mercury lamp, far ultraviolet rays represented by an excimer laser, extreme ultraviolet rays (EUV light), X-rays, electron beams (EB), or the like. In addition, in the present invention, light means active light or radiation. Furthermore, unless otherwise specified, "exposure" in the present specification includes not only exposure by a mercury lamp, far ultraviolet rays represented by an excimer laser, extreme ultraviolet rays, X-rays, EUV light, or the like, but also writing by particle rays such as electron beams and ion beams.

The pattern forming method of the present invention is directed to a pattern forming method including a step a of coating an active-light-sensitive or radiation-sensitive resin composition onto a substrate to form a resist film, a step b of coating a composition for forming an upper layer film onto the resist film, followed by carrying out heating to 100° C. or higher, to form the upper layer film on the resist film, a step c of exposing the resist film having the upper layer film formed thereon, and a step d of developing the exposed resist film using a developer including an organic solvent to form a pattern.

Accordingly, it is possible to realize enhancement of depth of focus (DOF) and reduction in line edge roughness (LER). The reasons therefor are presumed as follows.

First, the pattern forming method of the present invention is of a so-called negative type in which an unexposed area of a resist film is dissolved in a developer, and thus, an area remaining as a resist pattern is exposed. Here, since exposure is performed from the side opposite to the side of a substrate of the resist film, the exposure dose is likely to be relatively larger in a portion around the surface of the side opposite to the side of the substrate of the resist film than that in the portion on the side of the substrate of the resist film and the center portion. Thus, an excess amount of an acid is generated in the portion around the surface of the resist film, and the acid is diffused even into the near unexposed area. As a result, in the resist pattern after development, the cross section is not rectangular, but has a T-top shape in some cases. In this case, DOF and LER are deteriorated.

However, in the pattern forming method of the present invention, prior to carrying out exposure, a composition (topcoat composition) for forming an upper layer film is coated on a resist film, and heated at a high temperature of 100° C. or higher. Thus, a compound (photoacid generator) that generates an acid upon irradiation with active light or radiation, which is present around the surface of the resist film, is diffused, and a part thereof is incorporated into the topcoat composition. Thus, the amount of the photoacid generator is reduced in the portion around the surface of the resist film, and accordingly, even with an increase in the exposure dose, the acid is suppressed from being excessive and being thus diffused into the surrounding unexposed areas. As a result, in the resist pattern after development, the cross section becomes rectangular, and thus, DOF and LER are improved.

Furthermore, in the invention described in JP2013-061647A, a topcoat composition is coated and then heated to "90° C." (paragraph [0090] or the like), but sufficient effects are not obtained even with heating to that temperature. The reasons therefor are demonstrated by the results of Comparative Examples 1 and 2 which will be described later.

Hereinafter, the pattern forming method of the present invention will be first described, and then the active-light-sensitive or radiation-sensitive resin composition (hereinafter also referred to as "the resist composition of the present invention"), and the composition for forming an upper layer film (hereinafter also referred to as a "topcoat composition"), each of which is used in the pattern forming method of the present invention, will be described.

[Pattern Forming Method]

The pattern forming method of the present invention includes a step a of coating an active-light-sensitive or radiation-sensitive resin composition onto a substrate to form a resist film, a step b of coating a composition for forming an upper layer film onto the resist film, followed by carrying out heating to 100° C. or higher, to form the upper layer film on the resist film, a step c of exposing the resist film having the upper layer film formed thereon, and a step d of developing the exposed resist film using a developer including an organic solvent to form a pattern.

<Step a>

In the step a, the resist composition of the present invention is coated on a substrate to form a resist film (active-light-sensitive or radiation-sensitive film). The coating method is not particularly limited, and a spin coating method, a spray method, a roll coating method, a dip method, or the like, known in the related art, can be used, with the spin coating method being preferable.

After coating the resist composition of the present invention, the substrate may be heated (prebaked), if desired. Thus, a film in which insoluble residual solvents have been removed can be uniformly formed. The temperature for prebake is not particularly limited, but is preferably 50° C. to 160° C., and more preferable 60° C. to 140° C.

The substrate on which the resist film is formed is not particularly limited, and it is possible to use a substrate generally used in a process for manufacturing a semiconductor such as an IC, a process for manufacturing a circuit board for a liquid crystal, a thermal head, or the like, and other lithographic processes of photofabrication, and examples thereof include inorganic substrates such as silicon, SiN, and $SiO_2$, and coating type inorganic substrates such as Spin On Glass (SOG).

Prior to forming the resist film, an antireflection film may be applied onto the substrate in advance. As the antireflection film, any type of an inorganic film type such as titanium, titanium dioxide, titanium nitride, chromium oxide, carbon, and amorphous silicon, and an organic film type formed of a light absorber and a polymer material can be used. In addition, as the organic antireflection film, a commercially available organic antireflection film such as DUV-30 series or DUV-40 series manufactured by Brewer Science, Inc., AR-2, AR-3, or AR-5 manufactured by Shipley Company, L.L.C., or ARC series such as ARC29A manufactured by Chemical Industries, Ltd. can also be used.

<Step b>

In the step b, a composition (topcoat composition) for forming an upper layer film is coated on the resist film formed in the step a, and then heated (prebaked (PB)) to 100° C. or higher to form an upper layer film (hereinafter also referred to as a "topcoat") on the resist film. Thus, as described above, in the resist pattern after development, the cross section is rectangular, and DOF and LER are improved.

For a reason that the effects of the present invention are more excellent, the temperature for prebaking in the step b (hereinafter also referred to as a "PB temperature") is preferably 105° C. or higher, more preferably 110° C. or higher, still more preferably 120° C. or higher, and particularly preferably higher than 120° C.

The upper limit value of the PB temperature is not particularly limited, but is, for example, 200° C. or lower, preferably 170° C. or lower, more preferably 160° C. or lower, and still more preferably 150° C. or lower.

In a case where the exposure of the step c which will be described later is liquid immersion exposure, the topcoat is arranged between the resist film and the immersion liquid, and the resist film functions as a layer which is not brought in direct contact with the immersion liquid. In this case, preferred characteristics required for the topcoat (topcoat composition) are coating suitability onto the resist film, radiation, transparency, particularly to light at 193 nm, and poor solubility in an immersion liquid (preferably water). Further, it is preferable that the topcoat is not mixed with the resist film, and can be uniformly coated on the surface of the resist film.

Moreover, in order to uniformly coat the topcoat composition on the surface of the resist film while not dissolving the resist film, it is preferable that the topcoat composition contains a solvent in which the resist film is not dissolved. It is more preferable that as the solvent in which the resist film is not dissolved, a solvent of components other than an organic developer which will be described later. A method for coating the topcoat composition is not particularly limited, a spin coating method, a spray method, a roll coating method, a dip method, or the like known in the related art can be used.

From the viewpoint of the transparency at 193 nm of the topcoat composition, the topcoat composition contains a resin substantially not having aromatics. Specifically, examples of the resin include a resin having at least one of a fluorine atom or a silicon atom, which will be described later, and a resin having a repeating unit having a $CH_3$ partial structure in the side chain moiety, but is not particularly limited as long as it is dissolved in a solvent in which the resist film is not dissolved.

The film thickness of the topcoat is not particularly limited, but from the viewpoint of transparency to an exposure light source, the film is formed, which has a thickness of usually 5 nm to 300 nm, preferably 10 nm to 300 nm, more preferably 20 nm to 200 nm, and still more preferably 30 nm to 100 nm.

After forming the topcoat, the substrate is heated, if desired.

From the viewpoint of resolution, it is preferable that the refractive index of the topcoat is close to that of the resist film.

The topcoat is preferably insoluble in an immersion liquid, and more preferable insoluble in water.

From the viewpoint of immersion liquid tracking properties, with regard to the receding contact angle of the topcoat, the receding contact angle (23° C.) of the immersion liquid with respect to the topcoat is preferably 50 degrees to 100 degrees, and more preferably 80 to 100 degrees.

In the liquid immersion exposure, in a view that the immersion liquid needs to move on a wafer following the movement of an exposure head that is scanning the wafer at a high speed and forming an exposure pattern, the contact angle of the immersion liquid with respect to the resist film in a dynamic state is important, and in order to obtain better resist performance, the immersion liquid preferably has a receding contact angle in the above range.

When the topcoat is released, an organic developer which will be described later may be used, and another release agent may be used. As the release agent, a solvent hardly permeating the resist film is preferable. In a view that the release of the topcoat can be carried out simultaneously with the development of the resist film, the topcoat is preferably releasable with an organic developer. The organic developer used for the release is not particularly limited as long as it makes it possible to dissolve and remove a less exposed area of the resist film. The organic developer can be selected from developers including a polar solvent such as a ketone-based solvent, an ester-based solvent, an alcohol-based solvent, an amide-based solvent, an ether-based solvent, and a hydrocarbon-based solvent, which will be described later. A developer including a ketone-based solvent, an ester-based solvent, an alcohol-based solvent, or an ether-based solvent is preferable, a developer including an ester-based solvent is more preferable, and a developer including butyl acetate is still more preferable.

From the viewpoint of release with an organic developer, the dissolution rate of the topcoat in the organic developer is preferably 1 to 300 nm/sec, and more preferably 10 to 100 nm/sec.

Here, the dissolution rate of a topcoat in the organic developer refers to a film thickness decreasing rate when the topcoat is exposed to a developer after film formation, and is a rate at a time of dipping a butyl acetate solution at 23° C. in the present invention.

By setting the dissolution rate of a topcoat in the organic developer to 1 nm/sec or more, and preferably 10 nm/sec or more, an effect of reducing developing defects after developing a resist film is attained. Further, by setting the dissolution rate to 300 nm/sec or less, and preferably 100 nm/sec, as an effect of reducing the exposure unevenness during liquid immersion exposure, an effect that the line edge roughness of a pattern after the development of the resist film becomes better is attained.

The topcoat may also be removed using other known developers, for example, an aqueous alkali solution. Specific examples of the usable aqueous alkali solution include an aqueous tetramethylammonium hydroxide solution.

<Step c>

The exposure in the step c can be carried out by a generally known method, and for example, a resist film having a topcoat formed thereon is irradiated with active light or radiation through a predetermined mask. Here, the resist film is preferably irradiated with active light or radiation through an immersion liquid, but are not limited thereto. The exposure dose can be appropriately set, but is usually 1 to 100 mJ/cm$^2$.

The wavelength of the light source used in the exposure device in the present invention is not particularly limited, but light at a wavelength of 250 nm or less is preferably used, and examples of include KrF excimer laser light (248 nm), ArF excimer laser light (193 nm), $F_2$ excimer laser light (157 nm), EUV light (13.5 nm), and electron beams. Among these, ArF excimer laser light (193 nm) is preferably used.

In a case of carrying out liquid immersion exposure, before the exposure and/or after the exposure, the surface of the film may be cleaned with a water-based chemical before carrying out the heating which will be described later.

The immersion liquid is preferably a liquid which is transparent for exposure wavelength and has a minimum temperature coefficient of a refractive index so as to minimize the distortion of an optical image projected on the film. In particular, in a case where the exposure light source is an ArF excimer laser (wavelength; 193 nm), water is preferably used in terms of easy availability and easy handling, in addition to the above-mentioned viewpoints.

In a case of using water, an additive (liquid) that decreases the surface tension of water while increasing the interfacial activity may be added at a slight proportion. It is preferable that this additive does not dissolve the resist film on a substrate, and gives a negligible effect on the optical coat at the undersurface of a lens element. Water to be used is preferably distilled water. Further, pure water which has been subjected to filtration through an ion exchange filter or the like may also be used. Thus, it is possible to suppress the distortion of an optical image projected on the resist film by the incorporation of impurities.

Furthermore, in a view of further improving the refractive index, a medium having a refractive index of 1.5 or more can also be used. This medium may be an aqueous solution or an organic solvent.

The pattern forming method of the present invention may also have the step c (exposure step) plural times. In the case, exposure to be carried out plural times may also use the same light source or different light sources, but for the first exposure, ArF excimer laser light (wavelength; 193 nm) is preferably used.

After the exposure, heating (bake, also referred to as PEB) is preferably carried out to perform development (preferably including rinsing). Thus, a good pattern can be obtained. The temperature for PEB is not particularly limited as long as a good resist pattern is obtained, and is usually 40° C. to 160° C. PEB may be carried out once or plural times.

<Step d>

In the step d, a negative tone resist pattern is formed by carrying out development using a developer including an organic solvent. The step d is preferably a step of removing soluble areas of the resist film simultaneously.

Examples of the developer containing an organic solvent (hereinafter also referred to as an organic developer) which is used in the step d include developers containing a polar solvent such as a ketone-based solvent, an ester-based solvent, an alcohol-based solvent, an amide-based solvent, and an ether-based solvent, and a hydrocarbon-based solvent.

Examples of the ketone-based solvent include 1-octanone, 2-octanone, 1-nonanone, 2-nonanone, acetone, 2-heptanone, 4-heptanone, 1-hexanone, 2-hexanone, diisobutyl ketone, cyclohexanone, methylcyclohexanone, phenylacetone, methyl ethyl ketone, methyl isobutyl ketone, acetylacetone, acetonylacetone, ionone, diacetonyl alcohol, acetyl carbinol, acetophenone, methyl naphthyl ketone, isophorone, and propylene carbonate.

Examples of the ester-based solvent include methyl acetate, ethyl acetate, isopropyl acetate, butyl acetate (n-butyl acetate), pentyl acetate, hexyl acetate, isoamyl acetate, butyl propionate (n-butyl propionate), butyl butyrate, isobutyl butyrate, butyl butanoate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate, propyl lactate, and methyl 2-hydroxyisobutyrate.

Examples of the alcohol-based solvent include alcohols such as methyl alcohol, ethyl alcohol, n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol, and n-decanol; glycol-based solvents such as ethylene glycol, propylene glycol, diethylene glycol, and triethylene glycol; and glycol ether-based solvents such as ethylene glycol monomethyl ether, propylene glycol monomethyl ether, diethylene glycol monomethyl ether, triethylene glycol monoethyl ether, and methoxymethylbutanol.

Examples of the ether-based solvent include, in addition to the glycol ether-based solvents above, dioxane, and tetrahydrofuran.

Examples of the amide-based solvent which can be used include N-methyl-2-pyrrolidone, N,N-dimethylacetamide, N,N-dimethylformamide, hexamethylphosphoric triamide, and 1,3-dimethyl-2-imidazolidinone.

Examples of the hydrocarbon-based solvent include aromatic hydrocarbon-based solvents such as toluene and xylene, and aliphatic hydrocarbon-based solvents such as pentane, hexane, octane, and decane.

A plurality of these solvents may be mixed, or the solvent may be used by mixing it with a solvent other than those described above or with water. However, in order to sufficiently bring out the effects of the present invention, the moisture content in the entire developer is preferably less than 10% by mass, and it is more preferable that the developer contains substantially no water.

That is, the amount of the organic solvent to be used with respect to the organic developer is preferably from 90% by mass to 100% by mass, and more preferably from 95% by mass to 100% by mass, with respect to the total amount of the developer.

Among these, as the organic developer, a developer containing at least one kind of organic solvent selected from the group consisting of a ketone-based solvent, an ester-based solvent, an alcohol-based solvent, an amide-based solvent, and an ether-based solvent is preferable, a developer including a ketone-based solvent or an ester-based solvent is more preferable, and a developer including butyl acetate, butyl propionate, or 2-heptanone is still more preferable.

The vapor pressure of the organic developer is preferably 5 kPa or less, more preferably 3 kPa or less, and still more preferably 2 kPa or less, at 20° C. By setting the vapor pressure of the organic developer to 5 kPa or less, the evaporation of the developer on a substrate or in a development cup is suppressed, and the temperature evenness within a wafer plane is improved, whereby the dimensional evenness within a wafer plane is enhanced.

Specific examples of the solvent having a vapor pressure of 5 kPa or less (2 kPa or less) include the solvents described in paragraph [0165] of JP2014-71304A.

An appropriate amount of a surfactant may be added to the organic developer, if desired.

The surfactant is not particularly limited, and for example, an ionic or nonionic, fluorine- and/or silicon-based surfactant can be used. Examples of such a fluorine- and/or silicon-based surfactant include surfactants described in JP1987-36663A (JP-S62-36663A), JP1986-226746A (JP-S61-226746A), JP1986-226745A (JP-S61-226745A), JP1987-170950A (JP-S62-170950A), JP1988-34540A (JP-S63-34540A), JP1995-230165A (JP-H07-230165A), JP1996-62834A (JP-H08-62834A), JP1997-54432A (JP-H09-54432A), JP1997-5988A (JP-H09-5988A), and U5405720A, U.S. Pat. No. 5,360,692A, U.S. Pat. No. 5,529,881A, U5296330A, U.S. Pat. No. 5,436,098A, U.S. Pat. No. 5,576,143A, U.S. Pat. No. 5,294,511A, and U.S. Pat. No. 5,824,451A, with the nonionic surfactant being preferable. The nonionic surfactant is not particularly limited, but the fluorine-based surfactant or the silicon-based surfactant is more preferably used.

The amount of the surfactant to be used is usually 0.001% to 5% by mass, preferably 0.005% to 2% by mass, and more preferably 0.01% to 0.5% by mass, with respect to the total amount of the developer.

Examples of the developing method include a method in which a substrate is immersed in a tank filled with a developer for a certain period of time (a dip method), a method in which a developer is heaped up to the surface of a substrate by surface tension and developed by stopping for a certain period of time (a paddle method), a method in which a developer is sprayed on the surface of a substrate (a spray method), and a method in which a developer is continuously discharged on a substrate spun at a constant rate while scanning a developer discharging nozzle at a constant rate (a dynamic dispense method).

In addition, after the step of carrying out development using a developer including an organic solvent, a step of stopping the development while replacing the solvent with another solvent may also be included.

A cleaning step using a rinsing liquid may be included after the step of carrying out development using a developer including an organic solvent.

The rinsing liquid is not particularly limited as long as it does not dissolve the resist pattern, and a solution including a general organic solvent can be used. As the rinsing liquid, for example, a rinsing liquid containing at least one organic solvent selected from a hydrocarbon-based solvent, a ketone-based solvent, an ester-based solvent, an alcohol-based solvent, an amide-based solvent, or an ether-based solvent, described above as the organic solvent included in the organic developer is preferably used. More preferably, a step of carrying out cleaning using a rinsing liquid containing at least one kind of organic solvent selected from a hydrocarbon-based solvent, a ketone-based solvent, an ester-based solvent, an alcohol-based solvent, and an amide-based solvent is carried out. Still more preferably, a step of carrying out cleaning using a rinsing liquid containing a hydrocarbon-based solvent, an alcohol-based solvent, or an ester-based solvent is carried out. Particularly preferably, a step of carrying out cleaning using a rinsing liquid containing a monohydric alcohol is carried out.

Here, examples of the monohydric alcohol used in the rinsing step include linear, branched, or cyclic monohydric alcohols, and specifically, 1-butanol, 2-butanol, 3-methyl-1-butanol, 3-methyl-2-butanol, tert-butyl alcohol, 1-pentanol, 2-pentanol, 3-methyl-2-pentanol, 4-methyl-2-pentanol, 1-hexanol, 2-hexanol, 3-hexanol, 4-methyl-2-hexanol, 5-methyl-2-hexanol, 1-heptanol, 2-heptanol, 3-heptanol, 4-methyl-2-heptanol, 5-methyl-2-heptanol, 1-octanol, 2-octanol, 3-octanol, 4-octanol, 4-methyl-2-octanol, 5-methyl-2-octanol, 6-methyl-2-octanol, 2-nonanol, 4-methyl-2-nonanol, 5-methyl-2-nonanol, 6-methyl-2-nonanol, 7-methyl-2-nonanol, 2-decanol, or the like can be used, with 1-hexanol, 2-hexanol, 1-pentanol, 3-methyl-1-butanol, or 4-methyl-2-heptanol being preferable.

Furthermore, examples of the hydrocarbon-based solvent used in the rinsing step include aromatic hydrocarbon-based solvents such as toluene and xylene; and aliphatic hydrocarbon-based solvents such as pentane, hexane, octane, and decane (n-decane).

The respective components in plural numbers may be mixed, or the components may be mixed with an organic solvents other than the above solvents, and used.

The moisture content of the rinsing liquid is preferably 10% by mass or less, more preferably 5% by mass or less, and particularly preferably 3% by mass or less. By setting the moisture content to 10% by mass or less, good development characteristics can be obtained.

The vapor pressure of the rinsing liquid is preferably 0.05 to 5 kPa, more preferably 0.1 to 5 kPa, and still more preferably 0.12 to 3 kPa, at 20° C. By setting the vapor pressure of the rinsing liquid to a range from 0.05 kPa to 5 kPa, the temperature evenness within a wafer plane is improved, and further, the dimensional evenness within a wafer plane is enhanced by inhibition of swelling due to the penetration of the rinsing liquid.

The rinsing liquid can also be used after adding an appropriate amount of a surfactant thereto.

In the rinsing step, the wafer which has been subjected to development using a developer including an organic solvent is subjected to a cleaning treatment using the rinsing liquid including an organic solvent. A method for the cleaning treatment is not particularly limited, and for example, a method in which a rinsing liquid is continuously discharged on a substrate rotated at a constant rate (a spin coating method), a method in which a substrate is immersed in a bath filled with a rinsing liquid for a certain period of time (a dip method), a method in which a rinsing liquid is sprayed onto a substrate surface (a spray method), or the like, can be applied. Among these, a method in which a cleaning treatment is carried out using the spin coating method, and a substrate is rotated at a rotation speed of 2,000 rpm to 4,000 rpm after cleaning, and then the rinsing liquid is removed from the substrate, is preferable. Further, it is preferable that a heating step (Post Bake) is included after the rinsing step. The residual developer and the rinsing liquid between and inside the patterns are removed by the baking. The heating step after the rinsing step is carried out at typically 40° C. to 160° C., and preferably at 70° C. to 95° C., and typically for 10 seconds to 3 minutes, and preferably for 30 seconds to 90 seconds.

Moreover, in the pattern forming method of the present invention, development using an alkali developer may also be carried out after the development using an organic developer. A portion having weak exposure intensity is removed by development using an organic solvent, and a portion having strong exposure intensity is also removed by carrying out development using an alkali developer. Since pattern formation is carried out without dissolving only a region having intermediate exposure intensity by carrying out development plural times in this manner, a finer pattern than usual can be formed (the same mechanism as that in paragraph [0077] of JP2008-292975A).

As the alkali developer, for example, alkali aqueous solutions of inorganic alkali such as sodium hydroxide, potassium hydroxide, sodium carbonate, sodium silicate, sodium metasilicate, and aqueous ammonia, primary amines such as ethylamine and n-propylamine, secondary amines such as diethylamine and di-n-butylamine, tertiary amines such as triethylamine and methyldiethylamine, alcohol-amines such as dimethyl ethanolamine and triethanolamine, quaternary ammonium salts such as tetramethylammonium hydroxide and tetraethylammonium hydroxide; and cyclic amines such as pyrrole and piperidine, or the like can be used. Among these, an aqueous tetraethylammonium hydroxide solution is preferably used.

Moreover, an appropriate amount of alcohols or a surfactant can also be added to the alkali developer and used.

The alkali concentration of the alkali developer is usually 0.01% to 20% by mass.

The pH of the alkali developer is usually 10.0 to 15.0.

The time for carrying out development using an alkali developer is usually 10 to 300 seconds.

The alkali concentration (and the pH) of the alkali developer and the developing time can be appropriately adjusted depending on the patterns formed.

Cleaning may be carried out using a rinsing liquid after the development using an alkali developer, and as the rinsing liquid, pure water is used, or an appropriate amount of a surfactant may be added thereto before the use.

Further, after the developing treatment or the rinsing treatment, a treatment for removing the developer or rinsing liquid adhering on the pattern by a supercritical fluid may be carried out.

In addition, a heating treatment can be carried out in order to remove moisture content remaining in the pattern after the rinsing treatment or the treatment using a supercritical fluid.

Moreover, a mold for imprints may be manufactured using the resist composition according to the present invention, and regarding the details thereof, reference can be made to, for example, JP4109085B and JP2008-162101A.

The pattern forming method of the present invention can also be used in formation of a guide pattern (see, for example, ACS Nano Vol. 4 No. 8 Pages 4815-4823) in Directed Self-Assembly (DSA).

Furthermore, the resist pattern formed by the method can be used as a core material (core) in the spacer process disclosed in, for example, JP1991-270227A (JP-H03-270227A) and JP2013-164509A.

[Active-Light-Sensitive or Radiation-Sensitive Resin Composition]

Next, the active-light-sensitive or radiation-sensitive resin composition (hereinafter also conveniently referred to as "the resist composition of the present invention") used in the pattern forming method of the present invention will be described.

(A) Resin

The resist composition of the present invention typically contains a resin which has a decrease in the solubility in a developer including an organic solvent due to an increase in the polarity by the action of an acid.

The resin which has a decrease in the solubility in a developer including an organic solvent due to an increase in the polarity by the action of an acid (hereinafter also referred to as a "resin (A)") is preferably a resin (hereinafter also referred to as an "acid-decomposable resin" or an "acid-decomposable resin (A)") having a group (hereinafter also referred to as an "acid-decomposable group") that decomposes by the action of an acid to generate an alkali-soluble group at either the main chain or the side chain of the resin, or at both the main chain and the side chain.

Furthermore, the resin (A) is more preferably a resin having an alicyclic hydrocarbon structure which is monocyclic or polycyclic (hereinafter also referred to as an "alicyclic hydrocarbon-based acid-decomposable resin"). It is thought that the resin having an alicyclic hydrocarbon structure which is monocyclic or polycyclic has high hydrophobicity and has improved developability in a case of developing an area having a weak light irradiation intensity of the resist film by an organic developer.

The resist composition of the present invention, which contains the resin (A), can be suitably used in a case of irradiation with ArF excimer laser light.

Examples of the alkali-soluble group included in the resin (A) include a phenolic hydroxyl group, a carboxylic acid group, a fluorinated alcohol group, a sulfonic acid group, a sulfonamido group, a sulfonylimido group, an (alkylsulfonyl)(alkylcarbonyl)methylene group, an (alkylsulfonyl)(alkylcarbonyl)imido group, a bis(alkylcarbonyl)methylene group, a bis(alkylcarbonyl)imido group, a bis(alkylsulfonyl)methylene group, a bis(alkylsulfonyl)imido group, a tris(alkylcarbonyl)methylene group, and a tris(alkylsulfonyl)methylene group.

Preferred examples of the alkali-soluble group include a carboxylic acid group, a fluorinated alcohol group (preferably hexafluoroisopropanol), and a sulfonic acid group.

A preferred group capable of decomposing by an acid (acid-decomposable group) is a group obtained by substituting a hydrogen atom of these alkali-soluble groups with a group capable of leaving with an acid.

Examples of the group that leaves include $-C(R_{36})(R_{37})(R_{38})$, $-C(R_{36})(R_{37})(OR_{39})$, and $-C(R_{01})(R_{02})(OR_{39})$.

In the formulae, $R_{36}$ to $R_{39}$ each independently represent an alkyl group, a cycloalkyl group, an aryl group, an aralkyl group, or an alkenyl group. $R_{36}$ and $R_{37}$ may be bonded to each other to form a ring.

$R_{01}$ and $R_{02}$ each independently represent a hydrogen atom, an alkyl group, a cycloalkyl group, an aryl group, an aralkyl group, or an alkenyl group.

As the acid-decomposable group, a cumyl ester group, an enol ester group, an acetal ester group, a tertiary alkyl ester group, and the like are preferable, and a tertiary alkyl ester group is more preferable.

The resin (A) is preferably a resin containing at least one selected from repeating units having partial structures represented by the following General Formulae (pI) to (pV), or a repeating unit represented by the following General Formula (II-AB).

(pI)

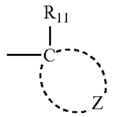

(pII)

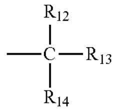

(pIII)

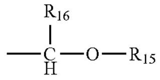

(pIV)

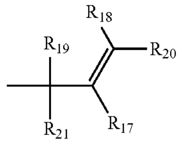

(pV)

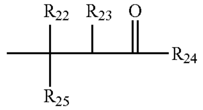

In General Formulae (pI) to (pV), $R_{11}$ represents a methyl group, an ethyl group, an n-propyl group, an isopropyl group, an n-butyl group, an isobutyl group, or a sec-butyl group, and Z represents an atomic group which is necessary for forming a cycloalkyl group together with carbon atoms.

$R_{12}$ to $R_{16}$ each independently represent a linear or branched alkyl group or cycloalkyl group, having 1 to 4 carbon atoms, provided that at least one of $R_{12}$, . . . , or $R_{14}$, or any one of $R_{15}$ and $R_{16}$ is a cycloalkyl group.

$R_{17}$ to $R_{21}$ each independently represent a hydrogen atom, or a linear or branched alkyl group or cycloalkyl group, having 1 to 4 carbon atoms, provided that at least one of $R_{17}$, . . . , or $R_{21}$ is a cycloalkyl group. Further, any one of $R_{19}$ and $R_{21}$ is a linear or branched alkyl group or cycloalkyl group, having 1 to 4 carbon atoms.

$R_{22}$ to $R_{25}$ each independently represent a hydrogen atom, or a linear or branched alkyl group or cycloalkyl group, having 1 to 4 carbon atoms, provided that at least one of $R_{22}$, . . . , or $R_{25}$ is a cycloalkyl group. Further, $R_{23}$ and $R_{24}$ may be bonded to each other to form a ring.

(II-AB)

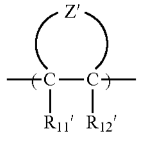

In General Formula (II-AB), $R_{11}'$ and $R_{12}'$ each independently represent a hydrogen atom, cyano group, a halogen atom, or an alkyl group.

Z' represents an atomic group for forming an alicyclic structure, which contains two carbon atoms (C—C) bonded to each other.

Furthermore, it is more preferable that General Formula (II-AB) is the following General Formula (II-AB1) or (II-AB2).

(II-AB1)

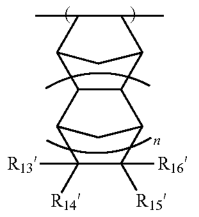

(II-AB2)

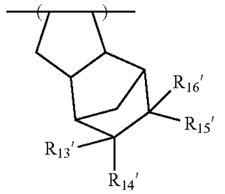

In Formulae (II-AB1) and (II-AB2), $R_{13}'$ to $R_{16}'$ each independently represent a hydrogen atom, a halogen atom, a cyano group, —COOH, —$COOR_5$, a group that decomposes by the action of an acid, —C(═O)—X-A'-$R_{17}'$, an alkyl group, or a cycloalkyl group, provided that at least two of $R_{13}'$, . . . , or $R_{16}'$ may be bonded to each other to form a ring.

Here, $R_5$ represents an alkyl group, a cycloalkyl group, or a group having a lactone structure.

X represents an oxygen atom, a sulfur atom, —NH—, —$NHSO_2$—, or —$NHSO_2NH$—.

A' represents a single bond or a divalent linking group.

$R_{17}'$ represents —COOH, —$COOR_5$, —CN, a hydroxyl group, an alkoxy group, —CO—NH—$R_6$, —CO—NH—$SO_2$—$R_6$, or a group having a lactone structure.

$R_6$ represents an alkyl group or a cycloalkyl group.

n represents 0 or 1.

In General Formulae (pI) to (pV), the alkyl group in each of $R_{12}$ to $R_{25}$ is preferably a linear or branched alkyl group having 1 to 4 carbon atoms.

The cycloalkyl group in each of $R_{11}$ to $R_{25}$ or the cycloalkyl group formed by Z together with carbon atoms may be monocyclic or polycyclic. Specific examples thereof include a group having 5 or more carbon atoms and having a monocyclo, bicyclo, tricyclo, or tetracyclo structure. These cycloalkyl groups preferably have 6 to 30 carbon atoms, and more preferably 7 to 25 carbon atoms. These cycloalkyl groups may have a substituent.

Preferred examples of the cycloalkyl group include an adamantyl group, a noradamantyl group, a decalin residue, a tricyclodecanyl group, a tetracyclododecanyl group, a norbornyl group, cedrol group, a cyclopentyl group, a cyclohexyl group, a cycloheptyl group, a cyclooctyl group, a cyclodecanyl group, and a cyclododecanyl group. More preferred examples thereof include an adamantyl group, a norbornyl group, a cyclohexyl group, a cyclopentyl group, a tetracyclododecanyl group, and a tricyclodecanyl group.

Examples of a substituent which may further be included in these alkyl groups and cycloalkyl groups include an alkyl group (having 1 to 4 carbon atoms), a halogen atom, a hydroxyl group, an alkoxy group (having 1 to 4 carbon atoms), a carboxyl group, and an alkoxycarbonyl group (having 2 to 6 carbon atoms). Examples of the substituent which may further be included in the alkyl group, the alkoxy group, the alkoxycarbonyl group, or the like include a hydroxyl group, a halogen atom, and an alkoxy group.

The structures represented by General Formulae (pI) to (pV) in the resin can be used in the protection of the alkali-soluble group. Examples of the alkali-soluble group include various groups that have been known in the technical field.

Specific examples thereof include a structure in which a hydrogen atom in a carboxylic acid group, a sulfonic acid group, a phenol group, or a thiol group is substituted with a structure represented by any one of General Formulae (pI) to (pV), with a structure in which a hydrogen atom in a carboxylic acid group or a sulfonic acid group is substituted with a structure represented by any one of General Formulae (pI) to (pV) being preferable.

As the repeating unit having an alkali-soluble group protected by the structure represented by any one of General Formulae (pI) to (pV), a repeating unit represented by the following General Formula (pA) is preferable.

(pA)

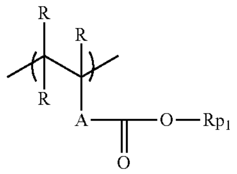

Here, R represents a hydrogen atom, a halogen atom, or a substituted or unsubstituted, linear or branched alkyl group having 1 to 4 carbon atoms, and a plurality of R's may be the same as or different from each other.

A is preferably a single group or a combination of two or more groups, selected from the group consisting of a single bond, an alkylene group, an ether group, a thioether group, a carbonyl group, an ester group, an amido group, a sulfonamido group, a urethane group, or a urea group, with a single bond being preferable.

$Rp_1$ is a group of any one of Formulae (pI) to (pV).

The repeating unit represented by General Formula (pA) is particularly preferably a repeating unit derived from 2-alkyl-2-adamantyl (meth)acrylate or dialkyl(1-adamantyl) methyl (meth)acrylate.

Specific examples of the repeating unit represented by General Formula (pA) are shown below, but the present invention is not limited thereto.

(in the following formula, Rx represents H, $CH_3$, or $CH_2OH$; and Rxa and Rxb each represent an alkyl group having from 1 to 4 carbon atoms)

1

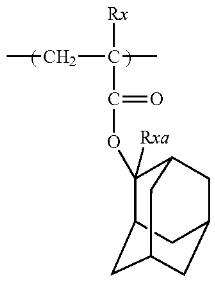

-continued
2
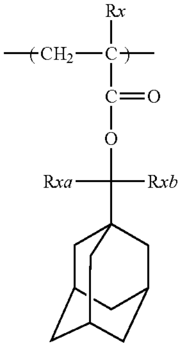
3
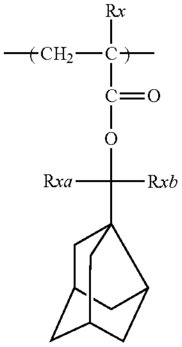
4
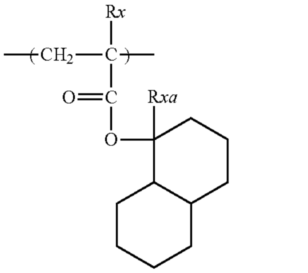
5
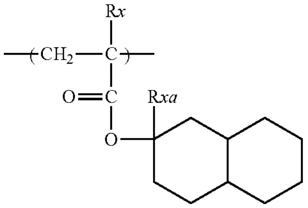
6
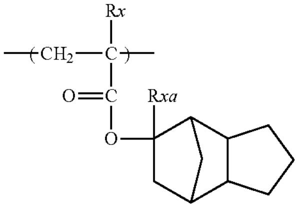
7
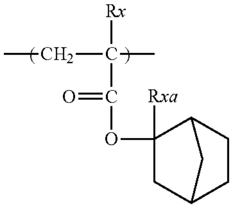
-continued
8
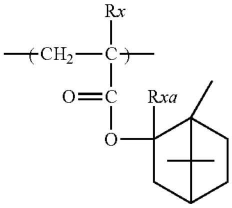
9
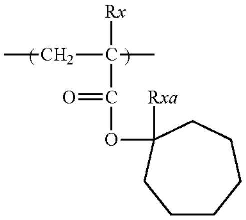
10
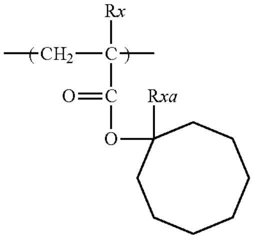
11
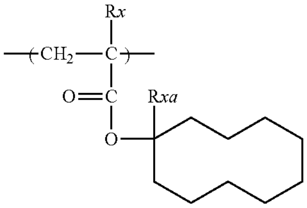
12
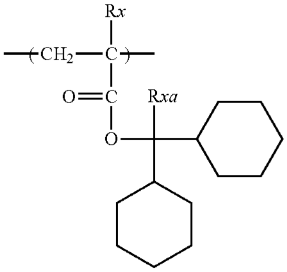
13
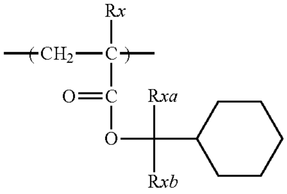
14
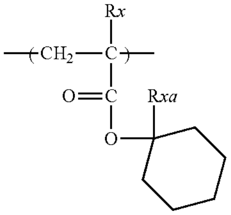

-continued
15
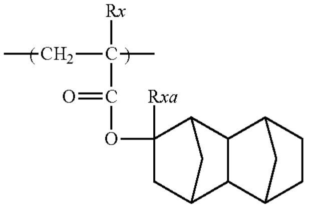
16
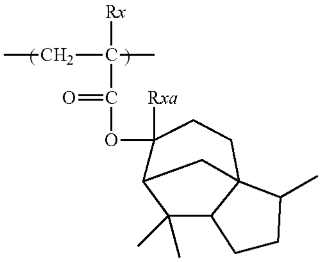
17
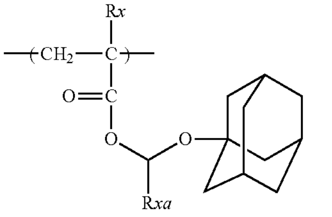
18
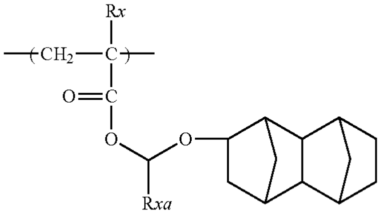
19
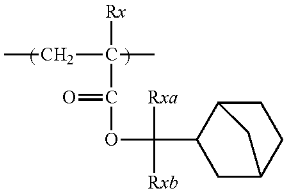
20
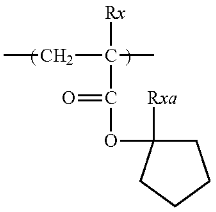
21
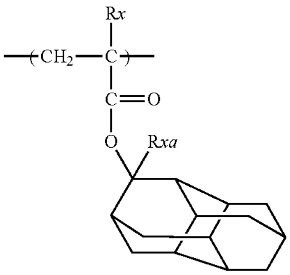
-continued
22
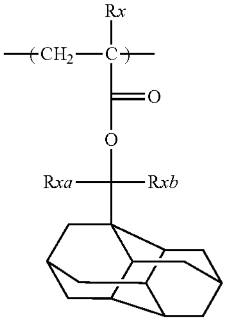
23
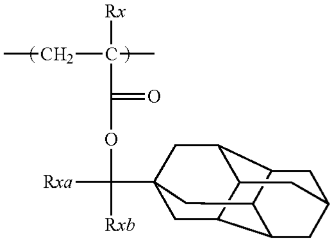
24
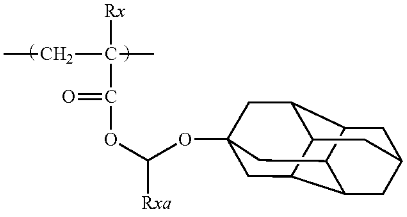
25
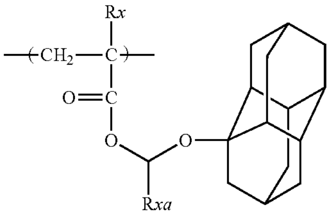
26
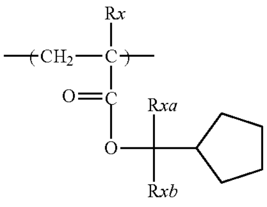
27
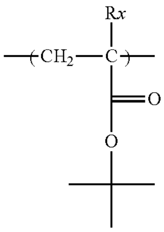

-continued

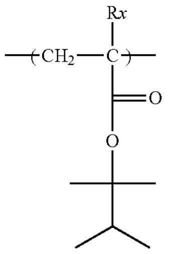

28

Examples of the halogen atoms in $R_{11}$' and $R_{12}$' in General Formula (II-AB) include a chlorine atom, a bromine atom, a fluorine atom, and an iodine atom.

Examples of the alkyl group in each of $R_{11}$' and $R_{12}$' include a linear or branched alkyl group having 1 to 10 carbon atoms.

The atomic group for forming the alicyclic structure of Z' is an atomic group that forms a repeating unit of an alicyclic hydrocarbon, which may have a substituent, in the resin. Above all, an atomic group for forming a crosslinked alicyclic structure that forms a crosslinked alicyclic hydrocarbon repeating unit is preferable.

Examples of the skeleton of the alicyclic hydrocarbon thus formed include the same ones as the alicyclic hydrocarbon groups represented by each of $R_{12}$ to $R_{25}$ in General Formulae (pI) to (pV).

The skeleton of the alicyclic hydrocarbon may have a substituent. Examples of the substituent include $R_{13}$' to $R_{16}$' in General Formula (II-AB1) or (II-AB2).

In the resin (A), the group that decomposes by the action of an acid is included in at least one repeating unit of a repeating unit having a partial structure represented by any one of General Formulae (pI) to (pV), a repeating unit represented by General Formula (II-AB), or a repeating unit of a copolymerizable component which will be described later. It is preferable that the group that decomposes by the action of an acid is included in a repeating unit having a partial structure represented by any one of General Formulae (pI) to (pV).

Each of various substituents of $R_{13}$' to $R_{16}$' in General Formula (II-AB1) or (II-AB2) may be a substituent of the atomic group for forming an alicyclic structure or the atomic group Z for forming a crosslinked alicyclic structure in General Formula (II-AB).

Examples of the repeating unit represented by General Formula (II-AB1) or (II-AB2) include the following specific examples, but the present invention is not limited to these specific examples.

[II-1]

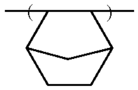

[II-2]

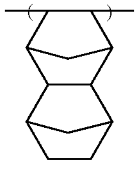

-continued

[II-3]

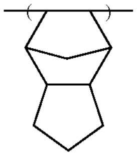

[II-4]

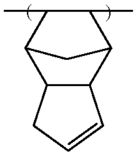

[II-5]

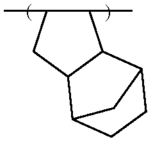

[II-6]

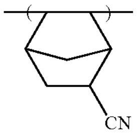

[II-7]

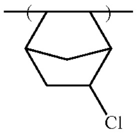

[II-8]

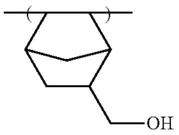

[II-9]

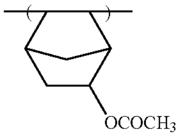

[II-10]

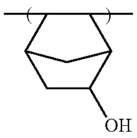

[II-11]

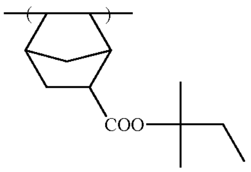

-continued
[II-12]
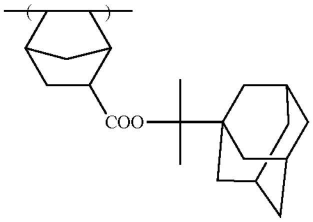
[II-13]
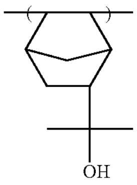
[II-14]
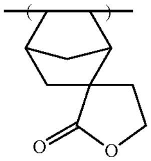
[II-15]
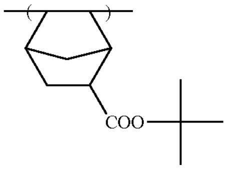
[II-16]
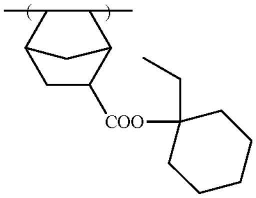
[II--17]
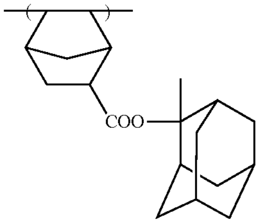
[II-18]
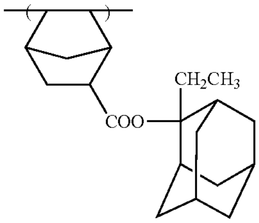
-continued
[II-19]
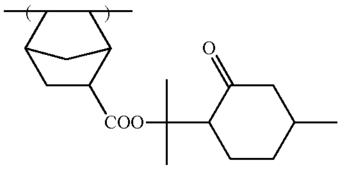
[II-20]
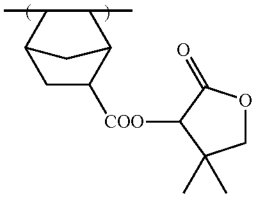
[II-21]
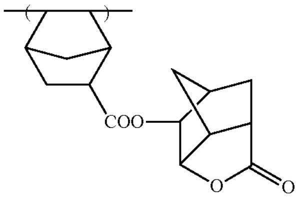
[II-22]
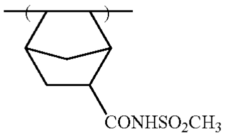
[II-23]
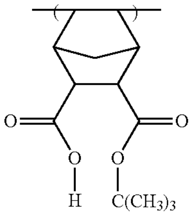
[II-24]
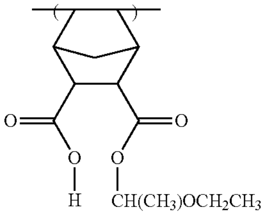
[II-25]
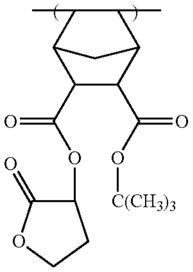

-continued

[II-26]

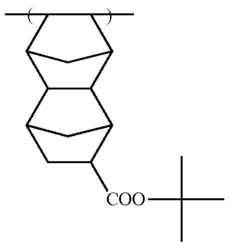

[II-27]

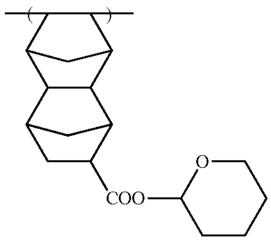

[II-28]

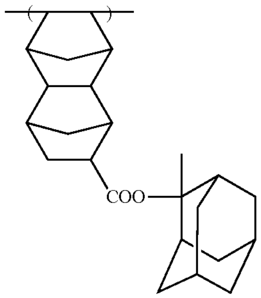

[II-29]

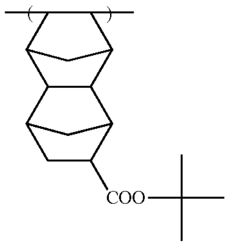

[II-30]

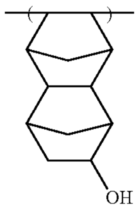

[II-31]

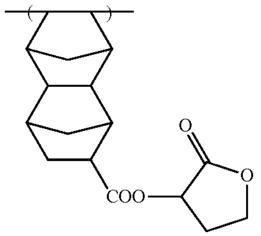

-continued

[II-32]

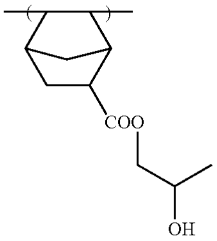

The resin (A) preferably has a lactone group. As the lactone group, any group may be used as long as it has a lactone structure, but the group is preferably a group containing a 5- to 7-membered ring lactone structure, and preferably, another ring structure is fused to the 5- to 7-membered ring lactone structure in the form capable of forming a bicyclo structure or a spiro structure. The resin (A) more preferably has a repeating unit having a group having a lactone structure represented by any of the following General Formulae (LC1-1) to (LC1-16). Further, a group having the lactone structure may be bonded directly to the main chain. Preferred examples of the lactone structures include the groups represented by General Formulae (LC1-1), (LC1-4), (LC1-5), (LC1-6), (LC1-13), and (LC1-14), and by using the specific lactone structures, the line edge roughness is improved and the developing defects are also relieved.

LC1-1

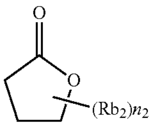

LC1-2

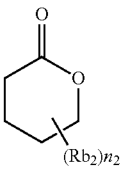

LC1-3

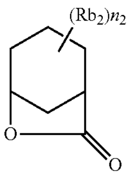

LC1-4

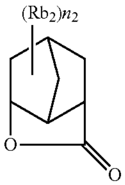

LC1-5

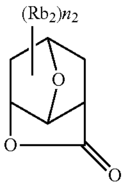

-continued

LC1-6

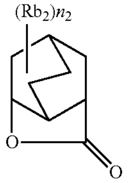

LC1-7

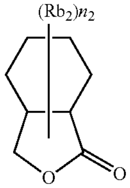

LC1-8

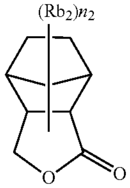

LC1-9

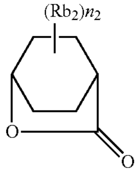

LC1-10

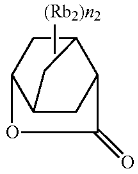

LC1-11

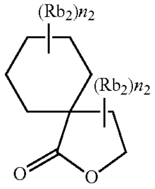

LC1-12

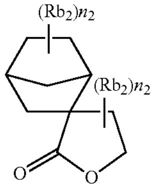

LC1-13

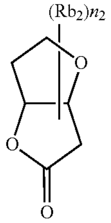

-continued

LC1-14

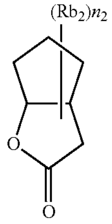

LC1-15

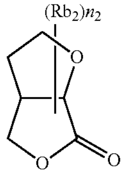

LC1-16

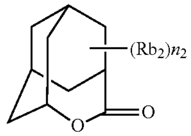

The lactone structure moiety may or may not have a substituent ($Rb_2$). Preferred examples of the substituent ($Rb_2$) include an alkyl group having 1 to 8 carbon atoms, a cycloalkyl group having 4 to 7 carbon atoms, an alkoxy group having 1 to 8 carbon atoms, an alkoxycarbonyl group having 1 to 8 carbon atoms, a carboxyl group, a halogen atom, a hydroxyl group, a cyano group, and an acid-decomposable group. $n_2$ represents an integer of 0 to 4. When $n_2$ is 2 or more, $Rb_2$'s which are present in plural numbers may be the same as or different from each other, and further, $Rb_2$'s which are present in plural numbers may be bonded to each other to form a ring.

Examples of the repeating unit having a lactone structure represented by any one of General Formulae (LC1-1) to (LC1-16) include a repeating unit in which at least one of $R_{13}'$, . . . , or $R_{16}'$ in General Formula (II-AB1) or (II-AB2) has a group represented by any one of General Formulae (LC1-1) to (LC1-16) (for example, one in which $R_5$ in —$COOR_5$ is a group represented by any one of General Formulae (LC1-1) to (LC1-16)), and a repeating unit represented by the following General Formula (AI).

(AI)

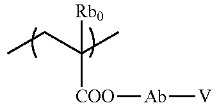

In General Formula (AI), $Rb_0$ represents a hydrogen atom, a halogen atom, or an alkyl group having 1 to 4 carbon atoms.

Preferred examples of the substituent which may be contained in the alkyl group of $Rb_0$ include a hydroxyl group and a halogen atom.

Examples of the halogen atoms of $Rb_0$ include a fluorine atom, a chlorine atom, a bromine atom, and an iodine atom.

$Rb_0$ is preferably a hydrogen atom or a methyl group.

Ab represents a single bond, an alkylene group, a divalent linking group having a monocyclic or polycyclic alicyclic hydrocarbon structure, an ether group, an ester group, a carbonyl group, or a divalent group obtained by combination of these groups. Ab is preferably a single bond or a linking group represented by $-Ab_1-CO_2-$. $Ab_1$ is a linear or branched alkylene group, or a monocyclic or polycyclic cycloalkylene group, and preferably a methylene group, an ethylene group, a cyclohexylene group, an adamantylene group, or a norbornylene group.

V represents a group represented by any one of General Formulae (LC1-1) to (LC1-16).

The repeating unit having a lactone structure is usually present in the form of an optical isomer, and any optical isomer may be used. Further, one kind of optical isomer may be used singly or a plurality of optical isomers may be mixed and used. In a case of mainly using one kind of optical isomer, the optical purity (ee) thereof is preferably 90 or more, and more preferably 95 or more.

Specific examples of the repeating unit having a group with a lactone structure are shown below, but the present invention is not limited thereto.

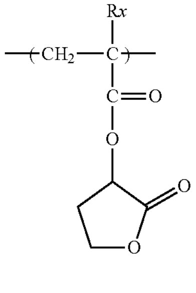
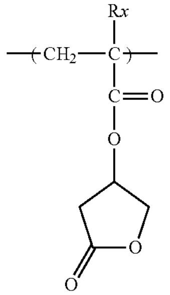
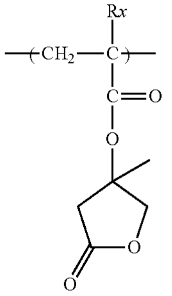
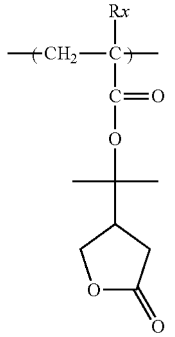
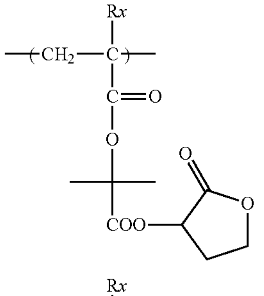
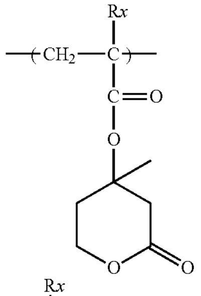
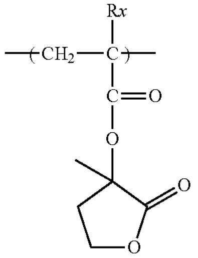
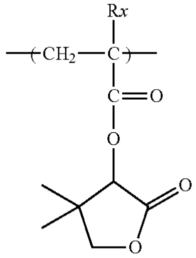

-continued

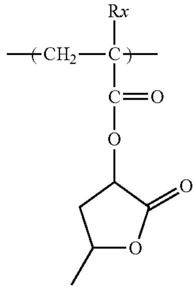
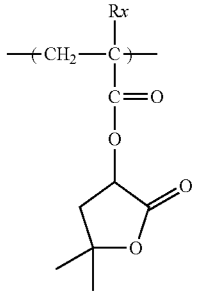
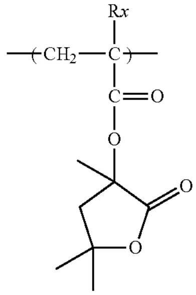
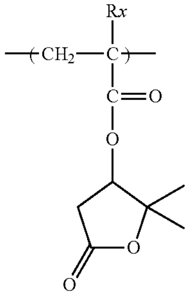
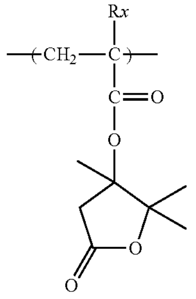
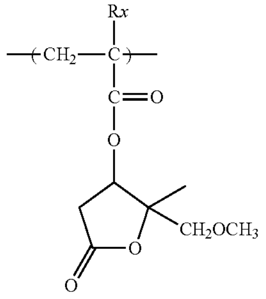
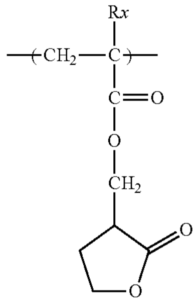
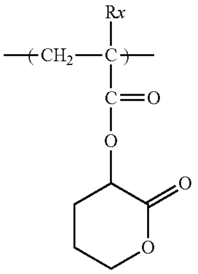
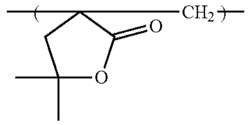
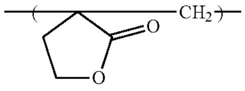
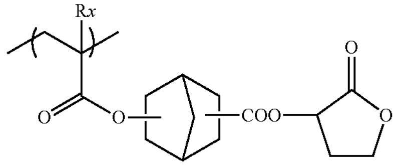
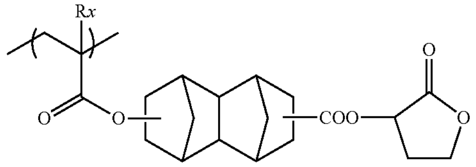

-continued
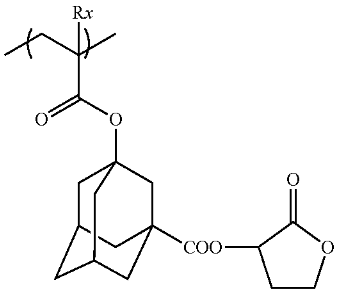
(in the formulae, Rx represents H, $CH_3$, $CH_2OH$, or $CF_3$)
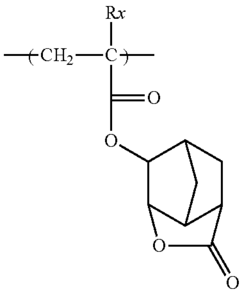
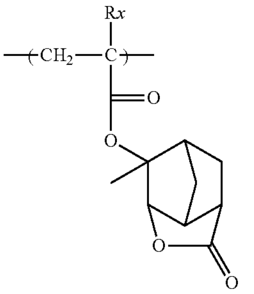
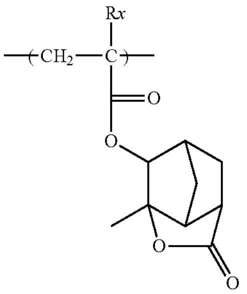
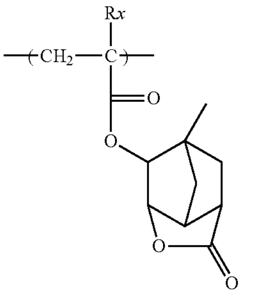
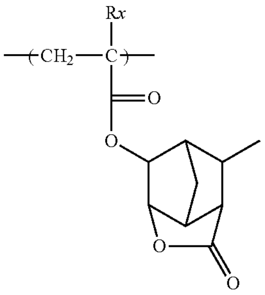
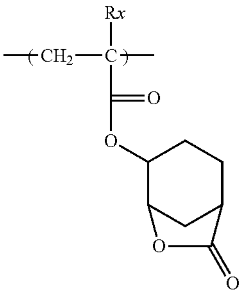
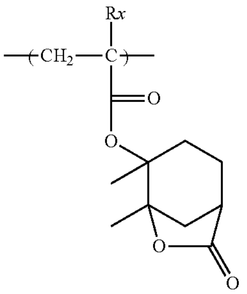
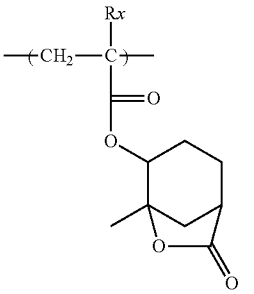
-continued
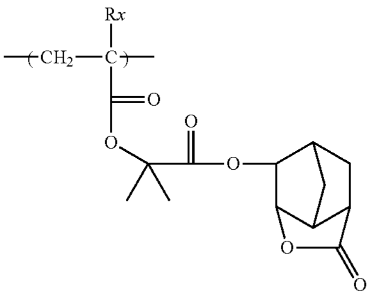
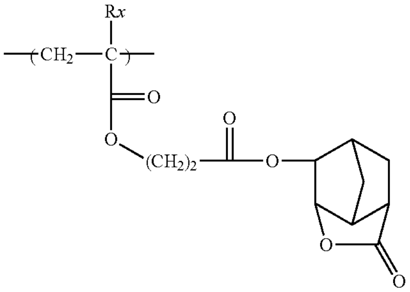
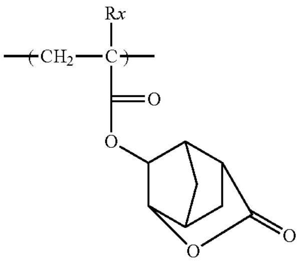
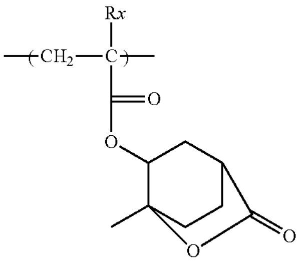
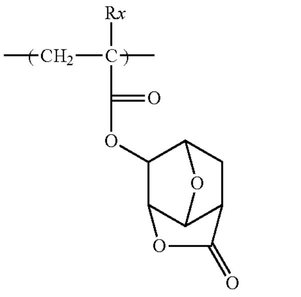
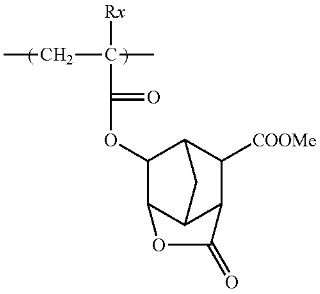

-continued
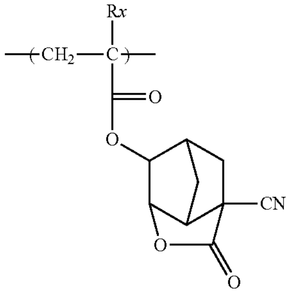
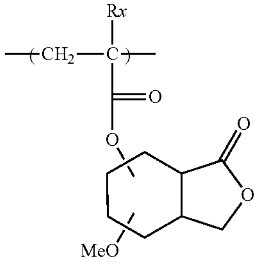
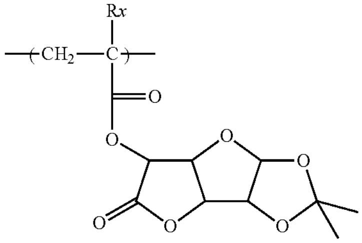
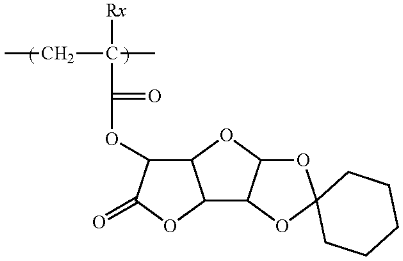
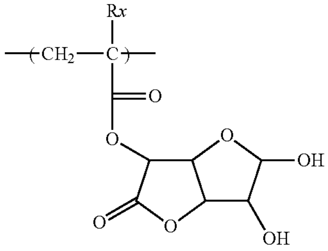
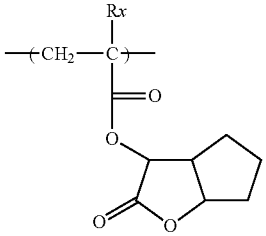
-continued
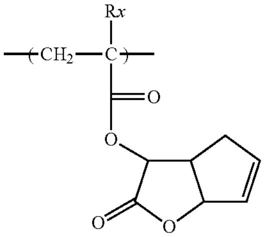
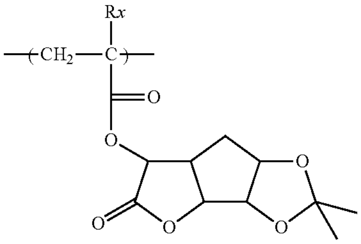
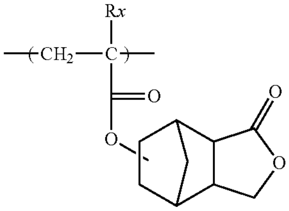
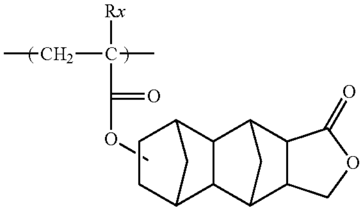
(in the formulae, Rx represents H, $CH_3$, $CH_2OH$, or $CF_3$)
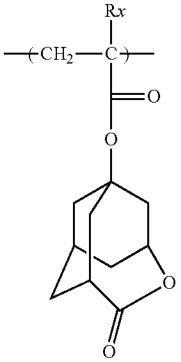
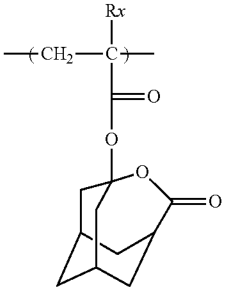
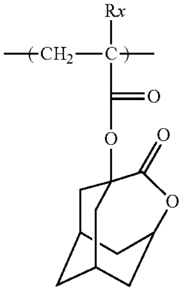
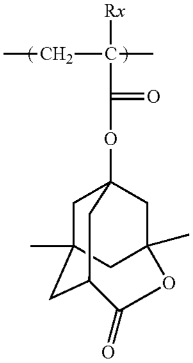

-continued

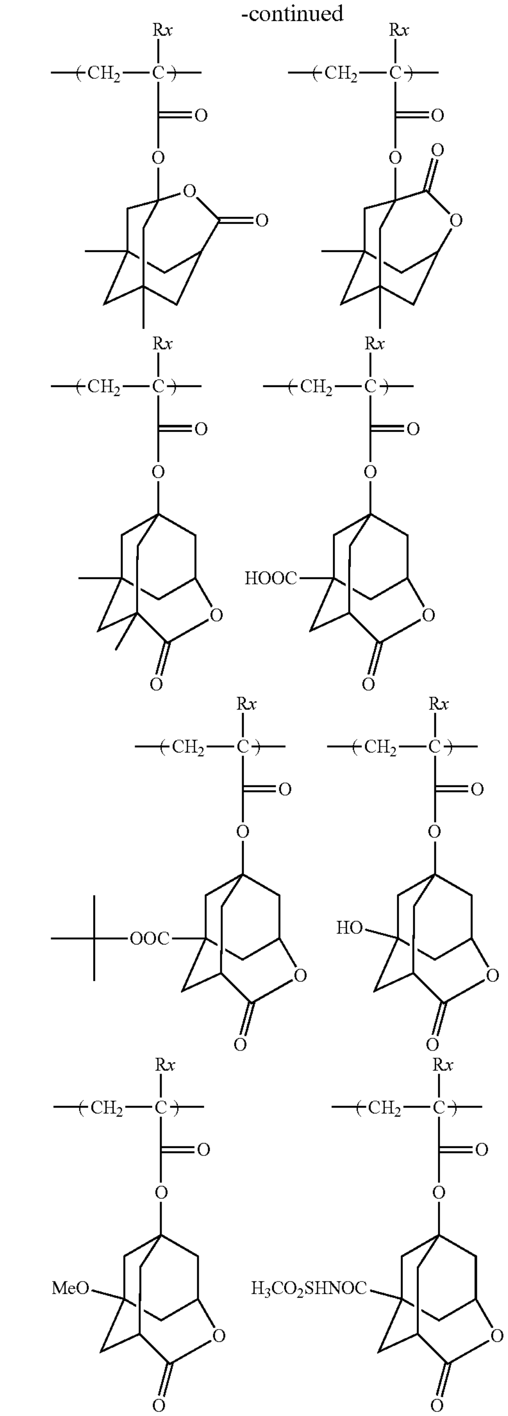

(in the formulae, Rx represents H, $CH_3$, $CH_2OH$, or $CF_3$)

The resin (A) may further have a repeating unit containing an organic group having a polar group, in particular, a repeating unit having an alicyclic hydrocarbon structure substituted with a polar group. Thus, the substrate adhesiveness and the developer affinity are improved. As the alicyclic hydrocarbon structure of the alicyclic hydrocarbon structure substituted with a polar group, an adamantyl group, a diamantyl group, or a norbornane group are preferable. As the polar group, a hydroxyl group or a cyano group is preferable.

Preferred examples of the alicyclic hydrocarbon structure substituted with a polar group include partial structures represented by the following General Formulae (VIIa) to (VIId).

(VIIa)

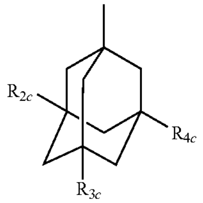

(VIIb)

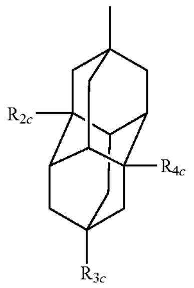

(VIIc)

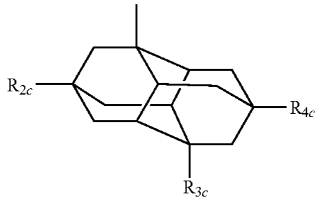

(VIId)

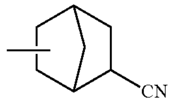

In General Formulae (VIIa) to (VIIc), $R_{2c}$ to $R_{4c}$ each independently represent a hydrogen atom, a hydroxyl group, or a cyano group, provided that at least one of $R_{2c}$, . . . , or $R_{4c}$ represents a hydroxyl group or a cyano group. It is preferable that one or two of $R_{2c}$ to $R_{4c}$ are hydroxyl group(s) and the remainders are hydrogen atoms.

In General Formula (VIIa), it is more preferable that two of $R_{2c}$ to $R_{4c}$ are hydroxyl groups and the remainders are hydrogen atoms.

Examples of the repeating unit having a group represented by any one of General Formulae (VIIa) to (VIId) include those in which at least one of $R_{13}'$, . . . , or $R_{16}'$ in General Formula (II-AB1) or (II-AB2) has a group represented by any one of General Formula (VII) (for example, a group —$COOR_5$ in which $R_5$ is a group represented by any one of General Formulae (VIIa) to (VIIId)), and repeating units represented by the following General Formulae (AIIa) to (AIId).

(AIIa)

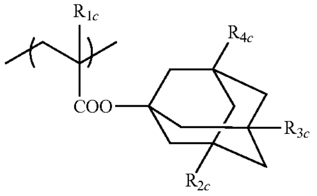

(AIIb)

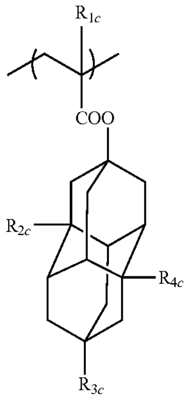

(AIIc)

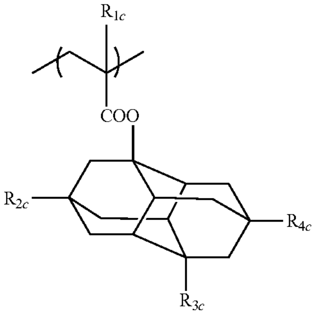

(AIId)

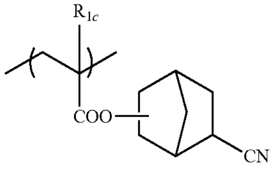

In General Formulae (AIIa) to (AIId), $R_{1c}$ represents a hydrogen atom, a methyl group, a trifluoromethyl group, or a hydroxymethyl group.

$R_{2c}$ to $R_{4c}$ have the same definitions as $R_{2c}$ to $R_{4c}$ in General Formulae (VIIa) to (VIIc).

Specific examples of the repeating unit having a structure represented by any one of General Formulae (AIIa) to (AIId) will be shown below, but the present invention is not limited thereto.

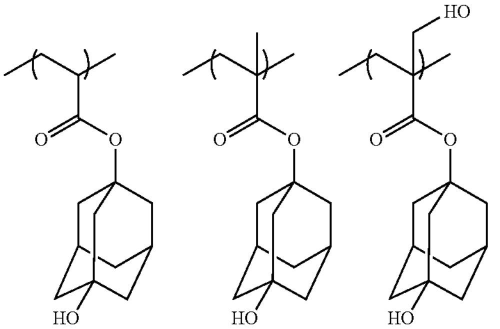

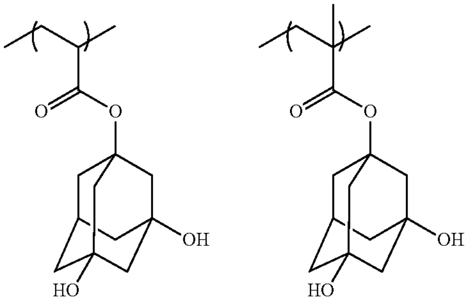

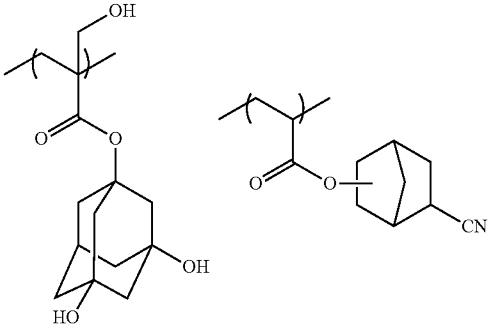

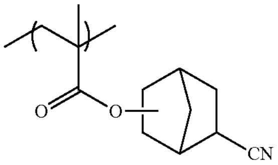

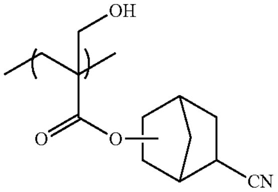

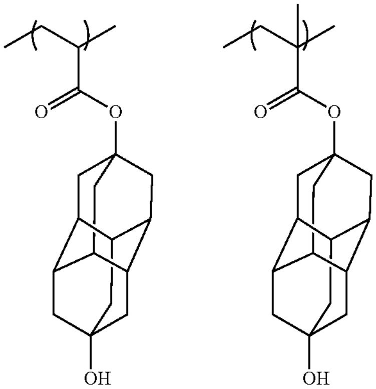

-continued

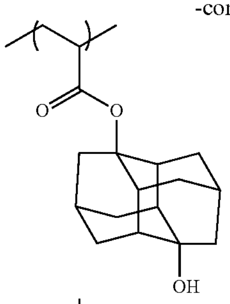

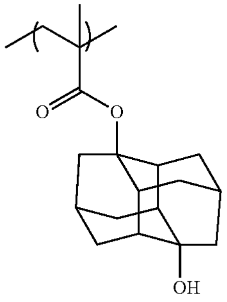

The resin (A) may have a repeating unit represented by the following General Formula (VIII).

(VIII)

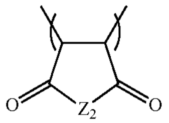

In General Formula (VIII), $Z_2$ represents —O— or —N($R_{41}$)—. $R_{41}$ represents a hydrogen atom, a hydroxyl group, an alkyl group or —$OSO_2$—$R_{42}$. $R_{42}$ represents an alkyl group, a cycloalkyl group, or a camphor residue. The alkyl group of each of $R_{41}$ and $R_{42}$ may further be substituted with a halogen atom (preferably a fluorine atom) or the like.

Examples of the repeating unit represented by General Formula (VIII) include the following specific examples, but the present invention is not limited thereto.

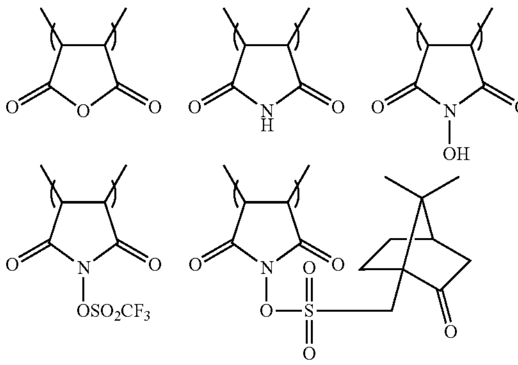

The resin (A) preferably has a repeating unit having an alkali-soluble group, and more preferably has a repeating unit having a carboxyl group. By incorporation of such a repeating unit, the resolution increases in the applications in a contact hole. Preferred examples of the repeating unit having a carboxyl group include any one of a repeating unit in which a carboxyl group is directly attached to the main chain of a resin such as a repeating unit of acrylic acid or methacrylic acid, a repeating unit in which a carboxyl group is attached to the main chain of a resin via a linking group and a repeating unit carrying, at the terminal of a polymer chain, an alkali-soluble group having been introduced in the course of polymerization by using a polymerization initiator or a chain transfer agent having the alkali-soluble group. The linking group may have a monocyclic or polycyclic hydrocarbon structure. A repeating unit including acrylic acid or methacrylic acid is particularly preferable.

The resin (A) may also have a repeating unit having 1 to 3 groups represented by General Formula (F1). Thus, the line edge roughness performance is further improved.

(F1)

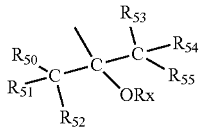

In General Formula (F1), $R_{50}$ to $R_{55}$ each independently represent a hydrogen atom, a fluorine atom or an alkyl group, provided that at least one of $R_{50}$, . . . , or $R_{55}$ represents a fluorine atom or an alkyl group in which at least one hydrogen atom is substituted with a fluorine atom.

Rx represents a hydrogen atom or an organic group (preferably an acid-decomposable protecting group, an alkyl group, a cycloalkyl group, an acyl group, or an alkoxycarbonyl group).

The alkyl group of each of $R_{50}$ to $R_{55}$ may be substituted with a halogen atom such as a fluorine atom, a cyano group, or the like. Preferred examples thereof include an alkyl group having 1 to 3 carbon atoms, such as a methyl group and a trifluoromethyl group.

It is preferable that all of $R_{50}$ to $R_{55}$ are fluorine atoms.

Preferred examples of the organic group represented by Rx include an acid-decomposable protecting group, an alkyl group which may have a substituent, a cycloalkyl group, an acyl group, an alkylcarbonyl group, an alkoxycarbonyl group, an alkoxycarbonylmethyl group, an alkoxymethyl group, and a 1-alkoxyethyl group.

The repeating unit having a group represented by General Formula (F1) is preferably a repeating unit represented by the following General Formula (F2).

(F2)

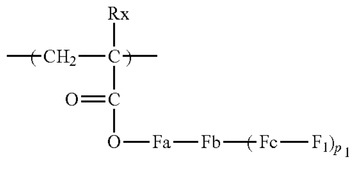

In General Formula (F2),

Rx represents a hydrogen atom, a halogen atom or an alkyl group having 1 to 4 carbon atoms. Preferred examples of a substituent which may be contained in the alkyl group of Rx include a hydroxyl group and a halogen atom.

Fa represents a single bond, or a linear or branched alkylene group and a single bond is preferable.

Fb represents a monocyclic or polycyclic hydrocarbon group.

Fc represents a single bond, or a linear or branched alkylene group (and is preferably a single bond or a methylene group).

$F_1$ represents a group represented by General Formula (F1).

$p_1$ represents 1 to 3.

As the cyclic hydrocarbon group in Fb, a cyclopentylene group, a cyclohexylene group, or a norbornylene group is preferable.

Specific examples of the repeating unit having a group represented by General Formula (F1) are shown below, but the present invention is not limited thereto.

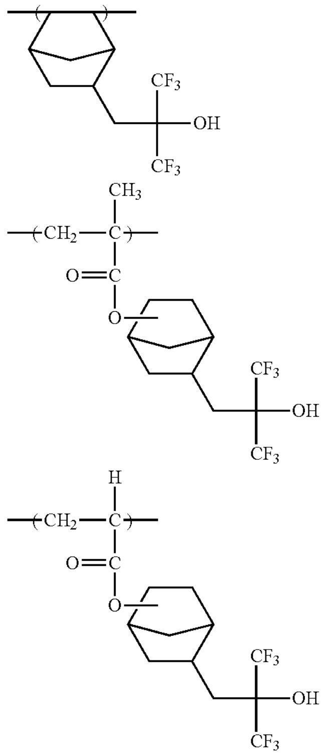

The resin (A) may also have a repeating unit further having an alicyclic hydrocarbon structure and not exhibiting acid-decomposability. Thus, it is possible to reduce elution of the low molecular components from the resist film to the immersion liquid upon liquid immersion exposure. Examples of such a repeating unit include 1-adamantyl (meth)acrylate, tricyclodecanyl (meth)acrylate, and cyclohexyl (meth)acrylate.

The resin (A) may contain, in addition to the above-described repeating units, repeating units derived from various monomers for the purpose of controlling various characteristics. Examples of such a monomer include a compound having one addition-polymerizable unsaturated bond selected from acrylic acid esters, methacrylic acid esters, acrylamides, methacrylamides, allyl compounds, vinyl ethers, and vinyl esters.

In addition, addition-polymerizable unsaturated compounds which are copolymerizable with monomers corresponding to various repeating units above may be copolymerized.

In the resin (A), the molar ratio of each of the repeating units is appropriately set.

In the resin (A), the content of the repeating units having acid-decomposable groups is preferably 10% to 60% by mole, more preferably 20% to 50% by mole, and still more preferably 25% to 40% by mole, with respect to all the repeating units.

In the resin (A), the content of the repeating units having partial structures represented by General Formulae (pI) to (pV) is preferably 20% to 70% by mole, more preferably 20% to 50% by mole, and still more preferably 25% to 40% by mole, with respect to all the repeating units.

In the resin (A), the content of the repeating units represented by General Formula (II-AB) is preferably 10% to 60% by mole, more preferably 15% to 55% by mole, and still more preferably 20% to 50% by mole, with respect to all the repeating units.

In the resin (A), the content of the repeating units having lactone rings is preferably 10% to 70% by mole, more preferably 20% to 60% by mole, and still more preferably 25% to 40% by mole, with respect to all the repeating units.

In the resin (A), the content of the repeating units having organic groups containing polar groups is preferably 1% to 40% by mole, more preferably 5% to 30% by mole, and still more preferably 5% to 20% by mole, with respect to all the repeating units.

Furthermore, the content of the repeating units derived from the monomers in the resin (A) can be appropriately set, but generally, it is preferably 99% by mole or less, more preferably 90% by mole or less, and still more preferably 80% by mole or less, with respect to sum of the total moles of the repeating units having partial structures represented by General Formulae (pI) to (pV) and the repeating units represented by General Formula (II-AB).

In a case where the resist composition of the present invention is to be used for ArF exposure, from the viewpoint of the transparency to the ArF light, it is preferable that the resin (A) is free of an aromatic group.

As the resin (A), resins in which all of the repeating units are constituted with (meth)acrylate-based repeating units are preferable. In this case, any one of a resin in which all of the repeating units are methacrylate-based repeating units, a resin in which all of the repeating units are acrylate-based repeating units, and a resin in which all of the repeating units are mixtures of methacrylate-based repeating units/acrylate-based repeating units, and the proportion of the acrylate-based repeating units is preferably 50% by mole or less with respect to all the repeating units.

The resin (A) is preferably a copolymer at least having three kinds of repeating units, that is, a (meth)acrylate-based repeating unit having a lactone ring, a (meth)acrylate-based repeating unit having an organic group substituted with at least one of a hydroxyl group or a cyano group, and a (meth)acrylate-based repeating unit having an acid-decomposable group.

The resin (A) is preferably a ternary copolymerization polymer including 20% to 50% by mole of repeating units having partial structures represented by General Formulae (pI) to (pV), 20% to 50% by mole of repeating units having lactone structures, and 5% to 30% by mole of repeating units having alicyclic hydrocarbon structures substituted with polar groups, or a quaternary copolymerization polymer including the above repeating units and 0% to 20% of other repeating units.

Preferred examples of the resin (A) include the resins described in paragraphs [0152] to [0158] of JP2008-309878A, but the present invention is not limited thereto.

The resin (A) can be synthesized by an ordinary method (for example, radical polymerization). Examples of the general synthesis method include a batch polymerization method of dissolving monomer species and an initiator in a solvent and heating the solution, thereby carrying out the polymerization, and a dropwise-addition polymerization method of adding dropwise a solution containing monomer species and an initiator to a heated solvent for 1 to 10 hours, with the dropwise-addition polymerization method being preferable. Examples of the reaction solvent include ethers such as tetrahydrofuran, 1,4-dioxane, and diisopropyl ether; ketones such as methyl ethyl ketone and methyl isobutyl ketone; ester solvents such as ethyl acetate, amide solvents such as dimethyl formamide and dimethyl acetamide; and solvents which dissolve the resist composition of the present invention, such as propylene glycol monomethyl ether acetate, propylene glycol monomethyl ether, and cyclohexanone, which will be described later. It is more preferable to carry out polymerization using the same solvent as the solvent used in the resist composition of the present invention. Thus, generation of the particles during storage can be suppressed.

It is preferable that the polymerization reaction is carried out in an inert gas atmosphere such as nitrogen and argon. As the polymerization initiator, commercially available radical initiators (azo-based initiators, peroxides, or the like) are used to initiate the polymerization. As the radical initiator, an azo-based initiator is preferable, and the azo-based initiator having an ester group, a cyano group, or a carboxyl group is preferable. Preferred examples of the initiators include azobisisobutyronitrile, azobisdimethylvaleronitrile, and dimethyl 2,2'-azobis(2-methyl propionate). The initiator is added or added in portionwise, depending on the purposes, and after completion of the reaction, the reaction mixture is poured into a solvent, and then a desired polymer is recovered by a method such as powder and solid recovery. The concentration of the reactant is 5% to 50% by mass, and preferably 10% to 30% by mass. The reaction temperature is usually 10° C. to 150° C., preferably 30° C. to 120° C., and more preferably 60° C. to 100° C.

For the purification, an ordinary method such as a liquid-liquid extraction method of applying water washing or combining it with an appropriate solvent to remove the residual monomers or oligomer components; a purification method in a solution state, such as ultrafiltration of extracting and removing only the polymers having a molecular weight no more than a specific molecular weight; a reprecipitation method of dropwise adding a resin solution into a poor solvent to solidify the resin in the poor solvent, thereby removing the residual monomers and the like; and a purification method in a solid state, such as cleaning of a resin slurry with a poor solvent after separation of the slurry by filtration can be applied.

The weight-average molecular weight (Mw) of the resin (A) is preferably 1,000 to 200,000, more preferably 1,000 to 20,000, and still more preferably 1,000 to 15,000. By setting the weight-average molecular weight to 1,000 to 200,000, the heat resistance and the dry etching resistance can be prevented from being deteriorated, and the film forming properties can be prevented from being deteriorated due to deteriorated developability or increased viscosity.

A dispersity (molecular weight distribution) which is the ratio (Mw/Mn) of the weight-average molecular weight (Mw) to the number-average molecular weight (Mn) of usually 1 to 5, preferably 1 to 3, more preferably 1.2 to 3.0, and particularly preferably 1.2 to 2.0 is used. As the dispersity is smaller, the resolution and the resist shape are excellent, the side wall of the resist pattern is smooth, and the roughness is excellent.

Furthermore, in the present invention, the weight-average molecular weight (Mw) and the number-average molecular weight (Mn) are values in terms of polystyrene, determined by a gel permeation chromatography (GPC) method (hereinafter the same shall apply).

The blend amount of the resin (A) in the entire resist composition of the present invention is preferably 50% to 99.9% by mass, and more preferably 60% to 99.0% by mass, with respect to the total solid content.

Furthermore, in the present invention, the resin (A) may be used singly or in combination of plural kinds thereof.

It is preferable that the resin (A), preferably the resist composition of the present invention contains neither a fluorine atom nor a silicon atom from the viewpoint of the compatibility with a topcoat composition.

(B) Compound that Generates Acid Upon Irradiation with Active Light or Radiation The resist composition of the present invention typically contains a compound that generates an acid upon irradiation with active light or radiation (also referred to as a "photoacid generator" or a "component (B)").

As such a photoacid generator, a compound may be appropriately selected from known compounds that generate an acid upon irradiation with active light or radiation which are used for a photoinitiator for cationic photopolymerization, a photoinitiator for radical photopolymerization, a photodecoloring agent for coloring agents, a photodiscoloring agent, a microresist, or the like, and a mixture thereof, and used.

Examples of the compound include a diazonium salt, a phosphonium salt, a sulfonium salt, an iodonium salt, imidosulfonate, oxime sulfonate, diazodisulfone, disulfone, and o-nitrobenzyl sulfonate.

In addition, as a compound in which a group or compound that generates an acid upon irradiation with active light or radiation is introduced into the main or side chain of the polymer, for example, the compounds described in U.S. Pat. No. 3,849,137A, GE3914407A, JP1988-26653A (JP-S63-26653A), JP1980-164824A (JP55-164824A), JP1987-69263A (JP62-69263A), JP1988-146038A (JP63-146038A), JP1988-163452A (JP63-163452A), JP1987-153853A (JP62-153853A), JP1988-146029A (JP63-146029A), and the like can be used.

In addition, the compounds that generates an acid by light described in U.S. Pat. No. 3,779,778A, EP126712B, and the like can also be used.

Among the preferred compounds that decomposes upon irradiation with active light or radiation to generate an acid, there may be compounds represented by the following General Formulae (ZI), (ZII), and (ZIII).

ZI

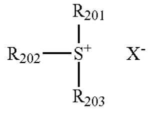

ZII

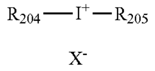

-continued

ZIII

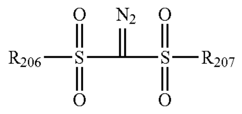

In General Formula (ZI), $R_{201}$, $R_{202}$, and $R_{203}$ each independently represent an organic group.

$X^-$ represents a non-nucleophilic anion, and preferred examples thereof include a sulfonate anion, a carboxylate anion, a bis(alkylsulfonyl)amide anion, a tris(alkylsulfonyl) methide anion, $BF_4^-$, $PF_6^-$, and $SbF_6^-$, with an organic anion containing a carbon atom being preferable.

Preferred examples of the organic anion include organic anions represented by the following formulae.

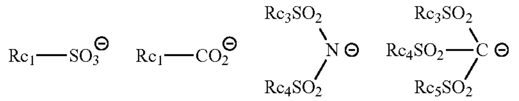

In the formulae, $Rc_1$ represents an organic group.

Examples of the organic group in $Rc_1$ include those having 1 to 30 carbon atoms, and preferably an alkyl group which may be substituted, an aryl group, or a group formed by linking these plural groups through a linking group such as a single bond, —O—, —$CO_2$—, —S—, —$SO_3$—, and —$SO_2N(Rd_1)$-. $Rd_1$ represents a hydrogen atom or an alkyl group.

$Rc_3$, $Rc_4$, and $Rc_5$ each independently represent an organic group. Preferred examples of the organic group in $Rc_3$, $Rc_4$, or $Rc_5$ include the same groups as the preferred organic groups in $Rc_1$, with a perfluoroalkyl group having 1 to 4 carbon atoms being most preferable.

$Rc_3$ and $Rc_4$ may be bonded to each other to form a ring. Examples of the group formed by the bonding of $Rc_3$ and $Rc_4$ include an alkylene group and an arylene group. A preferred example thereof is a perfluoroalkylene group having 2 to 4 carbon atoms.

The organic group of each of $Rc_1$, and $Rc_3$ to $Rc_5$ is particularly preferably an alkyl group having a fluorine atom or a fluoroalkyl group substituted at the 1-position, or a phenyl group substituted with a fluorine atom or a fluoroalkyl group. By having a fluorine atom or a fluoroalkyl group, the acidity of the generated acid generated upon irradiation with light increases, and thus, the sensitivity is improved. Further, by the bonding of $Rc_3$ and $Rc_4$ to form a ring, the acidity of the generated acid generated upon irradiation with light increases, and thus, the sensitivity is improved.

The number of carbon atoms of the organic group as each of $R_{201}$, $R_{202}$, and $R_{203}$ is generally 1 to 30, and preferably 1 to 20.

Furthermore, two of $R_{201}$ to $R_{203}$ may be bonded to each other to form a ring structure, and may include an oxygen atom, a sulfur atom, an ester bond, an amide bond, or a carbonyl group within the ring. Examples of the group formed by the bonding of two of $R_{201}$ to $R_{203}$ include alkylene groups (for example, a butylene group and a pentylene group).

Specific examples of the organic group as each of $R_{201}$, $R_{202}$, and $R_{203}$ include the corresponding groups in the compounds (ZI-1), (ZI-2), and (ZI-3) which will be described later.

Moreover, it may be a compound having a plurality of structures represented by General Formula (ZI). For example, it may be a compound having a structure in which at least one of $R_{201}$, . . . , or $R_{203}$ in the compound represented by General Formula (ZI) is bonded to at least one of $R_{201}$, . . . , or $R_{203}$ of one compound represented by General Formula (ZI).

More preferred examples of the component (ZI) include the compounds (ZI-1), (ZI-2), and (ZI-3) which will be described later.

The compound (ZI-1) is an arylsulfonium compound, that is, a compound having arylsulfonium as a cation, in which at least one of $R_{201}$, . . . , or $R_{203}$ in General Formula (ZI) is an aryl group.

In the arylsulfonium compound, all of $R_{201}$ to $R_{203}$ may be an aryl group, or a part of $R_{201}$ to $R_{203}$ may be an aryl group and the remainders are an alkyl group or a cycloalkyl group.

Examples of the arylsulfonium compound include a triarylsulfonium compound, a diarylalkylsulfonium compound, an aryldialkylsulfonium compound, a diarylcycloalkylsulfonium compound, and an aryldicycloalkylsulfonium compound.

The aryl group of the arylsulfonium compound is preferably an aryl group such as a phenyl group and a naphthyl group, or a heteroaryl group such as an indole residue and a pyrrole residue, and is more preferably a phenyl group or an indole residue. In a case where the arylsulfonium compound has two or more aryl groups, two or more aryl groups that are present may be the same as or different from each other.

The alkyl group that the arylsulfonium compound may have, if desired, is preferably a linear or branched alkyl group having 1 to 15 carbon atoms, and examples thereof include a methyl group, an ethyl group, a propyl group, an n-butyl group, a sec-butyl group, and a t-butyl group.

The cycloalkyl group which the arylsulfonium compound may have, if desired, is preferably a cycloalkyl group having 3 to 15 carbon atoms, and examples thereof include a cyclopropyl group, a cyclobutyl group, and a cyclohexyl group.

The aryl group, the alkyl group, or the cycloalkyl group of each of $R_{201}$ to $R_{203}$ may have, as the substituent, an alkyl group (for example, having 1 to 15 carbon atoms), a cycloalkyl group (for example, having 3 to 15 carbon atoms), an aryl group (for example, having 6 to 14 carbon atoms), an alkoxy group (for example, having 1 to 15 carbon atoms), a halogen atom, a hydroxyl group, or a phenylthio group. Preferred substituents are a linear or branched alkyl group having 1 to 12 carbon atoms, a cycloalkyl group having 3 to 12 carbon atoms, or a linear, branched, or cyclic alkoxy group having 1 to 12 carbon atoms, and particularly preferably an alkyl group having 1 to 4 carbon atoms or an alkoxy group having 1 to 4 carbon atoms. The substituent may be substituted with any one or all of three $R_{201}$ to $R_{203}$. Incidentally, in a case where $R_{20}$, to $R_{203}$ are each an aryl group, the substituent is preferably substituted at the p-position of the aryl group.

Next, the compound (ZI-2) will be described. The compound (ZI-2) is a compound in which $R_{201}$ to $R_{203}$ in Formula (ZI) each independently represent an organic group not containing an aromatic ring. Here, the aromatic ring also encompasses an aromatic ring containing a heteroatom.

The organic group not containing an aromatic ring as $R_{201}$ to $R_{203}$ has generally 1 to 30 carbon atoms, and preferably 1 to 20 carbon atoms.

$R_{201}$ to $R_{203}$ are each independently preferably an alkyl group, a cycloalkyl group, an allyl group, or a vinyl group, more preferably a linear, branched, or cyclic 2-oxoalkyl group, or an alkoxycarbonylmethyl group, and particularly preferably a linear or branched 2-oxoalkyl group.

The alkyl group as each of $R_{201}$ to $R_{203}$ may be linear or branched, and preferred examples thereof include linear or branched alkyl groups having 1 to 10 carbon atoms (for example, a methyl group, an ethyl group, a propyl group, a butyl group, and a pentyl group). The alkyl group as each of $R_{201}$ to $R_{203}$ is a linear or branched 2-oxoalkyl group or an alkoxycarbonylmethyl group.

Preferred examples of the cycloalkyl group as each of $R_{201}$ to $R_{203}$ include cycloalkyl groups having 3 to 10 carbon atoms (a cyclopentyl group, a cyclohexyl group, and a norbornyl group). The cycloalkyl group as each of $R_{201}$ to $R_{203}$ is preferably a cyclic 2-oxoalkyl group.

Preferred examples of the linear, branched, or cyclic 2-oxoalkyl group as each of $R_{201}$ to $R_{203}$ include a group having >C=O at the 2-position of the alkyl group and the cycloalkyl group.

Preferred examples of the alkoxy group in the alkoxycarbonylmethyl group as each of $R_{201}$ to $R_{203}$ include an alkoxy group having 1 to 5 carbon atoms (a methoxy group, an ethoxy group, a propoxy group, a butoxy group, and a pentoxy group).

$R_{201}$ to $R_{203}$ may further be substituted with a halogen atom, an alkoxy group (for example, having 1 to 5 carbon atoms), a hydroxyl group, a cyano group, or a nitro group.

The compound (ZI-3) is a compound represented by the following General Formula (ZI-3), and is also a compound having a phenacylsulfonium salt structure.

(ZI-3)

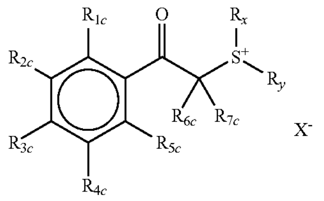

In General Formula (ZI-3), $R_{1c}$ to $R_{5c}$ each independently represent a hydrogen atom, an alkyl group, a cycloalkyl group, an alkoxy group, or a halogen atom.

$R_{6c}$ and $R_{7c}$ each independently represent a hydrogen atom, an alkyl group, or a cycloalkyl group.

Rx and Ry each independently represent an alkyl group, a cycloalkyl group, an allyl group, or a vinyl group.

Any two or more of $R_{1c}$ to $R_{7c}$, and Rx and Ry may be bonded to each other to form a ring structure, and these ring structures may include an oxygen atom, a sulfur atom, an ester bond, or an amide bond. The group formed by bonding of any two or more of $R_{1c}$ to $R_{7c}$, and Rx and Ry include a butylene group and a pentylene group.

$X^-$ represents a non-nucleophilic anion, and examples thereof include the same ones as the non-nucleophilic anion of $X^-$ in General Formula (ZI).

The alkyl group as each of $R_{1c}$ to $R_{7c}$ may be linear or branched, and preferred examples thereof include linear or branched alkyl groups having 1 to 20 carbon atoms, and preferably linear or branched alkyl groups having 1 to 12 carbon atoms (for example, a methyl group, an ethyl group, a linear or branched propyl group, a linear or branched butyl group, and a linear or branched pentyl group).

Preferred examples of the cycloalkyl group as each of $R_{1c}$ to $R_{7c}$ include cycloalkyl groups having 3 to 8 carbon atoms (a cyclopentyl group and a cyclohexyl group).

The alkoxy group as each of $R_{1c}$ to $R_{5c}$ may be linear, branched, or cyclic, and examples thereof include alkoxy groups having 1 to 10 carbon atoms, and preferably linear and branched alkoxy groups having 1 to 5 carbon atoms (for example, a methoxy group, an ethoxy group, a linear or branched propoxy group, a linear or branched butoxy group, and a linear or branched pentoxy group), and cyclic alkoxy groups having 3 to 8 carbon atoms (for example, a cyclopentyloxy group and a cyclohexyloxy group).

It is preferable that any one of $R_{1c}$ to $R_{5c}$ is a linear or branched alkyl group, a cycloalkyl group, or a linear, branched, or cyclic alkoxy group, and it is more preferable that the sum of the numbers of carbon atoms of $R_{1c}$ to $R_{5c}$ is 2 to 15. Thus, the solvent solubility is more improved, and the generation of the particles during storage is suppressed.

Examples of the alkyl group as each of $R_x$ and $R_y$ include the same groups as the alkyl group as each of $R_{1c}$ to $R_{7c}$. The alkyl group as each of $R_x$ and $R_y$ is preferably a linear or branched 2-oxoalkyl group or an alkoxycarbonylmethyl group.

Examples of the cycloalkyl group as each of $R_x$ and $R_y$ include the same groups as the cycloalkyl group as each of $R_{1c}$ to $R_{7c}$. The cycloalkyl group as each of $R_x$ and $R_y$ is preferably a cyclic 2-oxoalkyl group.

Examples of the linear, branched, or cyclic 2-oxoalkyl group include the alkyl group as each of $R_{1c}$ to $R_{7c}$, and a group having >C=O at the 2-position of the cycloalkyl group.

Examples of the alkoxy group in the alkoxycarbonylmethyl group include the same groups as the alkoxy groups as $R_{1c}$ to $R_{5c}$.

$R_x$ and $R_y$ are each preferably an alkyl group having 4 or more carbon atoms, more preferably an alkyl group having 6 or more carbon atoms, and still more preferably an alkyl group having 8 or more carbon atoms.

In General Formulae (ZII) and (ZII), $R_{204}$ to $R_{207}$ each independently represent an aryl group, an alkyl group, or a cycloalkyl group.

As the aryl group of each of $R_{204}$ to $R_{207}$, a phenyl group or a naphthyl group is preferable, and a phenyl group is more preferable.

The alkyl group as each of $R_{204}$ to $R_{207}$ may be linear or branched, and preferred examples thereof include linear or branched alkyl groups having 1 to 10 carbon atoms (for example, a methyl group, an ethyl group, a propyl group, a butyl group, and a pentyl group).

Examples of the cycloalkyl group as each of $R_{204}$ to $R_{207}$ include cycloalkyl groups having 3 to 10 carbon atoms (for example, a cyclopentyl group, a cyclohexyl group, and a norbornyl group).

$R_{204}$ to $R_{207}$ may have a substituent. Examples of the substituent which may be contained in $R_{204}$ to $R_{207}$ include an alkyl group (for example, having 1 to 15 carbon atoms), a cycloalkyl group (for example, having 3 to 15 carbon atoms), an aryl group (for example, having 6 to 15 carbon atoms), an alkoxy group (for example, having 1 to 15 carbon atoms), a halogen atom, a hydroxyl group, and a phenylthio group.

$X^-$ represents a non-nucleophilic anion, and examples thereof include the same ones as the non-nucleophilic anion of $X^-$ in General Formula (ZI).

Preferred examples of the compound that generates an acid upon irradiation with active light or radiation further include compounds represented by the following General Formulae (ZIV), (ZV), and (ZVI).

ZIV $Ar_3—SO_2—SO_2—Ar_4$

ZV

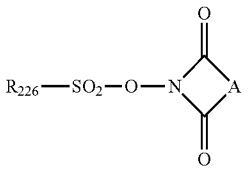

ZVI

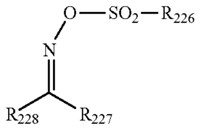

In General Formulae (ZIV) to (ZVI), $Ar_3$ and $Ar_4$ each independently represent an aryl group.

$R_{226}$ represents an alkyl group or an aryl group.

$R_{227}$ and $R_{228}$ each independently represent an alkyl group, an aryl group, or an electron-withdrawing group. $R_{227}$ is preferably an aryl group.

$R_{228}$ is preferably an electron-withdrawing group, and more preferably a cyano group or a fluoroalkyl group.

A represents an alkylene group, an alkenylene group, or arylene group.

As the compound that generates an acid upon irradiation with active light or radiation, compounds represented by General Formulae (ZI) to (ZIII) are preferable.

The compound (B) is preferably a compound that generates aliphatic sulfonic acid having a fluorine atom or benzenesulfonic acid having a fluorine atom upon irradiation with active light or radiation.

The compound (B) preferably has a triphenylsulfonium structure.

The compound (B) is preferably a triphenylsulfonium salt compound having an alkyl group or cycloalkyl group, not having a cationic moiety substituted with fluorine.

Specific examples of the compound that generates an acid upon irradiation with active light or radiation include the compounds described in paragraphs [0194] to [0199] of JP2008-309878A, but the present invention is not limited thereto.

The photoacid generator can be used singly or in combination of two or more kinds thereof. When the photoacid generator is used in combination of two or more kinds thereof, it is preferable to combine compounds that generate two different kinds of organic acids having the total number of atoms excluding hydrogen atoms of 2 or more.

The content of the photoacid generator is preferably 0.1% to 20% by mass, more preferably 0.5% to 10% by mass, and still more preferably 1% to 7% by mass, with respect to the total solid content of the resist composition.

(C) Solvent

Examples of the solvent which can be used when the respective components are dissolved to prepare a resist composition include organic solvents such as alkylene glycol monoalkyl ether carboxylate, alkylene glycol monoalkyl ether, alkyl lactate ester, alkyl alkoxypropionate, a cyclic lactone having 4 to 10 carbon atoms, a monoketone compound having 4 to 10 carbon atoms, which may have a ring, alkylene carbonate, alkyl alkoxyacetate, and alkyl pyruvate.

Preferred examples of the alkylene glycol monoalkyl ether carboxylate include propylene glycol monomethyl ether acetate, propylene glycol monoethyl ether acetate, propylene glycol monopropyl ether acetate, propylene glycol monobutyl ether acetate, propylene glycol monomethyl ether propionate, propylene glycol monoethyl ether propionate, ethylene glycol monomethyl ether acetate, and ethylene glycol monoethyl ether acetate.

Preferred examples of the alkylene glycol monoalkyl ether include propylene glycol monomethyl ether, propylene glycol monoethyl ether, propylene glycol monopropyl ether, propylene glycol monobutyl ether, ethylene glycol monomethyl ether, and ethylene glycol monoethyl ether.

Preferred examples of the alkyl lactate ester include methyl lactate, ethyl lactate, propyl lactate, and butyl lactate.

Preferred examples of the alkyl alkoxypropionate include ethyl 3-ethoxypropionate, methyl 3-methoxypropionate, methyl 3-ethoxypropionate, and ethyl 3-methoxypropionate.

Preferred examples of the cyclic lactone having 4 to 10 carbon atoms include β-propiolactone, β-butyrolactone, γ-butyrolactone, α-methyl-γ-butyrolactone, β-methyl-γ-butyrolactone, γ-valerolactone, γ-caprolactone, γ-octanoic lactone, and α-hydroxy-γ-butyrolactone.

Preferred examples of the monoketone compound having 4 to 10 carbon atoms, which may contain a ring, include 2-butanone, 3-methylbutanone, pinacolone, 2-pentanone, 3-pentanone, 3-methyl-2-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexen-2-one, 3-penten-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone, and 3-methylcycloheptanone.

Preferred examples of the alkylene carbonate include propylene carbonate, vinylene carbonate, ethylene carbonate, and butylene carbonate.

Preferred examples of the alkyl alkoxyacetate include 2-methoxyethyl acetate, 2-ethoxyethyl acetate, 2-(2-ethoxyethoxy)ethyl acetate, 3-methoxy-3-methylbutyl acetate, and 1-methoxy-2-propyl acetate.

Preferred examples of the alkyl pyruvate include methyl pyruvate, ethyl pyruvate, and propyl pyruvate.

Examples of the solvent that can be preferably used include solvents having a boiling point of 130° C. or higher under the conditions of normal temperature and normal pressure. Specific examples thereof include cyclopentanone, γ-butyrolactone, cyclohexanone, ethyl lactate, ethylene glycol monoethyl ether acetate, propylene glycol monomethyl ether acetate, ethyl 3-ethoxypropionate, ethyl pyruvate, 2-ethoxyethyl acetate, 2-(2-ethoxyethoxy)ethyl acetate, and propylene carbonate.

In the present invention, the solvents may be used singly or in combination of two or more kinds thereof.

In the present invention, a mixed solvent obtained by mixing a solvent containing a hydroxyl group in its structure with a solvent not containing a hydroxyl group in its structure may be used as the organic solvent.

Examples of the solvent containing a hydroxyl group include ethylene glycol, ethylene glycol monomethyl ether, ethylene glycol monoethyl ether, propylene glycol, propylene glycol monomethyl ether, propylene glycol monoethyl ether, and ethyl lactate, and among these, propylene glycol monomethyl ether and ethyl lactate are particularly preferable. Examples of the solvent not containing a hydroxyl group include propylene glycol monomethyl ether acetate, ethylethoxypropionate, 2-heptanone, γ-butyrolactone, cyclohexanone, butyl acetate, N-methylpyrrolidone, N,N-dimethylacetamide, and dimethylsulfoxide, and among these, propylene glycol monomethyl ether acetate, ethylethoxypropionate, 2-heptanone, γ-butyrolactone, cyclohexanone, and butyl acetate are particularly preferable, and propylene glycol monomethyl ether acetate, ethylethoxypropionate, and 2-heptanone are most preferable.

The mixing ratio (based on mass) of the solvent containing a hydroxyl group to the solvent not containing a hydroxyl group is 1/99 to 99/1, preferably 10/90 to 90/10, and more preferably 20/80 to 60/40. A mixed solvent including the solvent not containing a hydroxyl group in the amount of 50% by mass or more is particularly preferable from the viewpoint of coating evenness.

The solvent is preferably a mixed solvent of two or more kinds of solvents containing propylene glycol monomethyl ether acetate.

(D) Hydrophobic Resin

The resist composition of the present invention may contain a hydrophobic resin (D). As the hydrophobic resin, for example, a resin (X) as described later, which can be contained in a topcoat composition can be suitably used. Further, other suitable examples thereof include the "[4] Hydrophobic Resin (D)" described in paragraphs [0389] to [0474] of JP2014-149409A.

The weight-average molecular weight of the hydrophobic resin (D) in terms of standard polystyrene is preferably 1,000 to 100,000, more preferably 1,000 to 50,000, and still more preferably 2,000 to 15,000.

Furthermore, the hydrophobic resin (D) may be used singly or in combination of plural kinds thereof.

The content of the hydrophobic resin (D) in the composition is preferably 0.01% to 10% by mass, more preferably 0.05% to 8% by mass, and still more preferably 0.1% to 7% by mass, with respect to the total solid content of the resist composition of the present invention.

(E) Basic Compound

The resist composition of the present invention preferably contains a basic compound (E) in order to reduce a change in performance over time from exposure to heating.

Preferred examples of the basic compound include compounds having structures represented by the following Formulae (A) to (E).

(A)

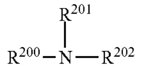

(B)

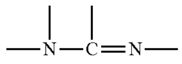

(C)

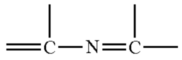

(D)

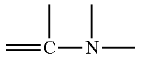

-continued (E)

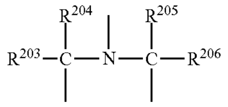

In General Formulae (A) to (E), $R^{200}$, $R^{201}$, and $R^{202}$ may be the same as or different from each other, represent a hydrogen atom, an alkyl group (preferably having 1 to 20 carbon atoms), a cycloalkyl group (preferably having 3 to 20 carbon atoms), or an aryl group (having 6 to 20 carbon atoms), in which $R^{201}$ and $R^{202}$ may be bonded to each other to form a ring.

With respect to the alkyl group, as the alkyl group having a substituent, an aminoalkyl group having 1 to 20 carbon atoms, a hydroxyalkyl group having 1 to 20 carbon atoms, or a cyanoalkyl group having 1 to 20 carbon atoms is preferable.

$R^{203}$, $R^{204}$, $R^{205}$, and $R^{206}$ may be the same as or different from each other, and each represent an alkyl group having 1 to 20 carbon atoms.

The alkyl group in General Formulae (A) to (E) is more preferably unsubstituted.

Preferred examples of the compound include guanidine, aminopyrrolidine, pyrazole, pyrazoline, piperazine, aminomorpholine, aminoalkylmorpholine and piperidine. More preferred examples of the compound include a compound having an imidazole structure, a diazabicyclo structure, an onium hydroxide structure, an onium carboxylate structure, a trialkylamine structure, an aniline structure or a pyridine structure; an alkylamine derivative having a hydroxyl group and/or an ether bond; and an aniline derivative having a hydroxyl group and/or an ether bond.

Examples of the compound having an imidazole structure include imidazole, 2,4,5-triphenylimidazole, and benzimidazole. Examples of the compound having a diazabicyclo structure include 1,4-diazabicyclo[2,2,2]octane, 1,5-diazabicyclo[4,3,0]non-5-ene, and 1,8-diazabicyclo[5,4,0]undec-7-ene. Examples of the compound having an onium hydroxide structure include triarylsulfonium hydroxide, phenacylsulfonium hydroxide, and sulfonium hydroxide having a 2-oxoalkyl group, specifically triphenylsulfonium hydroxide, tris(t-butylphenyl)sulfonium hydroxide, bis(t-butylphenyl)iodonium hydroxide, phenacylthiophenium hydroxide and 2-oxopropylthiophenium hydroxide. The compound having an onium carboxylate structure is formed by carboxylation of an anionic moiety of a compound having an onium hydroxide structure, and examples thereof include acetate, adamantane-1-carboxylate, and perfluoroalkyl carboxylate. Examples of the compound having a trialkylamine structure include tri(n-butyl)amine and tri(n-octyl)amine. Examples of the compound having an aniline structure include 2,6-diisopropylaniline, N,N-dimethylaniline, N,N-dibutylaniline, and N,N-dihexylaniline. Examples of the alkylamine derivative having a hydroxyl group and/or an ether bond include ethanolamine, diethanolamine, triethanolamine, and tris(methoxyethoxyethyl)amine. Examples of the aniline derivative having a hydroxyl group and/or an ether bond include N,N-bis(hydroxyethyl)aniline.

Furthermore, as the basic compound, ones described as a basic compound, which may be contained in a composition (topcoat composition) for forming an upper layer film which will be described later can be suitably used.

These basic compounds may be used singly or in combination of two or more kinds thereof.

The amount of the basic compound to be used is usually 0.001% to 10% by mass, and preferably 0.01% to 5% by mass, with respect to the solid content of the resist composition of the present invention.

The ratio between the photoacid generator to the basic compound to be used in the resist composition is preferably the photoacid generator/basic compound (molar ratio)=2.5 to 300. That is, the molar ratio is preferably 2.5 or more in view of sensitivity and resolution, and is preferably 300 or less in view of suppressing the reduction in resolution due to thickening of the resist pattern with aging after exposure until the heat treatment. The photoacid generator/basic compound (molar ratio) is more preferably 5.0 to 200, and still more preferably 7.0 to 150.

(F) Surfactant

The resist composition of the present invention preferably further contains a surfactant (F), and more preferably contains either one or two or more of fluorine- and/or silicon-based surfactants (a fluorine-based surfactant, a silicon-based surfactant, or a surfactant containing both a fluorine atom and a silicon atom).

By incorporating the surfactant (F) into the resist composition of the present invention, it becomes possible to form a resist pattern which is improved in adhesiveness and decreased in development defects with good sensitivity and resolution at a time of using an exposure light source of 250 nm or less, and particularly 220 nm or less.

Examples of the fluorine- and/or silicon-based surfactants include the surfactants described in JP1987-36663A (JP-S62-36663A), JP1986-226746A (JP-S61-226746A), JP1986-226745A (JP-S61-226745A), JP1987-170950A (JP-S62-170950A), JP1988-34540A (JP-S63-34540A), JP1995-230165A (JP-H07-230165A), JP1996-62834A (JP-H08-62834A), JP1997-54432A (JP-H09-54432A), JP1997-5988A (JP-H09-5988A), JP2002-277862A, U.S. Pat. No. 5,405,720A, U.S. Pat. No. 5,360,692A, U.S. Pat. No. 5,529,881A, U.S. Pat. No. 5,296,330A, U.S. Pat. No. 5,436,098A, U.S. Pat. No. 5,576,143A, U.S. Pat. No. 5,294,511A, and U.S. Pat. No. 5,824,451A, and the following commercially available surfactants may be used as they are.

Examples of the commercially available surfactants that can be used include fluorine-based surfactants or silicon-based surfactants such as EFTOP EF301 and EF303 (manufactured by Shin-Akita Kasei K. K.); FLORAD FC430, 431, and 4430 (manufactured by Sumitomo 3M Inc.); MEGAFACE F171, F173, F176, F189, F113, F110, F177, F120, and R08 (manufactured by DIC Corp.); SURFLON S-382, SC101, 102, 103, 104, 105, and 106 (manufactured by Asahi Glass Co., Ltd.); TROYSOL S-366 (manufactured by Troy Chemical Corp.); GF-300 and GF-150 (manufactured by Toagosei Chemical Industry Co., Ltd.); SURFLON S-393 (manufactured by Seimi Chemical Co., Ltd.); EFTOP EF121, EF122A, EF122B, RF122C, EF125M, EF135M, EF351, EF352, EF801, EF802, and EF601 (manufactured by JEMCO Inc.); PF636, PF656, PF6320, and PF6520 (manufactured by OMNOVA Solutions Inc.); and FTX-204G, 208G, 218G, 230G, 204D, 208D, 212D, 218D, and 222D (manufactured by NEOS Co., Ltd.). In addition, Polysiloxane Polymer KP-341 (manufactured by Shin-Etsu Chemical Co., Ltd.) can also be used as the silicon-based surfactant.

Furthermore, in addition to those known surfactants as described above, a surfactant using a polymer having a fluoroaliphatic group derived from a fluoroaliphatic compound which is produced by a telomerization method (also referred to as a telomer method) or an oligomerization method (also referred to as an oligomer method), can be used as the surfactant. The fluoroaliphatic compound can be synthesized in accordance with the method described in JP2002-90991A.

As the polymer having a fluoroaliphatic group, copolymer of monomers having fluoroaliphatic groups and (poly(oxyalkylene)) acrylate and/or (poly(oxyalkylene)) methacrylate are preferable, and they may be distributed at random or may be block copolymerized. Further, examples of the poly(oxyalkylene) group include a poly(oxyethylene) group, a poly(oxypropylene) group, and a poly(oxybutylene) group. Incidentally, the polymers may be units having alkylenes different in chain length in the same chain length, such as a poly(block combination of oxyethylene, oxypropylene, and oxyethylene), and poly(block combination of oxyethylene and oxypropylene). In addition, the copolymers of monomers having fluoroaliphatic groups and (poly(oxyalkylene)) acrylate (or methacrylate) may not be only binary copolymers but also ternary or higher copolymers obtained by copolymerization of monomers having different two or more kinds of fluoroaliphatic groups or different two or more kinds of (poly(oxyalkylene)) acrylates (or methacrylates) or the like at the same time.

Examples of the commercially available surfactant include MEGAFACE F178, F-470, F-473, F-475, F-476, and F-472 (manufactured by DIC Corp.); a copolymer of an acrylate (or methacrylate) having a $C_6F_{13}$ group with a (poly(oxyalkylene)) acrylate (or methacrylate); and a copolymer of an acrylate (or methacrylate) having a $C_3F_7$ group with a (poly(oxyethylene)) acrylate (or methacrylate) and a (poly(oxypropylene)) acrylate (or methacrylate).

Moreover, in the present invention, surfactants other than fluorine- and/or silicon-based surfactants can also be used. Specific examples thereof include nonionic surfactants, for example, polyoxyethylene alkyl ethers such as polyoxyethylene lauryl ether, polyoxyethylene stearyl ether, polyoxyethylene cetyl ether, and polyoxyethylene oleyl ether, polyoxyethylene alkylallyl ethers such as polyoxyethylene octylphenol ether and polyoxyethylene nonylphenol ether, polyoxyethylene/polyoxypropylene block copolymers, sorbitan fatty acid esters such as sorbitan monolaurate, sorbitan monopalmitate, sorbitan monostearate, sorbitan monooleate, sorbitan trioleate, and sorbitan tristearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate.

These surfactants may be used singly or in combination of some kinds thereof.

The content of the surfactant (F) to be used is preferably 0.01% to 10% by mass, and more preferably 0.1% to 5% by mass, with respect to the total amount (excluding the solvent) of the resist composition.

(G) Onium Carboxylate Salt

The resist composition of the present invention may contain an onium carboxylate salt (G). Examples of the onium carboxylate salt include a sulfonium carboxylate salt, an iodonium carboxylate salt, and an ammonium carboxylate salt. In particular, as the onium carboxylate salt (G), an iodonium salt and a sulfonium salt are preferable. Further, it is preferable that the carboxylate residue of the onium carboxylate salt (G) does not contain an aromatic group and a carbon-carbon double bond. As the particularly preferred anionic moiety, a linear, branched, monocyclic, or polycyclic alkylcarboxylate anion having 1 to 30 carbon atoms is preferable. Further, more preferably, a carboxylate anion in which a part or all of the alkyl groups are substituted with fluorine is more preferable. An oxygen atom may be contained in the alkyl chain, by which the transparency to the lights of 220 nm or less is ensured, thus, sensitivity and resolving power are enhanced, and density dependency and exposure margin are improved.

Examples of the fluorine-substituted carboxylate anion include anions of fluoroacetic acid, difluoroacetic acid, trifluoroacetic acid, pentafluoropropionic acid, heptafluorobutyric acid, nonafluoropentanoic acid, perfluorododecanoic acid, perfluorotridecanoic acid, perfluorocyclohexanecarboxylic acid, and 2,2-bistrifluoromethylpropionic acid.

These onium carboxylate salts (G) can be synthesized by reacting sulfonium hydroxide, iodonium hydroxide, or ammonium hydroxide and carboxylic acid with silver oxide in an appropriate solvent.

The content of the onium carboxylate salt (G) in the composition is generally 0.1% to 20% by mass, preferably 0.5% to 10% by mass, and more preferably 1% to 7% by mass, with respect to the total solid contents of the resist composition.

(H) Other Additives

The resist composition of the present invention can further contain a dye, a plasticizer, a light sensitizer, a light absorbent, an alkali-soluble resin, a dissolution inhibitor, a compound that promotes solubility in a developer (for example, a phenol compound with a molecular weight of 1,000 or less, an alicyclic or aliphatic compound having a carboxyl group), and the like, if desired.

Such a phenol compound having a molecular weight of 1,000 or less may be easily synthesized by those skilled in the art with reference to the method described in, for example, JP1992-122938A (JP-H04-122938A), JP1990-28531A (JP-H02-28531A), U.S. Pat. No. 4,916,210A, EP219294B, and the like.

Specific examples of the alicyclic compound or aliphatic compound having a carboxyl group include, but not limited to, a carboxylic acid derivative having a steroid structure such as a cholic acid, deoxycholic acid or lithocholic acid, an adamantane carboxylic acid derivative, adamantane dicarboxylic acid, cyclohexane carboxylic acid, and cyclohexane dicarboxylic acid.

[Composition (Topcoat Composition) for Forming Upper Layer Film]

Next, a composition (topcoat composition) for forming an upper layer film, for forming an upper layer film (topcoat) for use in the pattern forming method of the present invention will be described.

In a case of carrying out liquid immersion exposure in the pattern forming method of the present invention, by forming a topcoat, it is possible to expect effects of preventing an immersion liquid from being in direct contact with a resist film, suppressing the resist performance from being deteriorated by permeation of the immersion liquid into a resist film and elution of the resist film components into the immersion liquid, and further, preventing an exposure device lens from being contaminated by elution of the elution components into the immersion liquid.

The topcoat composition used in the pattern forming method of the present invention is preferably a composition including the resin (X) which will be described later, and a solvent, in order to uniformly form the composition on the resist film.

<Solvent>

In order to form a good pattern while not dissolving the resist film, it is preferable that the topcoat composition in the present invention contains a solvent in which the resist film is not dissolved, and it is more preferable that a solvent with components different from an organic developer is used.

Further, from the viewpoint of the prevention of elution into an immersion liquid, low solubility in an immersion liquid is preferred, and low solubility in water is more preferable. In the present specification, "having low solubility in an immersion liquid" means insolubility in an immersion liquid. Similarly, "having low solubility in water" means insolubility in water. Further, from the viewpoints of volatility and coatability, the boiling point of the solvent is preferably 90° C. to 200° C.

Having low solubility in an immersion liquid indicates that in an example of the solubility in water, when a topcoat composition is coated on a silicon wafer and dried to form a film, and then the film is immersed in pure water at 23° C. for 10 minutes, the decrease rate in the film thickness after drying is within 3% of the initial film thickness (typically 50 nm).

In the present invention, from the viewpoint of uniformly coating the topcoat, a solvent having a concentration of the solid content of 0.01% to 20% by mass, more preferably 0.1% to 15% by mass, and the most preferably 1% to 10% by mass is used.

The solvent that can be used is not particularly limited as long as it can dissolve the resin (X) which will be described later and does not dissolve the resist film, but suitable examples thereof include an alcohol-based solvent, a fluorine-based solvent and a hydrocarbon-based solvent, with a non-fluorinated alcohol-based solvent being more preferably used. Thus, the non-dissolving property for the resist film is further enhanced and when the topcoat composition is coated on the resist film, a topcoat can be more uniformly formed without dissolving the resist film.

From the viewpoint of coatability, the alcohol-based solvent is preferably a monohydric alcohol, and more preferably a monohydric alcohol having 4 to 8 carbon atoms. As the monohydric alcohol having 4 to 8 carbon atoms, a linear, branched, or cyclic alcohol may be used, but a linear or branched alcohol is preferable. As such an alcohol-based solvent, for example, alcohols such as 1-butanol, 2-butanol, 3-methyl-1-butanol, 4-methyl-1-pentanol, 4-methyl-2-pentanol, isobutyl alcohol, tert-butyl alcohol, 1-pentanol, 2-pentanol, 1-hexanol, 1-heptanol, 1-octanol, 2-hexanol, 2-heptanol, 2-octanol, 3-hexanol, 3-heptanol, 3-octanol, and 4-octanol; glycols such as ethylene glycol, propylene glycol, diethylene glycol, and triethylene glycol; glycol ethers such as ethylene glycol monomethyl ether, propylene glycol monomethyl ether, diethylene glycol monomethyl ether, triethylene glycol monoethyl ether, and methoxymethylbutanol; or the like can be used. Among those, alcohol and glycol ether are preferable, and 1-butanol, 1-hexanol, 1-pentanol, 3-methyl-1-butanol, 4-methyl-1-pentanol, 4-methyl-2-pentanol, and propylene glycol monomethyl ether are more preferable.

Examples of the fluorine-based solvent include 2,2,3,3,4,4-hexafluoro-1-butanol, 2,2,3,3,4,4,5,5-octafluoro-1-pentanol, 2,2,3,3,4,4,5,5,6,6-decafluoro-1-hexanol, 2,2,3,3,4,4-hexafluoro-1,5-pentanediol, 2,2,3,3,4,4,5,5-octafluoro-1,6-hexanediol, 2,2,3,3,4,4,5,5,6,6,7,7-dodecafluoro-1,8-octanediol, 2-fluoroanisole, 2,3-difluoroanisole, perfluorohexane, perfluoroheptane, perfluoro-2-pentanone, perfluoro-2-butyltetrahydrofuran, perfluorotetrahydrofuran, perfluorotributylamine, and perfluorotetrapentylamine. Among these, a fluorinated alcohol and a fluorinated hydrocarbon-based solvent can be suitably used.

Examples of the hydrocarbon-based solvent include aromatic hydrocarbon-based solvents such as toluene, xylene and anisole, and aliphatic hydrocarbon-based solvents such as n-heptane, n-nonane, n-octane, n-decane, 2-methylheptane, 3-methylheptane, 3,3-dimethylhexane, and 2,3,4-trimethylpentane.

These solvents are used singly or as a mixture of a plurality thereof.

In a case of mixing a solvent other than those recited above, the mixing ratio thereof is usually 0% to 30% by mass, preferably 0% to 20% by mass, and more preferably 0% to 10% by mass, with respect to the total amount of solvents in the topcoat composition. By mixing a solvent other than those recited above, the solubility for the resist film, the solubility of the resin in the topcoat composition, the elution characteristics from the resist film, or the like can be appropriately adjusted.

<Resin (X)>

The resin (X) in the topcoat composition is preferably a resin which is transparent for the exposure light source to be used since the light reaches the resist film through the topcoat upon exposure. In a case where the resin (X) is used for ArF liquid immersion exposure, it is preferable that the resin does not have an aromatic group in view of transparency to ArF light.

The resin (X) preferably has at least one of a "fluorine atom," a "silicon atom," or a "$CH_3$ partial structure which is contained in a side chain moiety of a resin," and more preferably has two or more kinds. The resin (X) is preferably a water-insoluble resin (hydrophobic resin).

In a case where the resin (X) contains a fluorine atom and/or a silicon atom, the fluorine atom and/or the silicon atom may be contained or substituted in the main chain or the side chain of the resin (X).

In a case where the resin (X) contains a fluorine atom, it is preferably a resin which contains an alkyl group having a fluorine atom, a cycloalkyl group having a fluorine atom, or an aryl group having a fluorine atom, as a partial structure having a fluorine atom.

The alkyl group having a fluorine atom (preferably having 1 to 10 carbon atoms, and more preferably having 1 to 4 carbon atoms) is a linear or branched alkyl group in which at least one hydrogen atom is substituted with a fluorine atom, and may further have another substituent.

The cycloalkyl group having a fluorine atom is a monocyclic or polycyclic cycloalkyl group in which at least one hydrogen atom is substituted with a fluorine atom, and they may further have another substituent.

The aryl group having a fluorine atom is an aryl group in which at least one hydrogen atom is substituted with a fluorine atom, such as a phenyl group and a naphthyl group, and they may further have another substituent.

Specific examples of the alkyl group having a fluorine atom, the cycloalkyl group having a fluorine atom, and the aryl group having a fluorine atom are shown below, but the present invention is not limited thereto.

(F2)

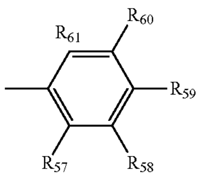

-continued (F3)

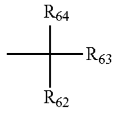

In General Formulae (F2) to (F3), $R_{57}$ to $R_{64}$ each independently represent a hydrogen atom, a fluorine atom, or an alkyl group, provided that at least one of $R_{57}$, . . . , or $R_{61}$ or of $R_{62}$, . . . , or $R_{64}$ is a fluorine atom or an alkyl group (preferably having 1 to 4 carbon atoms) in which at least one hydrogen atom is substituted for by a fluorine atom. It is preferable that all of $R_{57}$ to $R_{61}$ are a fluorine atom. Each of $R_{62}$ and $R_{63}$ is preferably an alkyl group (preferably having 1 to 4 carbon atoms) in which at least one hydrogen atom is substituted with a fluorine atom, and more preferably a perfluoroalkyl group having 1 to 4 carbon atoms. $R_{62}$ and $R_{63}$ may be linked to each other to form a ring.

Specific examples of the group represented by General Formula (F2) include a p-fluorophenyl group, a pentafluorophenyl group, and a 3,5-di(trifluoromethyl)phenyl group.

Specific examples of the group represented by General Formula (F3) include a trifluoroethyl group, a pentafluoropropyl group, a pentafluoroethyl group, a heptafluorobutyl group, a hexafluoroisopropyl group, a heptafluoroisopropyl group, a hexafluoro(2-methyl)isopropyl group, a nonafluorobutyl group, an octafluoroisobutyl group, a nonafluorohexyl group, a nonafluoro-t-butyl group, a perfluoroisopentyl group, a perfluorooctyl group, a perfluoro(trimethyl)hexyl group, a 2,2,3,3-tetrafluorocyclobutyl group, and a perfluorocyclohexyl group. A hexafluoroisopropyl group, a heptafluoroisopropyl group, a hexafluoro(2-methyl)isopropyl group, an octafluoroisobutyl group, a nonafluoro-t-butyl group, or a perfluoroisopentyl group is preferable, and a hexafluoroisopropyl group or a heptafluoroisopropyl group is more preferable.

In a case where the resin (X) has a silicon atom, it is preferably a resin having an alkylsilyl structure (preferably a trialkylsilyl group) or a cyclic siloxane structure as a partial structure having a silicon atom.

Specific examples of the alkylsilyl structure and cyclic siloxane structure include groups represented by the following General Formulae (CS-1) to (CS-3).

(CS-1)

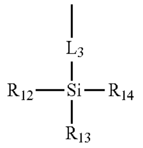

(CS-2)

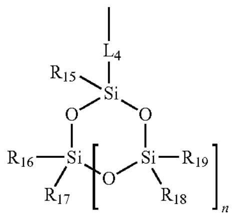

-continued (CS-3)

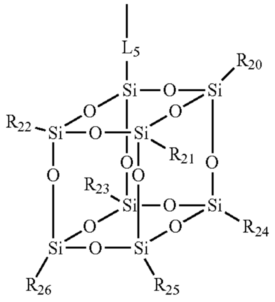

In General Formulae (CS-1) to (CS-3), $R_{12}$ to $R_{26}$ each independently represent a linear or branched alkyl group (preferably having 1 to 20 carbon atoms) or a cycloalkyl group (preferably having 3 to 20 carbon atoms).

$L_3$ to $L_5$ each represent a single bond or a divalent linking group. Examples of the divalent linking group include one member or a combination of two or more thereof selected form the group consisting of an alkylene group, a phenyl group, an ether group, a thioether group, a carbonyl group, an ester group, an amido group, a urethane group, and a urea group.

n represents an integer of 1 to 5.

Examples of the resin (X) include a resin having at least one repeating units selected from the group consisting of the repeating units represented by the following General Formulae (C-I) to (C-V).

(C-I)

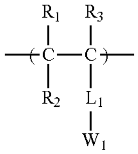

(C-II)

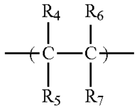

(C-III)

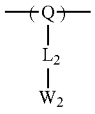

(C-IV)

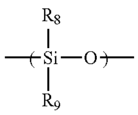

(C-V)

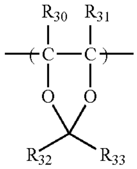

In General Formulae (C-I) to (C-V), $R_1$ to $R_3$ each represent a hydrogen atom, a fluorine atom, a linear or branched alkyl group having 1 to 4 carbon atoms, or a linear or branched fluorinated alkyl group having 1 to 4 carbon atoms.

$W_1$ and $W_2$ each independently represent an organic group having at least one of a fluorine atom or a silicon atom.

$R_4$ to $R_7$ each independently represent a hydrogen atom, a fluorine atom, a linear or branched alkyl group having 1 to 4 carbon atoms, or a linear or branched fluorinated alkyl group having 1 to 4 carbon atoms, provided that at least one of $R_4$, . . . , or $R_7$ represents a fluorine atom. $R_4$ and $R_5$, or $R_6$ and $R_7$ may be combined to form a ring.

$R_8$ represents a hydrogen atom or a linear or branched alkyl group having 1 to 4 carbon atoms.

$R_9$ represents a linear or branched alkyl group having 1 to 4 carbon atoms or a linear or branched fluorinated alkyl group having 1 to 4 carbon atoms.

$L_1$ and $L_2$ each independently represent a single bond or a divalent linking group, which are the same as $L_3$ to $L_5$.

Q represents a monocyclic or polycyclic aliphatic group. That is, it represents an atomic group containing two carbon atoms (C—C) bonded to each other for forming an alicyclic structure.

$R_{30}$ and $R_{31}$ each independently represent a hydrogen atom or a fluorine atom.

$R_{32}$ and $R_{33}$ each independently represent an alkyl group, a cycloalkyl group, a fluorinated alkyl group, or a fluorinated cycloalkyl group.

It is to be noted that the repeating unit represented by General Formula (C-V) has at least one fluorine atom in at least one of $R_{30}$, $R_{31}$, $R_{32}$, or $R_{33}$.

The resin (X) preferably has a repeating unit represented by General Formula (C-I), and more preferably a repeating unit represented by any of the following General Formulae (C-Ia) to (C-Id).

(C-Ia)

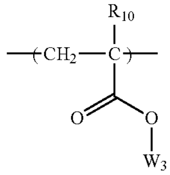

(C-Ib)

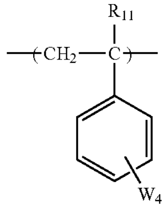

(C-Ic)

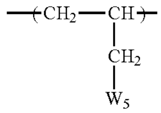

(C-Id)

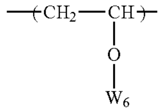

In General Formulae (C-Ia) to (C-Id), $R_{10}$ and $R_{11}$ each represents a hydrogen atom, a fluorine atom, a linear or branched alkyl group having 1 to 4 carbon atoms, or a linear or branched fluorinated alkyl group having 1 to 4 carbon atoms.

$W_3$ to $W_6$ are each an organic group having one or more groups of at least one of a fluorine atom or a silicon atom.

When $W_1$ to $W_6$ are each an organic group having a fluorine atom, they are each preferably a fluorinated, linear or branched alkyl group or cycloalkyl group having 1 to 20 carbon atoms, or a linear, branched, or cyclic fluorinated alkyl ether group having 1 to 20 carbon atoms.

Examples of the fluorinated alkyl group represented by each of $W_1$ to $W_6$ include a trifluoroethyl group, a pentafluoropropyl group, a hexafluoroisopropyl group, a hexafluoro(2-methyl)isopropyl group, a heptafluorobutyl group, a heptafluoroisopropyl group, an octafluoroisobutyl group, a nonafluorohexyl group, a nonafluoro-t-butyl group, a perfluoroisopentyl group, a perfluorooctyl group, and a perfluoro(trimethyl)hexyl group.

When $W_1$ to $W_6$ are each an organic group having a silicon atom, an alkylsilyl structure or a cyclic siloxane structure is preferable. Specific examples thereof include groups represented by General Formulae (CS-1) to (CS-3).

Specific examples of the repeating unit represented by General Formula (C-I) are shown below, but are not limited thereto. X represents a hydrogen atom, $—CH_3$, —F, or $—CF_3$.

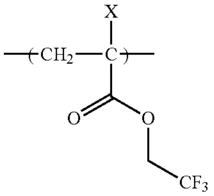
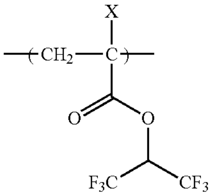
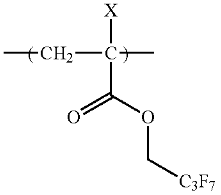
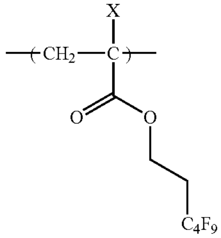
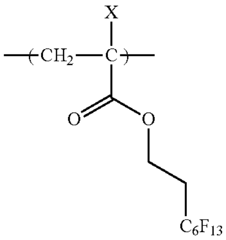
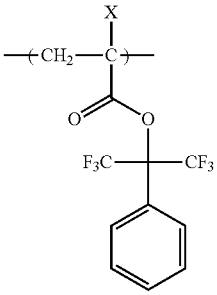
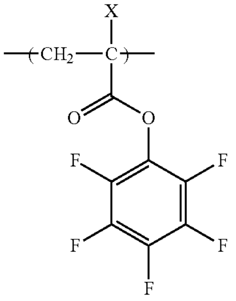
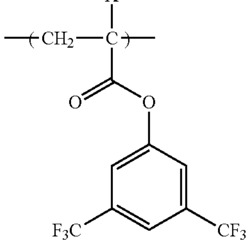

-continued

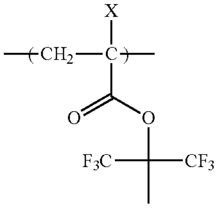
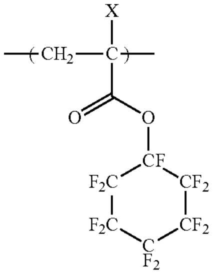
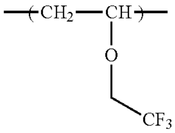
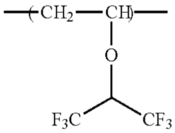
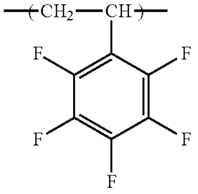
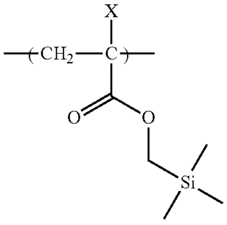
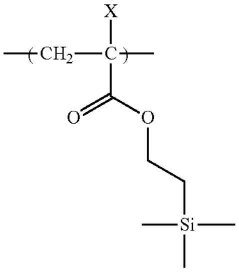
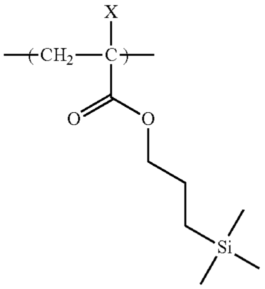
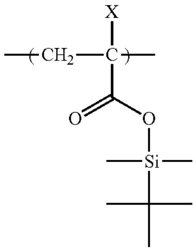
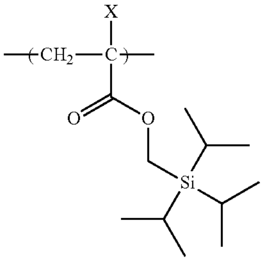
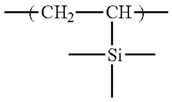
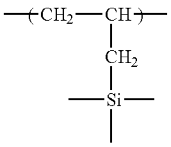
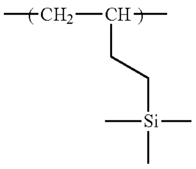

-continued

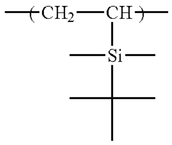

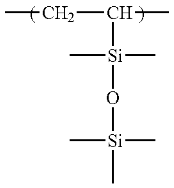

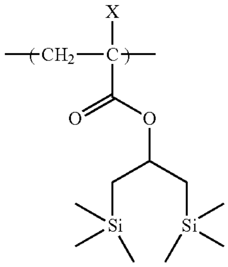

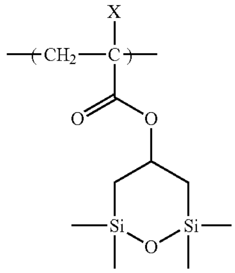

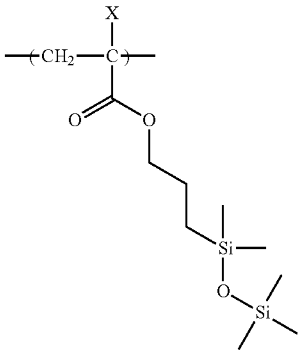

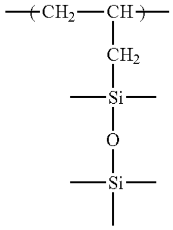

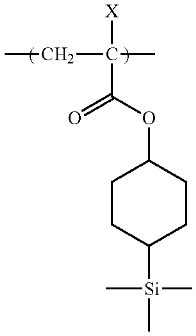

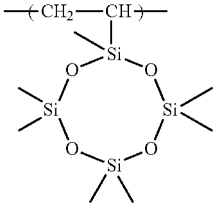

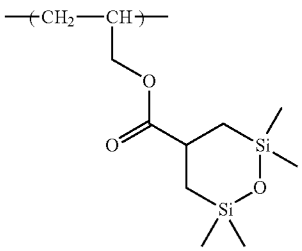

-continued

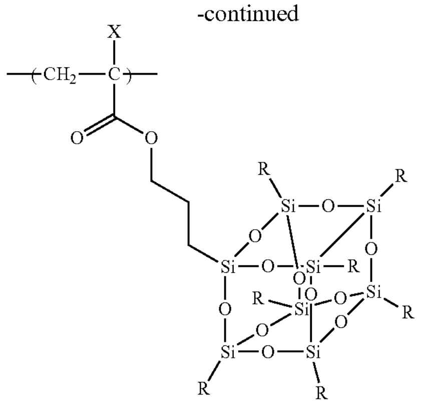

R = $CH_3$, $C_2H_5$, $C_3H_7$, $C_4H_9$

Furthermore, it is also preferable that the resin (X) contains a $CH_3$ partial structure in the side chain moiety, as described above.

Here, the $CH_3$ partial structure (hereinafter also simply referred to as a "side chain $CH_3$ partial structure") contained in the side chain moiety in the resin (X) includes a $CH_3$ partial structure contained in an ethyl group, a propyl group, and the like.

On the other hand, a methyl group bonded directly to the main chain of the resin (X) (for example, an α-methyl group in the repeating unit having a methacrylic acid structure) makes only a small contribution of uneven distribution to the surface of the resin (X) due to the effect of the main chain, and it is therefore not included in the $CH_3$ partial structure in the present invention.

More specifically, in a case where the resin (X) contains a repeating unit derived from a monomer having a polymerizable moiety with a carbon-carbon double bond, such as a repeating unit represented by the following General Formula (M), and in addition, $R_1$ to $R_{14}$ are $CH_3$ "themselves," such the $CH_3$ is not included in the $CH_3$ partial structure contained in the side chain moiety in the present invention.

On the other hand, a $CH_3$ partial structure which is present via a certain atom from a C—C main chain corresponds to the $CH_3$ partial structure in the present invention. For example, in a case where $R_{11}$ is an ethyl group ($CH_2CH_3$), the hydrophobic resin has "one" $CH_3$ partial structure in the present invention.

(M)

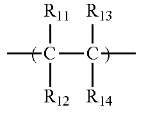

In General Formula (M), $R_{11}$ to $R_{14}$ each independently represent a side chain moiety.

Examples of $R_{11}$ to $R_{14}$ in the side chain moiety include a hydrogen atom and a monovalent organic group.

Examples of the monovalent organic group for $R_{11}$ to $R_{14}$ include an alkyl group, a cycloalkyl group, an aryl group, an alkyloxycarbonyl group, a cycloalkyloxycarbonyl group, an aryloxycarbonyl group, an alkylaminocarbonyl group, a cycloalkylaminocarbonyl group, and an arylaminocarbonyl group, each of which may further have a substituent.

The resin (X) is preferably a resin including a repeating unit having the $CH_3$ partial structure in the side chain moiety thereof, and more preferably has, as such a repeating unit, at least one repeating unit (x) of a repeating unit represented by the following General Formula (II) or a repeating unit represented by the following General Formula (III).

Hereinafter, the repeating unit represented by General Formula (II) will be described in detail.

(II)

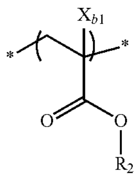

In General Formula (II), $X_{b1}$ represents a hydrogen atom, an alkyl group, a cyano group, or a halogen atom, and $R_2$ represents an organic group which has one or more $CH_3$ partial structures and is stable against an acid. Here, more specifically, the organic group which is stable against an acid is preferably an organic group not having a "group that decomposes by the action of an acid to generate a polar group" described in the resin (A).

The alkyl group of $X_{b1}$ is preferably an alkyl group having 1 to 4 carbon atoms, and examples thereof include a methyl group, an ethyl group, a propyl group, a hydroxymethyl group, and a trifluoromethyl group, with the methyl group being preferable.

$X_{b1}$ is preferably a hydrogen atom or a methyl group.

Examples of $R_2$ include an alkyl group, a cycloalkyl group, an alkenyl group, a cycloalkenyl group, an aryl group, and an aralkyl group, each of which has one or more $CH_3$ partial structures. The cycloalkyl group, the alkenyl group, the cycloalkenyl group, the aryl group, and the aralkyl group may further have an alkyl group as a substituent.

$R_2$ is preferably an alkyl group or an alkyl-substituted cycloalkyl group, which has one or more $CH_3$ partial structures.

The number of the $CH_3$ partial structures contained in the organic group which has one or more $CH_3$ partial structures and is stable against an acid as $R_2$ is preferably from 2 to 10, and more preferably from 2 to 8.

The alkyl group having one or more $CH_3$ partial structures in $R_2$ is preferably a branched alkyl group having 3 to 20 carbon atoms. Specific preferred examples of the alkyl group include an isopropyl group, an isobutyl group, a 3-pentyl group, a 2-methyl-3-butyl group, a 3-hexyl group, a 2-methyl-3-pentyl group, a 3-methyl-4-hexyl group, a 3,5-dimethyl-4-pentyl group, an isooctyl group, a 2,4,4-trimethylpentyl group, a 2-ethylhexyl group, a 2,6-dimethylheptyl group, a 1,5-dimethyl-3-heptyl group, and a 2,3,5,7-tetramethyl-4-heptyl group, and the alkyl group is more preferably an isobutyl group, a t-butyl group, a 2-methyl-3-butyl group, a 2-methyl-3-pentyl group, a 3-methyl-4-hexyl group, a 3,5-dimethyl-4-pentyl group, a 2,4,4-trimethylpentyl group, a 2-ethylhexyl group, a 2,6-dimethylheptyl group, a 1,5-dimethyl-3-heptyl group, or a 2,3,5,7-tetramethyl-4-heptyl group.

The cycloalkyl group having one or more $CH_3$ partial structures in $R_2$ may be monocyclic or polycyclic. Specific examples thereof include groups having a monocyclo, bicyclo, tricyclo, or tetracyclo structure having 5 or more carbon atoms. The number of carbon atoms is preferably 6 to 30, and particularly preferably 7 to 25. Preferred examples of the cycloalkyl group include an adamantyl group, a noradamantyl group, a decalin residue, a tricyclodecanyl group, a tetracyclododecanyl group, a norbornyl group, cedrol group, a cyclopentyl group, a cyclohexyl group, a cycloheptyl group, a cyclooctyl group, a cyclodecanyl group, and a cyclododecanyl group, and the cycloalkyl group is more preferably an adamantyl group, a norbornyl group, a cyclohexyl group, a cyclopentyl group, a tetracyclododecanyl group, or a tricyclodecanyl group, and even more preferably a norbornyl group, a cyclopentyl group, or a cyclohexyl group.

The alkenyl group having one or more $CH_3$ partial structures in $R_2$ is preferably a linear or branched alkenyl group having 1 to 20 carbon atoms, and more preferably a branched alkenyl group.

The aryl group having one or more $CH_3$ partial structures in $R_2$ is preferably an aryl group having 6 to 20 carbon atoms, and examples thereof include a phenyl group and a naphthyl group, and the aryl group is preferably a phenyl group.

The aralkyl group having one or more $CH_3$ partial structures in $R_2$ is preferably an aralkyl group having 7 to 12 carbon atoms, and examples thereof include a benzyl group, a phenethyl group, and a naphthylmethyl group.

Specific examples of the hydrocarbon group having two or more $CH_3$ partial structures in $R_2$ include an isopropyl group, an isobutyl group, a t-butyl group, a 3-pentyl group, a 2-methyl-3-butyl group, a 3-hexyl group, a 2,3-dimethyl-2-butyl group, a 2-methyl-3-pentyl group, a 3-methyl-4-hexyl group, a 3,5-dimethyl-4-pentyl group, an isooctyl group, a 2,4,4-trimethylpentyl group, a 2-ethylhexyl group, a 2,6-dimethylheptyl group, a 1,5-dimethyl-3-heptyl group, a 2,3,5,7-tetramethyl-4-heptyl group, a 3,5-dimethylcyclohexyl group, a 4-isopropylcyclohexyl group, a 4-t-butylcyclohexyl group, and an isobornyl group. The hydrocarbon structure is more preferably an isobutyl group, a t-butyl group, a 2-methyl-3-butyl group, a 2,3-dimethyl-2-butyl group, a 2-methyl-3-pentyl group, a 3-methyl-4-hexyl group, a 3,5-dimethyl-4-pentyl group, a 2,4,4-trimethylpentyl group, a 2-ethylhexyl group, a 2,6-dimethylheptyl group, a 1,5-dimethyl-3-heptyl group, a 2,3,5,7-tetramethyl-4-heptyl group, a 3,5-dimethylcyclohexyl group, a 3,5-ditert-butylcyclohexyl group, a 4-isopropylcyclohexyl group, a 4-t-butylcyclohexyl group, or an isobornyl group.

Specific preferred examples of the repeating unit represented by General Formula (II) are shown below, but the present invention is not limited thereto.

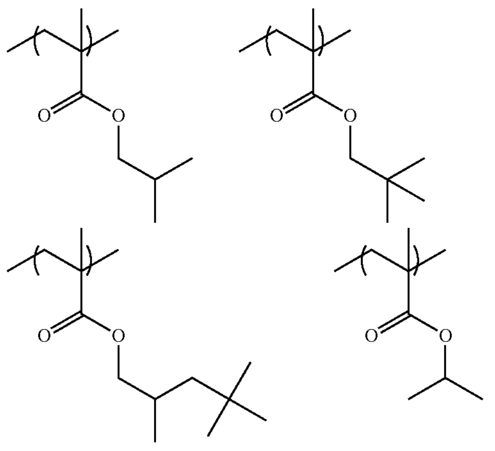

-continued
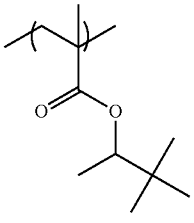
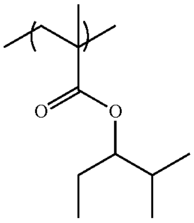
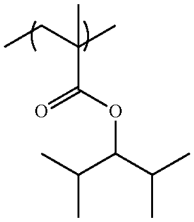
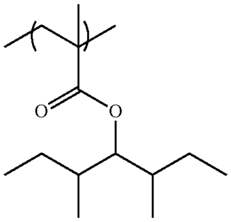
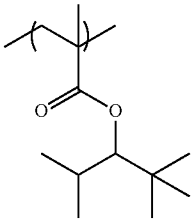
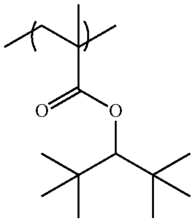
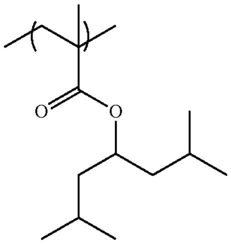
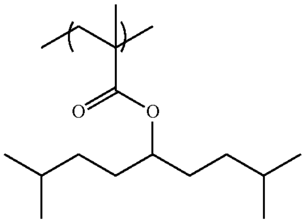
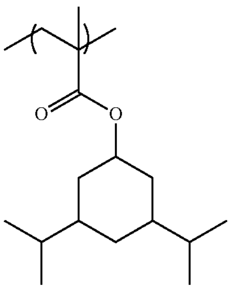
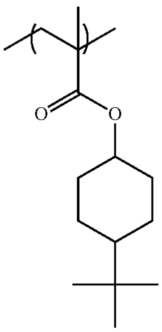
-continued
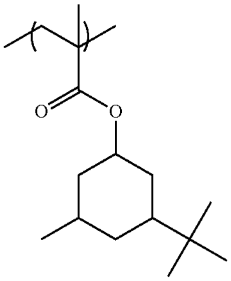
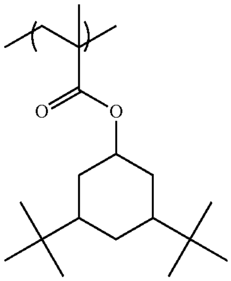
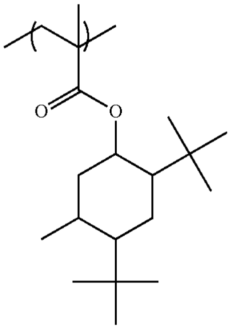
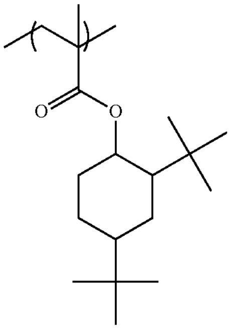
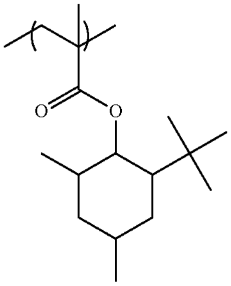
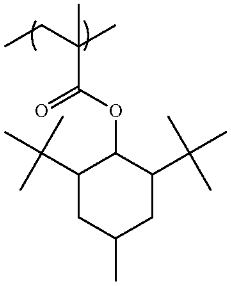
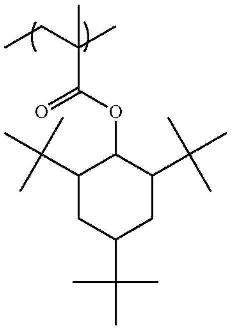
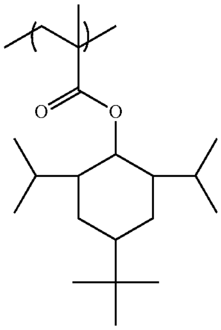
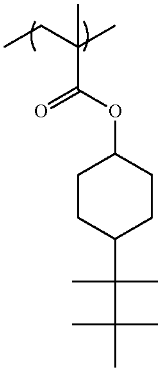
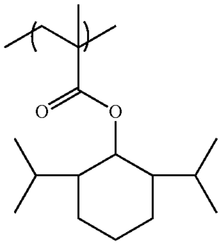

-continued

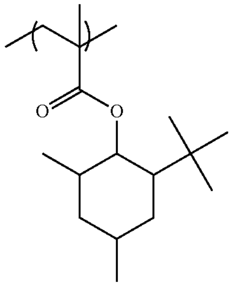

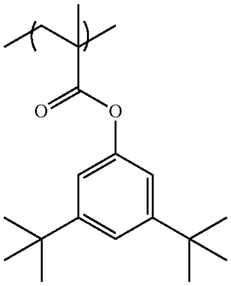

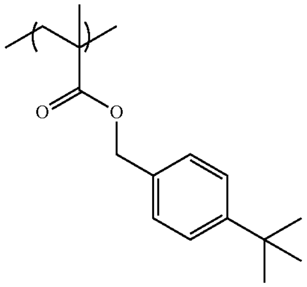

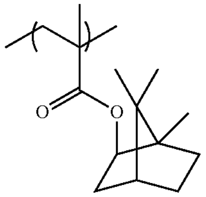

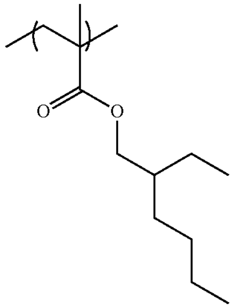

The repeating unit represented by General Formula (II) is preferably a repeating unit which is stable against an acid (non-acid-decomposable), and specifically, it is preferably a repeating unit not having a group that decomposes by the action of an acid to generate a polar group.

Hereinafter, the repeating unit represented by General Formula (III) will be described in detail.

(III)

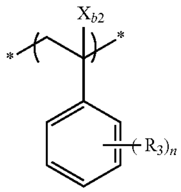

In General Formula (III), $X_{b2}$ represents a hydrogen atom, an alkyl group, a cyano group, or a halogen atom, $R_3$ represents an organic group having one or more $CH_3$ partial structures, which is stable against an acid, and n represents an integer of 1 to 5.

The alkyl group of $X_{b2}$ is preferably an alkyl group having 1 to 4 carbon atoms, and examples thereof include a methyl group, an ethyl group, a propyl group, a hydroxymethyl group, and a trifluoromethyl group, but a hydrogen atom is preferable.

$X_{b2}$ is preferably a hydrogen atom.

Since $R_3$ is an organic group stable against an acid, more specifically, $R_3$ is preferably an organic group which does not have the "group that decomposes by the action of an acid to generate a polar group" described in the resin (A).

Examples of $R_3$ include an alkyl group having one or more $CH_3$ partial structures. The number of the $CH_3$ partial structures contained in the organic group which has one or more $CH_3$ partial structures and is stable against an acid as $R_3$ is preferably from 1 to 10, more preferably from 1 to 8, and still more preferably from 1 to 4.

The alkyl group having one or more $CH_3$ partial structures in $R_3$ is preferably a branched alkyl group having 3 to 20 carbon atoms. Preferred examples of the alkyl group include an isopropyl group, an isobutyl group, a 3-pentyl group, a 2-methyl-3-butyl group, a 3-hexyl group, a 2-methyl-3-pentyl group, a 3-methyl-4-hexyl group, a 3,5-dimethyl-4-pentyl group, an isooctyl group, a 2,4,4-trimethylpentyl group, a 2-ethylhexyl group, a 2,6-dimethylheptyl group, a 1,5-dimethyl-3-heptyl group, and a 2,3,5,7-tetramethyl-4-heptyl group. The alkyl group is more preferably an isobutyl group, a t-butyl group, a 2-methyl-3-butyl group, a 2-methyl-3-pentyl group, a 3-methyl-4-hexyl group, a 3,5-dimethyl-4-pentyl group, a 2,4,4-trimethylpentyl group, a 2-ethylhexyl group, a 2,6-dimethylheptyl group, a 1,5-dimethyl-3-heptyl group, or a 2,3,5,7-tetramethyl-4-heptyl group.

Specific examples of the alkyl group having two or more $CH_3$ partial structures in $R_3$ include an isopropyl group, an isobutyl group, a t-butyl group, a 3-pentyl group, a 2,3-dimethylbutyl group, a 2-methyl-3-butyl group, a 3-hexyl group, a 2-methyl-3-pentyl group, a 3-methyl-4-hexyl group, a 3,5-dimethyl-4-pentyl group, an isooctyl group, a 2,4,4-trimethylpentyl group, a 2-ethylhexyl group, a 2,6-dimethylheptyl group, a 1,5-dimethyl-3-heptyl group, and a 2,3,5,7-tetramethyl-4-heptyl group. The alkyl group is more preferably one having 5 to 20 carbon atoms, and is more preferably an isopropyl group, a t-butyl group, a 2-methyl-3-butyl group, a 2-methyl-3-pentyl group, a 3-methyl-4-hexyl group, a 3,5-dimethyl-4-pentyl group, a 2,4,4-trimethylpentyl group, a 2-ethylhexyl group, a 2,6-dimethylheptyl group, a 1,5-dimethyl-3-heptyl group, a 2,3,5,7-tetramethyl-4-heptyl group, or a 2,6-dimethylheptyl group.

n represents an integer of 1 to 5, preferably an integer of 1 to 3, and more preferably 1 or 2.

Specific preferred examples of the repeating unit represented by General Formula (III) are shown below, but the present invention is not limited thereto.

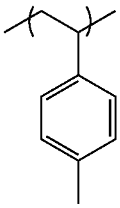

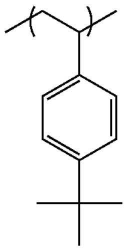

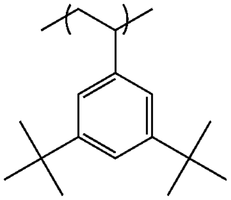

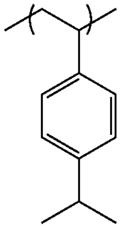

-continued

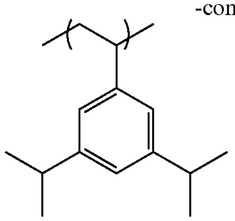

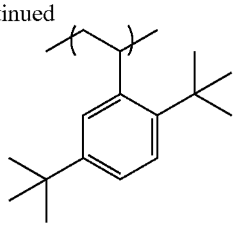

The repeating unit represented by General Formula (III) is preferably a repeating unit which is stable against an acid (non-acid-decomposable), and specifically, it is preferably a repeating unit which does not have a group that decomposes by the action of an acid to generate a polar group.

In a case where the resin (X) contains a $CH_3$ partial structure in the side chain moiety thereof, and in particular, it has neither a fluorine atom nor a silicon atom, the content of at least one repeating unit (x) of the repeating unit represented by General Formula (II) or the repeating unit represented by General Formula (III) is preferably 90% by mole or more, and more preferably 95% by mole or more, with respect to all the repeating units of the resin (X).

In order to adjust the solubility in an organic developer, the resin (X) may have a repeating unit represented by the following General Formula (Ia).

(Ia)

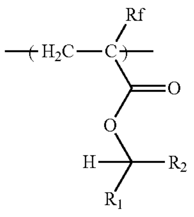

In General Formula (Ia),

Rf represents a fluorine atom or an alkyl group in which at least one hydrogen atom is substituted with a fluorine atom.

$R_1$ represents an alkyl group.

$R_2$ represents a hydrogen atom or an alkyl group.

In General Formula (Ia), the alkyl group in which at least one hydrogen atom is substituted with a fluorine atom among Rf's is preferably one having 1 to 3 carbon atoms, and more preferably a trifluoromethyl group.

The alkyl group of $R_1$ is preferably a linear or branched alkyl group having 3 to 10 carbon atoms, and more preferably a branched alkyl group having 3 to 10 carbon atoms.

$R_2$ is preferably a linear or branched alkyl group having 1 to 10 carbon atoms, and more preferably a linear or branched alkyl group having 3 to 10 carbon atoms.

Specific examples of the repeating unit represented by General Formula (Ia) are shown below, but the present invention is not limited thereto.

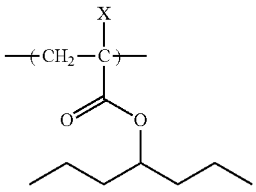

-continued

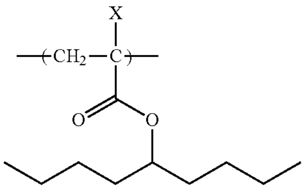

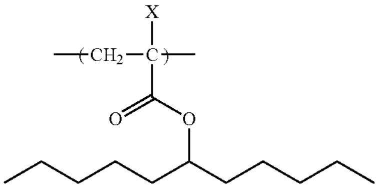

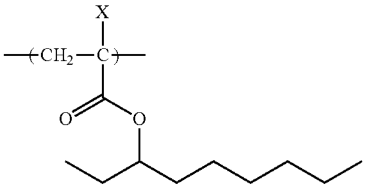

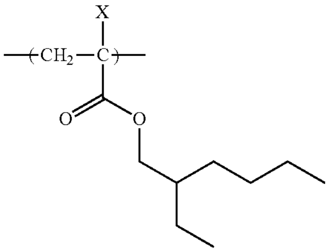

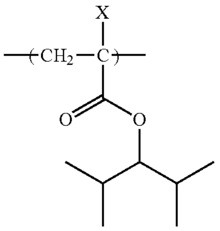

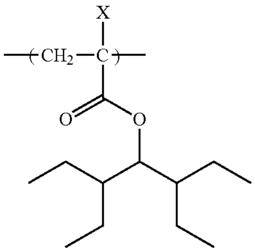

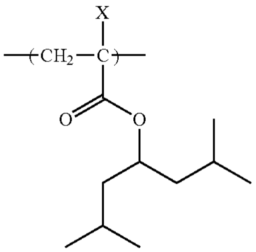

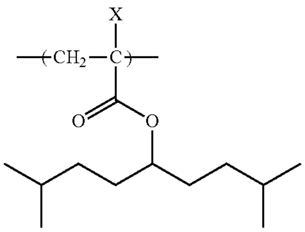

-continued

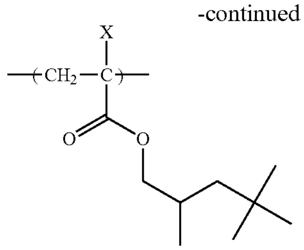

X = F or $CF_3$

The resin (X) may further have a repeating unit represented by the following General Formula (III).

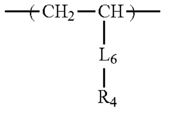

(III)

In General Formula (III), $R_4$ represents an alkyl group, a cycloalkyl group, an alkenyl group, a cycloalkenyl group, a trialkylsilyl group, or a group having a cyclic siloxane structure.

$L_6$ represents a single bond or a divalent linking group.

In General Formula (III), the alkyl group of $R_4$ is preferably a linear or branched alkyl group having 3 to 20 carbon atoms.

The cycloalkyl group is preferably a cycloalkyl group having 3 to 20 carbon atoms.

The alkenyl group is preferably an alkenyl group having 3 to 20 carbon atoms.

The cycloalkenyl group is preferably a cycloalkenyl group having 3 to 20 carbon atoms.

The trialkylsilyl group is preferably a trialkylsilyl group having 3 to 20 carbon atoms.

The group having a cyclic siloxane structure is preferably a group containing a cyclic siloxane structure having 3 to 20 carbon atoms.

The divalent linking group of $L_6$ is preferably an alkylene group (preferably having 1 to 5 carbon atoms) or an oxy group.

The resin (X) may have a lactone group, an ester group, an acid anhydride, or the same group as the acid-decomposable group in the resin (A).

The resin (X) may further have a repeating unit represented by the following General Formula (VIII).

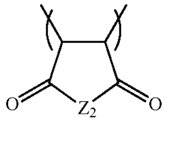

(VIII)

The resin (X) preferably contains a repeating unit (d) derived from a monomer having an alkali-soluble group. Thus, it is possible to control solubility in an immersion liquid and the solubility in a coating solvent. Examples of the alkali-soluble group include a phenolic hydroxyl group, a carboxylic acid group, a fluorinated alcohol group, a sulfonic acid group, a sulfonamido group, a sulfonylimido group, an (alkylsulfonyl)(alkylcarbonyl)methylene group, an (alkylsulfonyl)(alkylcarbonyl)imido group, a bis(alkylcarbonyl)methylene group, a bis(alkylcarbonyl)imido group, a bis(alkylsulfonyl)methylene group, a bis(alkylsulfonyl)imido group, a tris(alkylcarbonyl)methylene group, and a group having a tris(alkylsulfonyl)methylene group.

As the monomer having an alkali-soluble group, a monomer having an acid dissociation constant pKa of 4 or more, is preferable, a monomer having a pKa of 4 to 13 is more preferable, and a monomer having a pKa of 8 to 13 is the most preferable. By incorporation of a monomer having a pKa of 4 or more, swelling upon development of a negative tone and a positive tone is suppressed, and thus, not only good developability for an organic developer but also good developability in a case of using an alkali developer are obtained.

The acid dissociation constant pKa is described in Chemical Handbook (II) (Revised $4^{th}$ Edition, 1993, compiled by the Chemical Society of Japan, Maruzen Co., Ltd.), and the value of pKa in of the monomer containing an alkali-soluble group can be measured by, for example, using an infinite-dilution solvent at 25° C.

The monomer having a pKa of 4 or more is not particularly limited, and examples thereof include a monomer containing an acid group (an alkali-soluble group) such as a phenolic hydroxyl group, a sulfonamido group, $—COCH_2CO—$, a fluoroalcohol group, and a carboxylic acid group. A monomer containing a fluoroalcohol group is particularly preferable. The fluoroalcohol group is a fluoroalkyl group substituted with at least one hydroxyl group, preferably having 1 to 10 carbon atoms, and more preferably 1 to 5 carbon atoms. Specific examples of the fluoroalcohol group include $—CF_2OH$, $—CH_2CF_2OH$, $—CH_2CF_2CF_2OH$, $—C(CF_3)_2OH$, $—CF_2CF(CF_3)OH$, and $—CH_2C(CF_3)_2OH$. As a fluoroalcohol group, a hexafluoroisopropanol group is particularly preferable.

The total amount of the repeating unit derived from a monomer having an alkali-soluble group in the resin (X) is preferably 0% to 90% by mole, more preferably 0% to 80% by mole, and still more preferably 0% to 70% by mole, with respect to all the repeating units constituting the resin (X).

The monomer having an alkali-soluble group may contain only one or two or more acid groups. The repeating unit derived from the monomer preferably has 2 or more acid groups, more preferably 2 to 5 acid groups, and particularly preferably 2 or 3 acid groups, per one repeating unit.

Specific examples of the repeating unit derived from a monomer having an alkali-soluble group include, but not limited to, those described in paragraphs [0278] to [0287] of JP2008-309878A.

In one of preferred aspects, the resin (X) may any one resin selected from (X-1) to (X-8) described in paragraph [0288] of JP2008-309878A as a preferred aspect.

It is preferable that the resin (X) is solid at room temperature (25° C.). Further, the glass transition temperature (Tg) thereof is preferably 50° C. to 200° C., and more preferably 80° C. to 160° C.

The resin being solid at 25° C. means that the melting point is 25° C. or higher. The glass transition temperature (Tg) can be measured by a Differential Scanning Calorimetry. For example, it can be determined by after heating a sample and then cooling, analyzing the change in the specific volume when the sample is heated again at 5° C./min.

It is preferable that the resin (X) is insoluble in an immersion liquid (preferably water) and is soluble in an organic developer. From the viewpoint of the possibility of release by development using an alkali developer, it is preferable that the resin (X) is also soluble in an alkali developer.

In a case where the resin (X) has silicon atoms, the content of the silicon atoms is preferably 2% to 50% by mass, and more preferably 2% to 30% by mass, with respect to the molecular weight of the resin (X). Further, the amount of the repeating units containing silicon atoms is preferably 10% to 100% by mass, and more preferably 20% to 100% by mass, in the resin (X).

In a case where the resin (X) contains fluorine atoms, the content of fluorine atoms is preferably 5% to 80% by mass, and more preferably 10% to 80% by mass, with respect to the molecular weight of the resin (X). Further, the content of the repeating units containing fluorine atoms is preferably 10% to 100% by mass, and more preferably 30% to 100% by mass, in the resin (X).

On the other hand, particularly in a case where the resin (X) includes a $CH_3$ partial structure in the side chain moiety, an aspect in which the resin (X) contains substantially neither a fluorine atom nor a silicon atom is also preferable, and in this case, specifically, the content of the repeating unit having a fluorine atom or a silicon atom is preferably 10% by mole or less, more preferably 5% by mole or less, still more preferably 3% by mole or less, particularly preferably 1% by mole or less, and ideally 0% by mole, that is, not containing a fluorine atom and a silicon atom, with respect to all the repeating units in the resin (X).

Furthermore, the resin (X) preferably consists of substantially only a repeating unit composed of only atoms selected from a carbon atom, an oxygen atom, a hydrogen atom, a nitrogen atom, and a sulfur atom. More specifically, the repeating unit composed of only atoms selected from a carbon atom, an oxygen atom, a hydrogen atom, a nitrogen atom, and a sulfur atom preferably accounts for 95% by mole or more, more preferably 97% by mole or more, still more preferably 99% by mole or more, and ideally 100% by mole, with respect to all the repeating units in the resin (X).

The weight-average molecular weight of the resin (X) is preferably 1,000 to 100,000, more preferably 1,000 to 50,000, still more preferably 2,000 to 15,000, and particularly preferably 3,000 to 15,000, in terms of standard polystyrene.

In the resin (X), it is of course preferable that the content of impurities such as a metal is small, but the content of residual monomers is also preferably 0% to 10% by mass, more preferably 0% to 5% by mass, and still more preferably 0% to 1% by mass, from the viewpoint of reduction in elution from a topcoat to an immersion liquid. Further, the molecular weight distribution (Mw/Mn, also referred to as dispersity) is preferably 1 to 5, more preferably in a range of 1 to 3, and still more preferably in a range of 1 to 1.5.

As the resin (X), various commercially products may be used, or the resin may be synthesized by a conventional method (for example, radical polymerization). Examples of the general synthesis method include a batch polymerization method of dissolving monomer species and an initiator in a solvent and heating the solution, thereby carrying out the polymerization, and a dropwise-addition polymerization method of adding dropwise a solution containing monomer species and an initiator to a heated solvent for 1 to 10 hours, with the dropwise-addition polymerization method being preferable. Examples of the reaction solvent include ethers such as tetrahydrofuran, 1,4-dioxane, and diisopropyl ether; ketones such as methyl ethyl ketone and methyl isobutyl ketone; ester solvents such as ethyl acetate, amide solvents such as dimethyl formamide and dimethyl acetamide; and solvents which dissolve the resist composition of the present invention, such as propylene glycol monomethyl ether acetate, propylene glycol monomethyl ether, and cyclohexanone.

It is preferable that the polymerization reaction is carried out in an inert gas atmosphere such as nitrogen and argon. As the polymerization initiator, commercially available radical initiators (azo-based initiators, peroxides, or the like) are used to initiate the polymerization. As the radical initiator, an azo-based initiator is preferable, and the azo-based initiator having an ester group, a cyano group, or a carboxyl group is preferable. Preferable examples of the initiators include azobisisobutyronitrile, azobisdimethylvaleronitrile, and dimethyl 2,2'-azobis(2-methyl propionate). If necessary, a chain transfer agent can also be used. The concentration of the reactant is usually 5% to 50% by mass, preferably 20% to 50% by mass, and more preferably 30% to 50% by mass. The reaction temperature is usually 10° C. to 150° C., preferably 30° C. to 120° C., and more preferably 60° C. to 100° C.

After the completion of the reaction, cooling is carried out to room temperature, and purification is carried out. A usual method such as a liquid-liquid extraction method in which a residual monomer or an oligomer component is removed by washing with water or combining suitable solvents, a purification method in a solution state such as ultrafiltration which extracts and removes only substances having a specific molecular weight or less, a re-precipitation method in which a residual monomer or the like is removed by adding a resin solution dropwise to a poor solvent to coagulate the resin in the poor solvent, or a purification method in a solid state in which filtered resin slurry is cleaned with a poor solvent can be applied to the purification. For example, by bringing into contact with a solvent (poor solvent), which does poorly dissolve or does not dissolve the resin, corresponding to 10 times or less the volume amount of the reaction solution, or preferably 5 times to 10 times the volume amount of the reaction solution, the resin is solidified and precipitated.

The solvent to be used in the precipitation or reprecipitation from the polymer solution (precipitation or reprecipitation solvent) may be an arbitrary one so long as it is a poor solvent to the polymer. It may be appropriately selected from, for example, a hydrocarbon (for example, an aliphatic hydrocarbon such as pentane, hexane, heptane, and octane; an alicyclic hydrocarbon such as cyclohexane and methylcyclohexane; an aromatic hydrocarbon such as benzene, toluene, and xylene), a halogenated hydrocarbon (for example, a halogenated aliphatic hydrocarbon such as methylene chloride, chloroform, and carbon tetrachloride; a halogenated aromatic hydrocarbon such as chlorobenzene and dichlorobenzene), a nitro compound (for example, nitromethane and nitroethane), a nitrile (for example, acetonitrile and benzonitrile), an ether (for example, a chain ether such as diethyl ether, diisopropyl ether, and dimethoxyethane; and a cyclic ether such as tetrahydrofuran and dioxane), a ketone (for example, acetone, methyl ethyl ketone, and diisobutyl ketone), an ester (for example, ethyl acetate, butyl acetate), a carbonate (for example, dimethyl carbonate, diethyl carbonate, ethylene carbonate, and propylene carbonate), an alcohol (for example, methanol, ethanol, propanol, isopropyl alcohol, and butanol), a carboxylic acid (for example, acetic acid), water, and a mixed solvent containing the same. Among these, the precipitation or reprecipitation solvent is preferably a solvent containing at least an alcohol (particularly methanol or the like) or water. In such a solvent containing at least a hydrocarbon, the ratio of the alcohol (particularly, methanol or the like) to other solvents (for example, an ester such as ethyl acetate, and ethers such as tetrahydrofuran) is approximately, for example, the former/the latter (volume ratio; 25° C.) ranging from 10/90 to 99/1, preferably the former/the latter (volume ratio; 25° C.) ranging from 30/70 to 98/2, more preferably the former/the latter (volume ratio; 25° C.) ranging from 50/50 to 97/3.

The amount of the precipitation or reprecipitation solvent used may be appropriately selected by taking into consideration the efficiency, yield, or the like. In general, it is used in an amount of from 100 to 10,000 parts by mass, preferably from 200 to 2,000 parts by mass and more preferably from 300 to 1,000 parts by mass, with respect to 100 parts by mass of the polymer solution.

In the step of feeding the polymer solution into a precipitation or reprecipitation solvent (poor solvent), the nozzle pore diameter is preferably 4 mmϕ or less (for example, 0.2 to 4 mmϕ) and the feeding rate (dropwise addition rate) of the polymer solution into the poor solvent is, for example, in terms of a linear velocity, 0.1 to 10 m/sec, and preferably approximately 0.3 to 5 m/sec.

The precipitation or reprecipitation procedure is preferably carried out under stirring. Examples of the stirring blade which can be used for the stirring include a disc turbine, a fan turbine (including a paddle), a curved vane turbine, an arrow feather turbine, a Pfaudler type, a bull margin type, an angled vane fan turbine, a propeller, a multistage type, an anchor type (or horseshoe type), a gate type, a double ribbon type, and a screw type. It is preferable that the stirring is further carried out for 10 minutes or more, in particular, 20 minutes or more, after the completion of feeding of the polymer solution. If the stirring time is too short, the monomer content in the polymer particles may not be sufficiently reduced in some cases. Further, the mixing and stirring of the polymer solution and the poor solvent may also be carried out by using a line mixer instead of the stirring blade.

Although the temperature at the precipitation or reprecipitation may be appropriately selected by taking into consideration the efficiency or performance, the temperature is usually approximately 0° C. to 50° C., preferably in the vicinity of room temperature (for example, from approximately 20° C. to 35° C.). The precipitation or reprecipitation procedure may be carried out by using a commonly employed mixing vessel such as stirring tank according to a known method such as batch system and continuous system.

The precipitated or reprecipitated particulate polymer is usually subjected to commonly employed solid-liquid separation such as filtration and centrifugation and then dried before using. The filtration is carried out by using a solvent-resistant filter material preferably under elevated pressure. The drying is carried out under atmospheric pressure or reduced pressure (preferably under reduced pressure) at a temperature of approximately 30° C. to 100° C., and preferably approximately 30° C. to 50° C.

Furthermore, after the resin is once precipitated and separated, it may be redissolved in a solvent and then brought into contact with a solvent in which the resin is sparingly soluble or insoluble.

That is, the method may include, after the completion of a radical polymerization reaction, precipitating a resin by bringing the polymer into contact with a solvent in which the polymer is sparingly soluble or insoluble (step a), separating the resin from the solution (step b), dissolving the resin in a solvent again to prepare a resin solution A (step c), then precipitating a resin solid by bringing the resin solution A into contact with a solvent in which the resin is sparingly soluble or insoluble and which is in a volume amount of less than 10 times (preferably a volume amount of 5 times or less) the resin solution A (step d), and separating the precipitated resin (step e).

As the solvent used for the preparation of the resin solution A, the same solvent as the solvent for dissolving the monomer at the polymerization reaction may be used, and the solvent may be the same as or different from each other from the solvent used for the polymerization reaction.

The resin (X) may be used singly or in combination of a plurality thereof.

The blend amount of the resin (X) in the topcoat composition is preferably 50% to 99.9% by mass, and more preferably 60% to 99.0% by mass, with respect to the total solid content.

<Basic Compound and Base Generator>

The topcoat composition preferably further includes at least one of a basic compound or a base generator (hereinafter also collectively referred to as "additives" in some cases). By making these additives act as a quencher that traps an acid generated from a photoacid generator, the effects of the present invention are more excellent.

(Basic Compound)

As the basic compound which can be contained in the topcoat composition, an organic basic compound is preferable, and a nitrogen-containing basic compound is more preferable. For example, those described as a basic compound which may be contained in the resist composition of the present invention can be used, and specific examples thereof include the compounds having the structures represented by Formulae (A) to (E) as described above.

In addition, for example, the compounds which are classified into (1) to (7) below can be used.

(1) Compound Represented by General Formula (BS-1)

(BS-1)

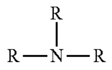

In General Formula (BS-1),

R's each independently represent a hydrogen atom or an organic group. Here, at least one of three Rs is an organic group. This organic group is a linear or branched alkyl group, a monocyclic or polycyclic cycloalkyl group, an aryl group, or an aralkyl group.

The number of carbon atoms in the alkyl group as R is not particularly limited, but is normally 1 to 20, and preferably 1 to 12.

The number of carbon atoms in the cycloalkyl group as R is not particularly limited, but is normally 3 to 20, and preferably 5 to 15.

The number of carbon atoms in the aryl group as R is not particularly limited, but is normally 6 to 20, and preferably 6 to 10. Specific examples thereof include a phenyl group and a naphthyl group.

The number of carbon atoms in the aralkyl group as R is not particularly limited, but is normally 7 to 20, and preferably 7 to 11. Specifically, examples thereof include a benzyl group.

A hydrogen atom in the alkyl group, the cycloalkyl group, the aryl group, or the aralkyl group as R may be substituted with a substituent. Examples of the substituent include an alkyl group, a cycloalkyl group, an aryl group, an aralkyl group, a hydroxy group, a carboxy group, an alkoxy group, an aryloxy group, an alkylcarbonyloxy group, and an alkyloxycarbonyl group.

Furthermore, it is preferable that at least two of R's in the compound represented by General Formula (BS-1) are organic groups.

Specific examples of the compound represented by General Formula (BS-1) include tri-n-butylamine, tri-isopropylamine, tri-n-pentylamine, tri-n-octylamine, tri-n-decylamine, triisodecylamine, dicyclohexylmethylamine, tetradecylamine, pentadecylamine, hexadecylamine, octadecylamine, didecylamine, methyl octadecylamine, dimethylundecylamine, N,N-dimethyldodecylamine, methyl dioctadecylamine, N,N-dibutylaniline, N,N-dihexylaniline, 2,6-diisopropylaniline, and 2,4,6-tri(t-butyl)aniline.

In addition, as the preferable basic compound represented by General Formula (BS-1), an alkyl group in which at least one R is substituted with a hydroxy group is exemplified. Specific examples thereof include triethanolamine and N,N-dihydroxyethylaniline.

Moreover, the alkyl group as R may have an oxygen atom in the alkyl chain. That is, an oxyalkylene chain may be formed. As the oxyalkylene chain, —$CH_2CH_2O$— is preferable. Specific examples thereof include tris(methoxyethoxyethyl)amine and a compound disclosed after line 60 of column 3 in the specification of U.S. Pat. No. 6,040,112A.

Examples of the basic compound represented by General Formula (BS-1) include the following ones.

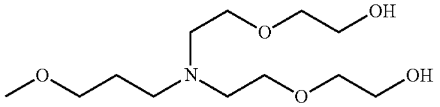

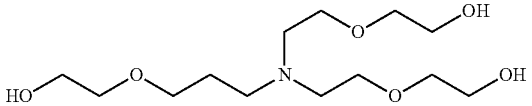

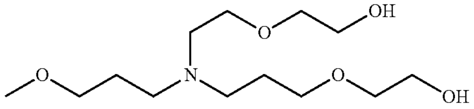

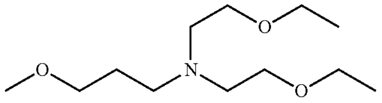

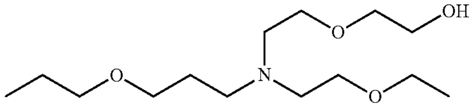

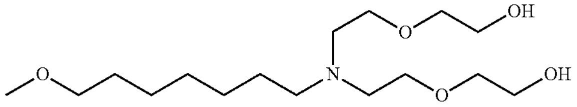

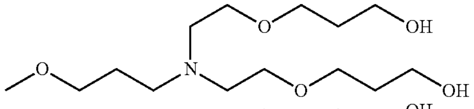

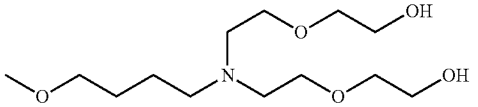

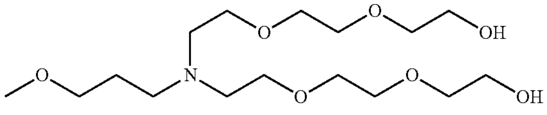

-continued

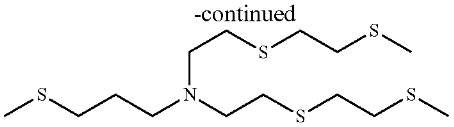

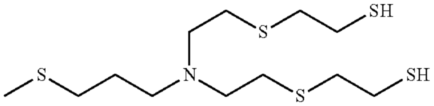

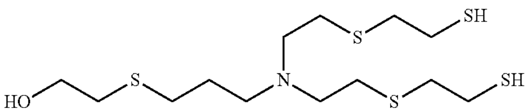

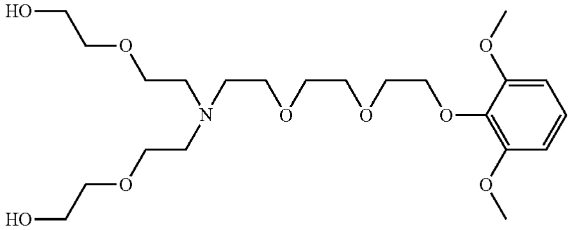

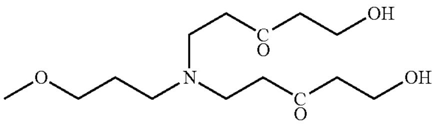

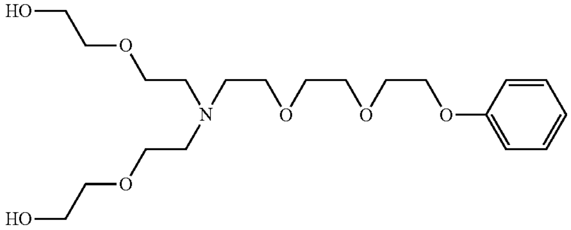

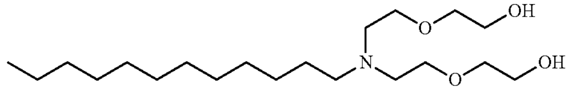

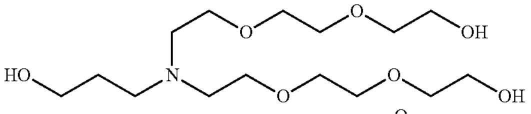

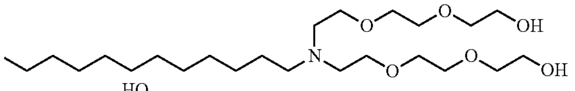

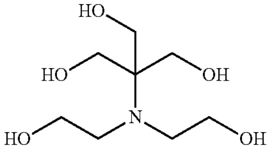

(2) Compound Having Nitrogen-Containing Heterocyclic Structure

The nitrogen-containing heterocycle may have aromatic properties, or may not have aromatic properties. The nitrogen-containing heterocycle may have a plurality of nitrogen atoms. Furthermore, the nitrogen-containing heterocycle may contain heteroatoms other than the nitrogen atom. Specific examples thereof include a compound having an imidazole structure (2-phenylbenzimidazole, 2,4,5-triphenylimidazole and the like), a compound having a piperidine structure [N-hydroxyethylpiperidine, bis(1,2,2,6,6-pentamethyl-4-piperidyl)sebacate, and the like], a compound having a pyridine structure (4-dimethylaminopyridine and the like), and a compound having an antipyrine structure (antipyrine, hydroxyantipyrine, and the like).

Furthermore, a compound having two or more ring structures is suitably used. Specific examples thereof include 1,5-diazabicyclo[4.3.0]non-5-ene and 1,8-diazabicyclo[5.4.0]undeca-7-ene.

(3) Amine Compound Having Phenoxy Group

An amine compound having a phenoxy group is a compound having a phenoxy group at the terminal on the opposite side to the N atom of the alkyl group which is contained in an amine compound. The phenoxy group may have a substituent such as an alkyl group, an alkoxy group, a halogen atom, a cyano group, a nitro group, a carboxy group, a carboxylic acid ester group, a sulfonic acid ester group, an aryl group, an aralkyl group, an acyloxy group, or an aryloxy group.

This compound more preferably has at least one oxyalkylene chain between the phenoxy group and the nitrogen atom. The number of oxyalkylene chains in one molecule is preferably 3 to 9, and more preferably 4 to 6. Among oxyalkylene chains, —$CH_2CH_2O$— is particularly preferable.

Specific examples thereof include 2-[2-{2-(2,2-dimethoxyphenoxyethoxy)ethyl}-bis-(2-methoxyethyl)]amine and the compounds (C1-1) to (C3-3) exemplified in paragraph [0066] in the specification of US2007/0224539A1.

An amine compound having a phenoxy group is obtained by, for example, heating a mixture of a primary or secondary amine having a phenoxy group and an haloalkyl ether to be reacted, by adding an aqueous solution of a strong base such as sodium hydroxide, potassium hydroxide, or tetraalkylammonium thereto, and by extracting the resultant product with an organic solvent such as ethyl acetate and chloroform. In addition, an amine compound having a phenoxy group can also be obtained by heating a mixture of a primary or secondary amine and an haloalkyl ether having a phenoxy group at the terminal to be reacted, by adding an aqueous solution of a strong base such as sodium hydroxide, potassium hydroxide, or tetraalkylammonium thereto, and by extracting the resultant product with an organic solvent such as ethyl acetate and chloroform.

(4) Ammonium Salt

An ammonium salt can also be appropriately used as the basic compound. Examples of the anion of the ammonium salt include halide, sulfonate, borate, and phosphate. Among these, halide or sulfonate is particularly preferable.

As the halide, chloride, bromide, or iodide is particularly preferable.

As the sulfonate, an organic sulfonate having 1 to 20 carbon atoms is particularly preferable. Examples of the organic sulfonate include alkyl sulfonate and aryl sulfonate having 1 to 20 carbon atoms.

The alkyl group included in the alkyl sulfonate may have a substituent. Examples of the substituent include a fluorine atom, a chlorine atom, a bromine atom, an alkoxy group, an acyl group, and an aryl group. Specific examples of the alkyl sulfonate include methanesulfonate, ethanesulfonate, butanesulfonate, hexanesulfonate, octanesulfonate, benzylsulfonate, trifluoromethanesulfonate, pentafluoroethanesulfonate, and nonafluorobutanesulfonate.

Examples of the aryl group included in the aryl sulfonate include a phenyl group, a naphthyl group, and an anthryl group. These aryl groups may have a substituent. As the substituent, for example, a linear or branched alkyl group having 1 to 6 carbon atoms or a cycloalkyl group having 3 to 6 carbon atoms is preferable. Specifically, for example, a methyl group, an ethyl group, an n-propyl group, an isopropyl group, an n-butyl group, an i-butyl group, a t-butyl group, an n-hexyl group, or a cyclohexyl group is preferable. Examples of other substituents include an alkoxy group having 1 to 6 carbon atoms, a halogen atom, a cyano group, a nitro group, an acyl group, and an acyloxy group.

The ammonium salt may be a hydroxide or a carboxylate. In this case, the ammonium salt is particularly preferably tetraalkylammonium hydroxide (tetraalkylammonium hydroxide such as tetramethylammonium hydroxide, tetraethylammonium hydroxide, or tetra-(n-butyl)ammonium hydroxide) having 1 to 8 carbon atoms.

Preferred examples of the basic compound include guanidine, aminopyridine, aminoalkylpyridine, aminopyrrolidine, indazole, imidazole, pyrazole, pyrazine, pyrimidine, purine, imidazoline, pyrazoline, piperazine, aminomorpholine, and aminoalkylmorpholine. These may further have a substituent.

Preferred examples of the substituent include an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxyl group, and a cyano group.

Particularly preferred examples of the basic compound include guanidine, 1,1-dimethylguanidine, 1,1,3,3-tetramethylguanidine, imidazole, 2-methylimidazole, 4-methylimidazole, N-methylimidazole, 2-phenylimidazole, 4,5-diphenylimidazole, 2,4,5-triphenylimidazole, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethyl piperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine, and N-(2-aminoethyl)morpholine.

(5) Compound (PA) that has Proton-Accepting Functional Group and Generates Compound in which Proton-Acceptability is Reduced or Lost, or which is Changed from being Proton-Accepting to be Acidic, by being Decomposed Upon Irradiation with Active Light or Radiation The composition according to the present invention may further include a basic compound [hereinafter also referred to as a compound (PA)] that has a functional group with proton acceptor properties and generates a compound in which proton acceptor properties are reduced or lost, or which is changed from being proton-accepting to be acidic, by decomposing upon irradiation with active light or radiation.

The functional group with proton acceptor properties refers to a functional group having a group or electron which is capable of electrostatically interacting with a proton, and for example, means a functional group with a macrocyclic structure, such as a cyclic polyether; or a functional group containing a nitrogen atom having an unshared electron pair not contributing to π-conjugation. The nitrogen atom having an unshared electron pair not contributing to π-conjugation is, for example, a nitrogen atom having a partial structure represented by the following formula.

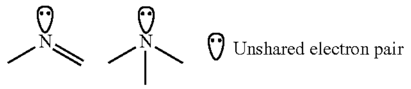

Preferred examples of the partial structure of the functional group with proton acceptor properties include crown ether, azacrown ether, primary to tertiary amines, pyridine, imidazole, and pyrazine structures.

The compound (PA) decomposes upon irradiation with active light or radiation to generate a compound exhibiting deterioration in proton acceptor properties, no proton acceptor properties, or a change from the proton acceptor properties to acid properties. Here, exhibiting deterioration in proton acceptor properties, no proton acceptor properties, or a change from the proton acceptor properties to acid properties means a change of proton acceptor properties due to the proton being added to the functional group with proton acceptor properties, and specifically a decrease in the equilibrium constant at chemical equilibrium when a proton adduct is generated from the compound (PA) having the functional group with proton acceptor properties and the proton.

The proton acceptor properties can be confirmed by carrying out pH measurement. In the present invention, the acid dissociation constant pKa of the compound generated by the decomposition of the compound (PA) upon irradiation with active light or radiation preferably satisfies $pKa<-1$, more preferably $-13<pKa<-1$, and still more preferably $-13<pKa<-3$.

In the present invention, the acid dissociation constant pKa indicates an acid dissociation constant pKa in an aqueous solution, and is described, for example, in Chemical Handbook (II) (Revised $4^{th}$ Edition, 1993, compiled by the Chemical Society of Japan, Maruzen Co., Ltd.), and a lower value thereof indicates higher acid strength. Specifically, the acid dissociation constant pKa in an aqueous solution may be measured by using an infinite-dilution aqueous solution and measuring the acid dissociation constant at 25° C., or a value based on the Hammett substituent constants and the database of publicly known literature data can also be obtained by computation using the following software package 1. All the values of pKa described in the present specification indicate values determined by computation using this software package.

Software package 1: Advanced Chemistry Development (ACD/Labs) Software V 8.14 for Solaris (1994-2007 ACD/Labs).

The compound (PA) generates a compound represented by the following General Formula (PA-1), for example, as the proton adduct generated by decomposition upon irradiation with active light or radiation. The compound represented by General Formula (PA-1) is a compound exhibiting deterioration in proton acceptor properties, no proton acceptor properties, or a change from the proton acceptor properties to acid properties since the compound has a functional group with proton acceptor properties as well as an acidic group, as compared with the compound (PA).

$$Q\text{-}A\text{-}(X)_n\text{-}B\text{-}R \quad \text{(PA-1)}$$

In General Formula (PA-1),

Q represents $—SO_3H$, $—CO_2H$, or $—X_1NHX_2Rf$, in which Rf represents an alkyl group, a cycloalkyl group, or an aryl group, and $X_1$ and $X_2$ each independently represent $—SO_2—$ or $—CO—$.

A represents a single bond or a divalent linking group.

X represents $—SO_2—$ or $—CO—$.

n is 0 or 1.

B represents a single bond, an oxygen atom, or $—N(R_x)R_y—$, in which Rx represents a hydrogen atom or a monovalent organic group, and $R_y$ represents a single bond or a divalent organic group, provided that Rx may be bonded to $R_y$ to form a ring or may be bonded to R to form a ring.

R represents a monovalent organic group having a functional group with proton acceptor properties.

General Formula (PA-1) will be described in more detail.

The divalent linking group in A is preferably a divalent linking group having 2 to 12 carbon atoms, such as and examples thereof include an alkylene group and a phenylene group. The divalent linking group is more preferably an alkylene group having at least one fluorine atom, preferably having 2 to 6 carbon atoms, and more preferably having 2 to 4 carbon atoms. The alkylene chain may contain a linking group such as an oxygen atom and a sulfur atom. In particular, the alkylene group is preferably an alkylene group in which 30% to 100% by number of the hydrogen atoms are substituted with fluorine atoms, and more preferably, the carbon atom bonded to the Q site has a fluorine atom. The alkylene group is still more preferably a perfluoroalkylene group, and even still more preferably a perfluoroethylene group, a perfluoropropylene group, or a perfluorobutylene group.

The monovalent organic group in Rx is preferably an organic group having 1 to 30 carbon atoms, and examples thereof include an alkyl group, a cycloalkyl group, an aryl group, an aralkyl group, and an alkenyl group. These groups may further have a substituent.

The alkyl group in Rx may have a substituent, is preferably a linear and branched alkyl group having 1 to 20 carbon atoms, and may have an oxygen atom, a sulfur atom, or a nitrogen atom in the alkyl chain.

Preferred examples of the divalent organic group in Ry include an alkylene group.

Other examples include a ring structure which may be formed by the mutual bonding of Rx and Ry include 5- to 10-membered rings, and particularly preferably 6-membered rings, each of which contains a nitrogen atom.

Furthermore, examples of the alkyl group having a substituent include a group formed by substituting a cycloalkyl group on a linear or branched alkyl group (for example, an adamantylmethyl group, an adamantylethyl group, a cyclohexylethyl group, and a camphor residue).

The cycloalkyl group in Rx may have a substituent, is preferably a cycloalkyl group having 3 to 20 carbon atoms, and may have an oxygen atom in the ring.

The aryl group in Rx may have a substituent, is preferably an aryl group having 6 to 14 carbon atoms.

The aralkyl group in Rx may have a substituent, is preferably an aralkyl group having 7 to 20 carbon atoms.

The alkenyl group in Rx may have a substituent and examples of the alkenyl group include a group having a double bond at an arbitrary position of the alkyl group mentioned as Rx.

The functional group with proton acceptor properties in R is the same as described above, and examples thereof include groups having nitrogen-containing heterocyclic aromatic structures or the like, such as azacrown ether, primary to tertiary amines, pyridine, and imidazole.

As the organic group having such a structure, ones having 4 to 30 carbon atoms are preferable, and examples thereof include an alkyl group, a cycloalkyl group, an aryl group, an aralkyl group, and an alkenyl group.

The alkyl group, the cycloalkyl group, the aryl group, the aralkyl group, and the alkenyl group in the alkyl group, the cycloalkyl group, the aryl group, the aralkyl group, and the alkenyl group, each including a functional group with proton acceptor properties or an ammonium group in R are the same as the alkyl group, the cycloalkyl group, the aryl group, the aralkyl group, and the alkenyl group, respectively, mentioned as Rx.

Examples of the substituent which may be contained in each of the groups include a halogen atom, a hydroxyl group, a nitro group, a cyano group, a carboxy group, a carbonyl group, a cycloalkyl group (preferably having 3 to 10 carbon atoms), an aryl group (preferably having 6 to 14 carbon atoms), an alkoxy group (preferably having 1 to 10 carbon atoms), an acyl group (preferably having 2 to 20 carbon atoms), an acyloxy group (preferably having 2 to 10 carbon atoms), an alkoxycarbonyl group (preferably having 2 to 20 carbon atoms), and an aminoacyl group (preferably having 2 to 20 carbon atoms). With regard to the cyclic structure and the aminoacyl group in the aryl group, the cycloalkyl group, or the like, examples of the substituent further include an alkyl group (preferably having 1 to 20 carbon atoms).

When B is —N(Rx)Ry-, it is preferable that R and Rx are bonded to each other to form a ring. The formation of a ring structure improves the stability and enhances the storage stability of a composition using the same. The number of carbon atoms which form a ring is preferably 4 to 20, the ring may be monocyclic or polycyclic, and an oxygen atom, and a sulfur atom, or a nitrogen atom may be contained in the ring.

Examples of the monocyclic structure include a 4-membered ring, a 5-membered ring, a 6-membered ring, a 7-membered ring, and a 8-membered ring, each containing a nitrogen atom, or the like. Examples of the polycyclic structure include structures formed by a combination of two or three, or more monocyclic structures. The monocyclic structure or the polycyclic structure may have a substituent, and as the substituent, for example, a halogen atom, a hydroxyl group, a cyano group, a carboxy group, a carbonyl group, a cycloalkyl group (preferably having 3 to 10 carbon atoms), an aryl group (preferably having 6 to 14 carbon atoms), an alkoxy group (preferably having 1 to 10 carbon atoms), an acyl group (preferably having 2 to 15 carbon atoms), an acyloxy group (preferably having 2 to 15 carbon atoms), an alkoxycarbonyl group (preferably having 2 to 15 carbon atoms), an aminoacyl group (preferably having 2 to 20 carbon atoms), or the like is preferable. With regard to the cyclic structure in the aryl group, the cycloalkyl group, or the like, examples of the substituent include an alkyl group (preferably having 1 to 15 carbon atoms). With regard to the aminoacyl group, examples of the substituent further include an alkyl group (preferably having 1 to 15 carbon atoms).

Rf in $—X_1NHX_2Rf$ represented by Q is preferably an alkyl group having 1 to 6 carbon atoms, which may have a fluorine atom, and more preferably a perfluoroalkyl group having 1 to 6 carbon atoms. Further, it is preferable that at least one of $X_1$ or $X_2$ is $—SO_2—$, with a case where both $X_1$ and $X_2$ are $—SO_2—$ being more preferable.

The compound represented by General Formula (PA-1) in which the Q site is sulfonic acid can be synthesized by a common sulfonamidation reaction. For example, the compound can be synthesized by a method in which one sulfonyl halide moiety of a bissulfonyl halide compound is selectively reacted with an amine compound to form a sulfonamide bond, and then the another sulfonyl halide moiety thereof is hydrolyzed, or a method in which a cyclic sulfonic acid anhydride is reacted with an amine compound to cause ring opening.

The compound (PA) is preferably an ionic compound. The functional group with proton acceptor properties may be contained in an anion moiety or a cation moiety, and it is preferable that the functional group is contained in an anion moiety.

Preferred examples of the compound (PA) include compounds represented by the following General Formulae (4) to (6).

$$R_f—X_2—N^-—X_1\text{-}A\text{-}(X)_n\text{-}B\text{-}R[C]^+ \quad (4)$$

$$R—SO_3^-[C]^+ \quad (5)$$

$$R—CO_2^-[C]^+ \quad (6)$$

In General Formulae (4) to (6), A, X, n, B, R, $R_f$, $X_1$, and $X_2$ each have the same definitions as in General Formula (PA-1).

$C^+$ represents a counter cation.

As the counter cation, an onium cation is preferable. More specifically, in the photoacid generator, more preferred examples thereof include a sulfonium cation described as $S^+(R_{201'})(R_{202'})(R_{203'})$ in General Formula (ZI) and an iodonium cation described as $I^+(R_{204'})(R_{205'})$ in General Formula (ZII).

Specific examples of the compound (PA) include, but not limited to, the compounds described in paragraphs [0743] to [0750] of JP2013-83966A.

Furthermore, in the present invention, compounds (PA) other than a compound which generates the compound represented by General Formula (PA-1) can also be appropriately selected. For example, a compound containing a proton acceptor moiety at its cation moiety may be used as an ionic compound. More specific examples thereof include a compound represented by the following General Formula (7).

$$(R\text{—})_m A^+ (\text{—}R_N)_n \quad X^- \quad (7)$$

In the formulae, A represents a sulfur atom or an iodine atom.

m represents 1 or 2 and n represents 1 or 2, provided that m+n=3 when A is a sulfur atom and that m+n=2 when A is an iodine atom.

R represents an aryl group.

$R_N$ represents an aryl group substituted with the functional group with proton acceptor properties.

$X^-$ represents a counter anion.

Specific examples of X include the same ones as $X^-$ in General Formula (ZI).

Specific preferred examples of the aryl group of R and $R_N$ include a phenyl group.

Specific examples of the functional group with proton acceptor properties, contained in $R_N$, are the same as the functional groups with proton acceptor properties described above in Formula (PA-1).

In the composition of the present invention, the blend ratio of the compound (PA) in the entire composition is preferably 0.1% to 10% by mass, and more preferably 1% to 8% by mass in the total solid content.

(6) Guanidine Compound

The composition may further contain a guanidine compound having a structure represented by the following formula.

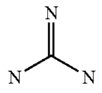

The guanidine compound exhibits strong basicity since the positive charge of the conjugate acid is dispersed and stabilized by the three nitrogen atoms.

For the basicity of the guanidine compound (A) of the present invention, the pKa of a conjugate acid is preferably 6.0 or more, preferably 7.0 to 20.0 since neutralization reactivity with an acid is high and the roughness properties are excellent, and more preferably 8.0 to 16.0.

Due to such strong basicity, the diffusibility of an acid is suppressed, and the strong basicity can contribute to formation of an excellent pattern shape.

Moreover, the "pKa" here represents pKa in an aqueous solution, and for example, it is described in Chemical Handbook (II) (Revised $4^{th}$ Edition, 1993, compiled by the Chemical Society of Japan, Maruzen Co., Ltd.), and a smaller value means higher acidity. Specifically, the pKa in aqueous solution can be obtained by measuring the acid dissociation constant at 25° C. using an infinite-dilution aqueous solution, and a value based on the database of Hammett substituent constants and known literature values can also be determined by calculation using the following software package 1. All of pKa values described in the present specification are values determined by calculation using this software package.

Software package 1: Advanced Chemistry Development (ACD/Labs) Software V 8.14 for Solaris (1994-2007 ACD/Labs).

In the present invention, the log P is a logarithmic value of an n-octanol/water distribution coefficient (P), and with respect to a wide range of compounds, it is an effective parameter that can characterize the hydrophilicity/hydrophobicity. In general, the distribution coefficient is determined not by experiment but by calculation, and in the present invention, the distribution coefficient is a value calculated by a CS Chem Draw Ultra Ver. 8.0 software package (Crippen's fragmentation method).

In addition, the log P of the guanidine compound (A) is preferably 10 or less. When the log P is the above value or less, the guanidine compound (A) can be uniformly contained in a resist film.

The log P of the guanidine compound (A) in the present invention is preferably in a range of 2 to 10, more preferably in a range of 3 to 8, and particularly preferably in a range of 4 to 8.

Furthermore, it is preferable that the guanidine compound (A) in the present invention has no nitrogen atom other than the guanidine structure.

Specific examples of the guanidine compound include the compounds described in paragraphs [0765] to [0768] of JP2013-83966A, but are not limited thereto.

(7) Low Molecular Compound Having Nitrogen Atom and Group Capable of Leaving by Action of Acid The composition of the present invention can include a low molecular compound (hereinafter referred to as a "low molecular compound (D)" or a "compound (D)") which has a nitrogen atom and a group capable of leaving by the action of an acid. The low molecular compound (D) preferably has basicity after the group capable of leaving by the action of an acid leaves.

The group capable of leaving by the action of an acid is not particularly limited, but an acetal group, a carbonate group, a carbamate group, a tertiary ester group, a tertiary hydroxyl group, or a hemiaminal ether group is preferable, and a carbamate group or a hemiaminal ether group is particularly preferable.

The molecular weight of the low molecular compound (D) having a group capable of leaving by the action of an acid is preferably 100 to 1,000, more preferably 100 to 700, and particularly preferably 100 to 500.

As the compound (D), an amine derivative having a group capable of leaving by the action of an acid on a nitrogen atom is preferable.

The compound (D) may have a carbamate group having a protecting group on a nitrogen atom. The protecting group constituting the carbamate group can be represented by the following General Formula (d-1).

(d-1)

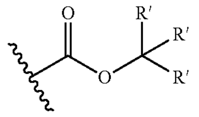

In General Formula (d-1),

R"s each independently represent a hydrogen atom, linear or branched alkyl group, a cycloalkyl group, an aryl group, an aralkyl group, or an alkoxyalkyl group. R"s may be bonded to each other to form a ring.

R' is preferably a linear or branched alkyl group, a cycloalkyl group, or an aryl group, and more preferably a linear or branched alkyl group or a cycloalkyl group.

Specific structures of such a group are shown below.

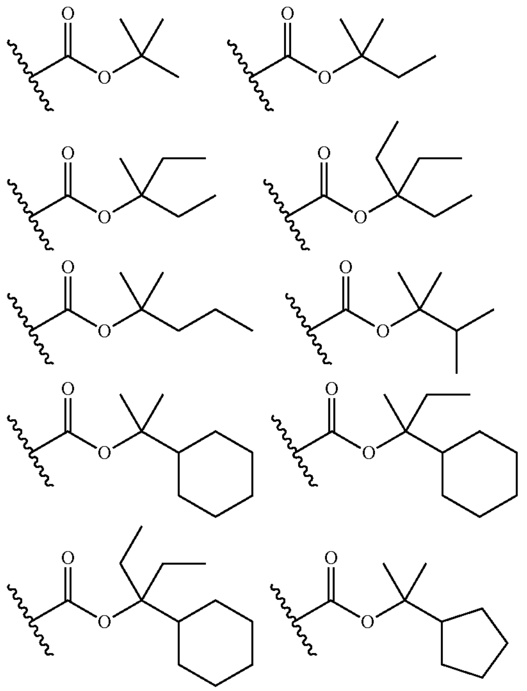

-continued
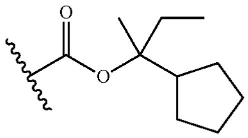
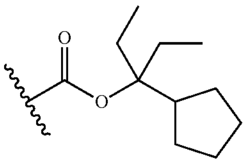
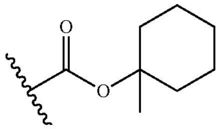
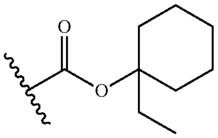
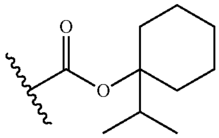
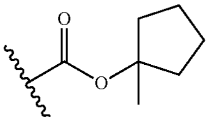
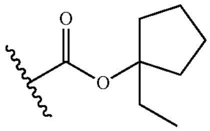
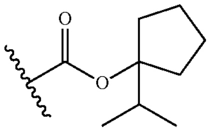
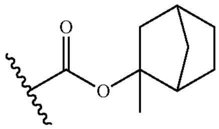
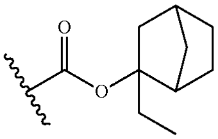
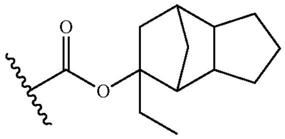
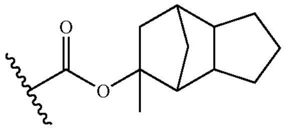
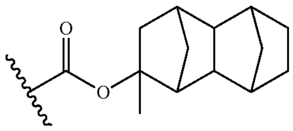
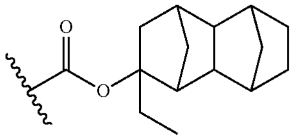
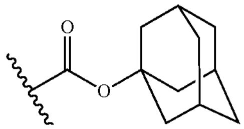
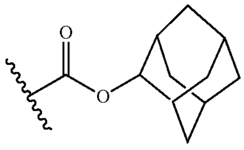
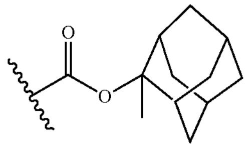
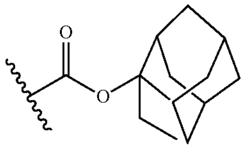
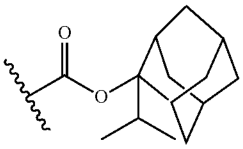
-continued
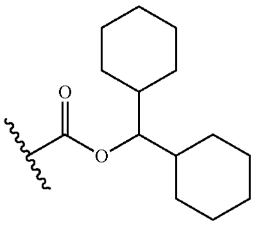
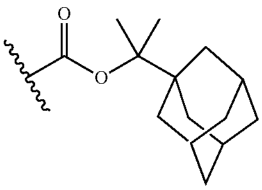
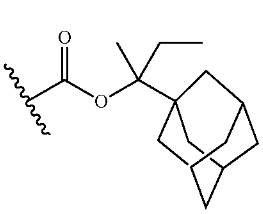
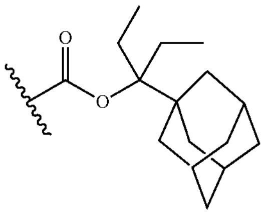
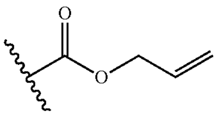
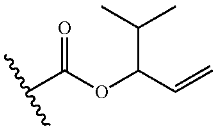
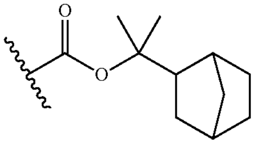
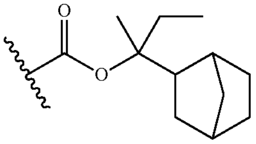
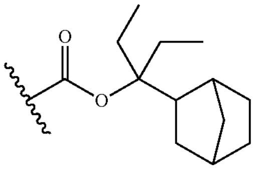
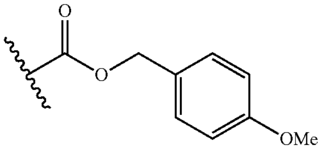
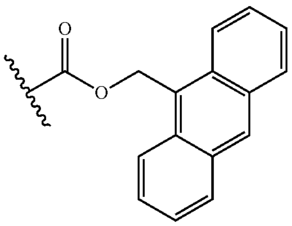
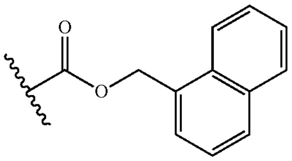
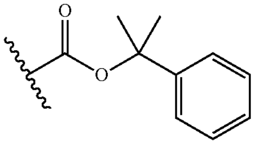
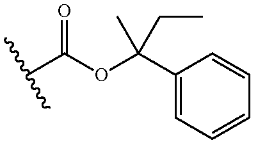

-continued

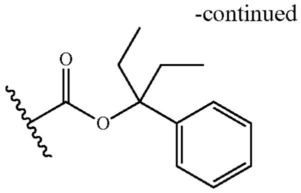

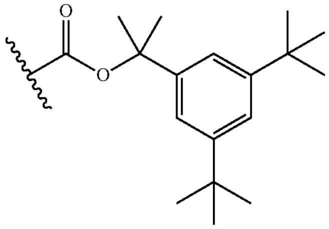

The compound (D) may also be constituted by arbitrarily combining various basic compounds which will be described later with the structure represented by General Formula (d-1).

The compound (D) is particularly preferably a compound having a structure represented by the following General Formula (A).

Incidentally, the compound (D) may be a compound corresponding to various basic compounds described above as long as it is a low molecular compound having a group capable of leaving by the action of an acid.

(A)

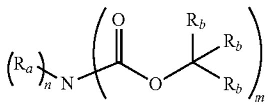

In General Formula (A), Ra represents a hydrogen atom, an alkyl group, a cycloalkyl group, an aryl group, or an aralkyl group. Further, with n=2, two Ra's may be the same as or different from each other, and two Ra's may be bonded to each other to form a divalent heterocyclic hydrocarbon group (preferably having 20 or less carbon atoms) or a derivative thereof.

Rb's each independently represent a hydrogen atom, an alkyl group, a cycloalkyl group, an aryl group, an aralkyl group, or an alkoxyalkyl group, provided that when one or more Rb in —C(Rb)(Rb)(Rb) are hydrogen atoms, at least one of the remaining Rb's is a cyclopropyl group, a 1-alkoxyalkyl group, or an aryl group.

At least two Rb's may be bonded to each other to form an alicyclic hydrocarbon group, an aromatic hydrocarbon group, a heterocyclic hydrocarbon group, or a derivative thereof.

n represents an integer of 0 to 2, m represents an integer of 1 to 3, and n+m=3.

In General Formula (A), the alkyl group, the cycloalkyl group, the aryl group, and the aralkyl group represented by Ra and Rb may be substituted with a functional group such as a hydroxyl group, a cyano group, an amino group, a pyrrolidino group, a piperidino group, a morpholino group, and an oxo group, an alkoxy group, or a halogen atom. The same applies to the alkoxyalkyl group represented by Rb.

Examples of the alkyl group, the cycloalkyl group, the aryl group, and the aralkyl group (each of the alkyl group, the cycloalkyl group, the aryl group, and the aralkyl group may be substituted with the functional group, an alkoxy group, or a halogen atom) of Ra and/or Rb include:

a group derived from a linear or branched alkane, such as methane, ethane, propane, butane, pentane, hexane, heptane, octane, nonane, decane, undecane, and dodecane, or a group in which the group derived from an alkane is substituted with one or more kinds of or one or more groups of cycloalkyl groups such as a cyclobutyl group, a cyclopentyl group, and a cyclohexyl group;

a group derived from a cycloalkane, such as cyclobutane, cyclopentane, cyclohexane, cycloheptane, cyclooctane, norbornane, adamantane, and noradamantane, or a group in which the group derived from a cycloalkane is substituted with one or more kinds of or one or more groups of linear or branched alkyl groups such as a methyl group, an ethyl group, an n-propyl group, an i-propyl group, an n-butyl group, a 2-methylpropyl group, a 1-methylpropyl group, and a t-butyl group;

a group derived from an aromatic compound, such as benzene, naphthalene, and anthracene, or a group in which the group derived from an aromatic compound is substituted with one or more kinds of or one or more groups of linear or branched alkyl groups such as a methyl group, an ethyl group, an n-propyl group, an i-propyl group, an n-butyl group, a 2-methylpropyl group, a 1-methylpropyl group, and a t-butyl group;

a group derived from a heterocyclic compound, such as pyrrolidine, piperidine, morpholine, tetrahydrofuran, tetrahydropyran, indole, indoline, quinoline, perhydroquinoline, indazole, and benzimidazole, or a group in which the group derived from a heterocyclic compound is substituted with one or more kinds of or one or more groups of linear or branched alkyl groups or aromatic compound-derived groups; a group in which the group derived from a linear or branched alkane or the group derived from a cycloalkane is substituted with one or more kinds of or one or more groups of aromatic compound-derived groups such as a phenyl group, a naphthyl group, and an anthracenyl group; and a group in which the substituent above is substituted with a functional group such as a hydroxyl group, a cyano group, an amino group, a pyrrolidino group, a piperidino group, a morpholino group, and an oxo group.

Examples of the divalent heterocyclic hydrocarbon group (preferably having 1 to 20 carbon atoms) formed by the mutual bonding of Ra's, or a derivative thereof include a group derived from a heterocyclic compound, such as pyrrolidine, piperidine, morpholine, 1,4,5,6-tetrahydropyrimidine, 1,2,3,4-tetrahydroquinoline, 1,2,3,6-tetrahydropyridine, homopiperazine, 4-azabenzimidazole, benzotriazole, 5-azabenzotriazole, 1H-1,2,3-triazole, 1,4,7-triazacyclononane, tetrazole, 7-azaindole, indazole, benzimidazole, imidazo[1,2-a]pyridine, (1S,4S)-(+)-2,5-diazabicyclo[2.2.1]heptane, 1,5,7-triazabicyclo[4.4.0]dec-5-ene, indole, indoline, 1,2,3,4-tetrahydroquinoxaline, perhydroquinoline and 1,5,9-triazacyclododecane, and a group in which the group derived from a heterocyclic compound is substituted with one or more kinds of or one or more groups of a linear or branched alkane-derived group, a cycloalkane-derived group, an aromatic compound-derived group, a heterocyclic compound-derived group, and a functional group such as a hydroxyl group, a cyano group, an amino group, a pyrrolidino group, a piperidino group, a morpholino group, and an oxo group.

Specific examples of the particularly preferred compound (D) in the present invention include the compounds described in paragraphs [0786] to [0788] of JP2013-83966A, but the present invention is not limited thereto.

The compound represented by General Formula (A) can be synthesized in accordance with JP2007-298569A, JP2009-199021A, or the like.

In the present invention, the low molecular compound (D) may be used singly or as a mixture of two or more kinds thereof.

Other examples of the basic compound which can be used include the compounds synthesized in Examples of JP2002-363146A and the compounds described in paragraph 0108 of JP2007-298569A.

A photosensitive basic compound may also be used as the basic compound. As the photosensitive basic compound, for example, the compounds described in JP2003-524799A, J. Photopolym. Sci. & Tech., Vol. 8, pp. 543-553 (1995), or the like can be used.

(Content of Basic Compound)

The content of the basic compound in the topcoat composition is preferably 0.01% to 20% by mass, more preferably 0.1% to 10% by mass, and still more preferably 1% to 5% by mass, with respect to the solid content of the topcoat composition.

(Base Generator)

Examples of the base generator (photobase generator) which can be added to the composition of the present invention include compounds described in JP1992-151156A (JP-H04-151156A), JP1992-162040A (JP-H04-162040A), JP1993-197148A (JP-H05-197148A), JP1993-5995A (JP-H05-5995A), JP1994-194834A (JP-H06-194834A), JP1996-146608A (JP-H08-146608A), JP1998-83079A (JP-H10-83079A), and EP622682B.

Furthermore, the compounds described in JP2010-243773A can also be appropriately used.

Specific suitable examples of the photobase generator include 2-nitrobenzyl carbamate, 2,5-dinitrobenzylcyclohexyl carbamate, N-cyclohexyl-4-methylphenylsulfonamide, and 1,1-dimethyl-2-phenylethyl-N-isopropyl carbamate, but are not limited thereto.

(Content of Base Generator)

The content of the base generator in the topcoat composition is preferably 0.01% to 20% by mass, more preferably 0.1% to 10% by mass, and still more preferably 1% to 5% by mass, with respect to the solid content of the topcoat composition.

(Method for Preparing Topcoat Composition)

It is preferable that the topcoat composition of the present invention is used by dissolving the respective components described above in a solvent, and filtering the solution through a filter. The filter is preferably a polytetrafluoroethylene-, polyethylene-, or nylon-made filter having a pore size of 0.1 μm or less, more preferably 0.05 μm or less, and still more preferably 0.03 μm or less. Further, the filter may be used by connecting a plurality of kinds of filters in series or in parallel. In addition, the composition may be filtered a plurality of times, and the step of performing filtration a plurality of times may be a circular filtration step. Furthermore, the composition may be subjected to a deaeration treatment or the like before and after filtration through a filter. It is preferable that the topcoat composition of the present invention includes no impurities such as a metal. The content of the metal components included in the these materials is preferably 10 ppm or less, more preferably 5 ppm or less, still more preferably 1 ppm or less, and particularly preferably, metal components are not substantially contained (no higher than the detection limit of a measurement device).

<Surfactant>

The topcoat composition of the present invention may further include a surfactant.

The surfactant is not particularly limited, and any of an anionic surfactant, a cationic surfactant, and a nonionic surfactant can be used as long as it can form a topcoat composition uniformly, and further, be dissolved in the solvent of the topcoat composition.

The amount of the surfactant to be added is preferably 0.001% to 20% by mass, and more preferably 0.01% to 10% by mass.

The surfactant may be used singly or in combination of two or more kinds thereof.

As the surfactant, for example, one selected from an alkyl cation-based surfactant, an amide type quaternary cation-based surfactant, an ester type quaternary a cation-based surfactant, an amine oxide-based surfactant, a betaine-based surfactant, an alkoxylate-based surfactant, a fatty acid ester-based surfactant, an amide-based surfactant, an alcohol-based surfactant, an ethylenediamine-based surfactant, and a fluorine- and/or silicon-based surfactant (a fluorine-based surfactant, a silicon-based surfactant, or a surfactant having both of a fluorine atom and a silicon atom) can be appropriately used.

Specific examples of the surfactant include polyoxyethylene alkyl ethers such as polyoxyethylene lauryl ether, polyoxyethylene stearyl ether, polyoxyethylene cetyl ether, and polyoxyethylene oleyl ether; polyoxyethylene alkylallyl ethers such as polyoxyethylene octylphenol ether and polyoxyethylene nonylphenol ether; polyoxyethylene/polyoxypropylene block copolymers; sorbitan fatty acid esters such as sorbitan monolaurate, sorbitan monopalmitate, sorbitan monostearate, sorbitan monooleate, sorbitan trioleate, and sorbitan tristearate; surfactants such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate, or the like; and commercially available surfactants mentioned later.

Examples of the commercially available surfactants that can be used include fluorine-based surfactants or silicon-based surfactants such as EFTOP EF301 and EF303 (manufactured by Shin-Akita Kasei K. K.); FLORAD FC430, 431, and 4430 (manufactured by Sumitomo 3M Inc.); MEGAFACE F171, F173, F176, F189, F113, F110, F177, F120, and R08 (manufactured by DIC Corp.); SURFLON S-382, SC101, 102, 103, 104, 105, and 106 (manufactured by Asahi Glass Co., Ltd.); TROYSOL S-366 (manufactured by Troy Chemical Corp.); GF-300 and GF-150 (manufactured by Toagosei Chemical Industry Co., Ltd.); SURFLON S-393 (manufactured by Seimi Chemical Co., Ltd.); EFTOP EF121, EF122A, EF122B, RF122C, EF125M, EF135M, EF351, EF352, EF801, EF802, and EF601 (manufactured by JEMCO Inc.); PF636, PF656, PF6320, and PF6520 (manufactured by OMNOVA Solutions Inc.); and FTX-204G, 208G, 218G, 230G, 204D, 208D, 212D, 218D, and 222D (manufactured by NEOS Co., Ltd.). In addition, Polysiloxane Polymer KP-341 (manufactured by Shin-Etsu Chemical Co., Ltd.) can also be used as the silicon-based surfactant.

[Resist Pattern]

The present invention also relates to a resist pattern formed by the pattern forming method of the present invention as described above.

[Method for Manufacturing Electronic Device, and Electronic Device]

Moreover, the present invention also relates to a method for manufacturing an electronic device, including the pattern forming method of the present invention as described above, and an electronic device manufactured by this manufacturing method.

The electronic device of the present invention is suitably mounted in electrical or electronic equipments (household electronic appliance, Office Automation (OA)/media-related equipment, optical equipment, telecommunication equipment, and the like).

EXAMPLES

Hereinafter, the present invention will be described with reference to Examples, but the contents of the present invention are not limited thereto.

Synthesis Example 1: Synthesis of Resin (1)

102.3 parts by mass of cyclohexanone was heated at 80° C. under a nitrogen stream. While stirring this liquid, a mixed solution of 22.2 parts by mass of a monomer represented by the following Structural Formula M-1, 22.8 parts by mass of a monomer represented by the following Structural Formula M-2, 6.6 parts by mass of a monomer represented by the following Structural Formula M-3, 189.9 parts by mass of cyclohexanone, and 2.40 parts by mass of dimethyl 2,2'-azobisisobutyrate [V-601, manufactured by Wako Pure Chemical Industries, Ltd.] was added dropwise to the liquid for 5 hours. After completion of the dropwise addition, the mixture was further stirred at 80° C. for 2 hours. After being left to be cooled, the reaction liquid was reprecipitated with a large amount of hexane/ethyl acetate (mass ratio of 9:1) and filtered, and the obtained solid was dried in vacuum to obtain 41.1 parts by mass of a resin (1).

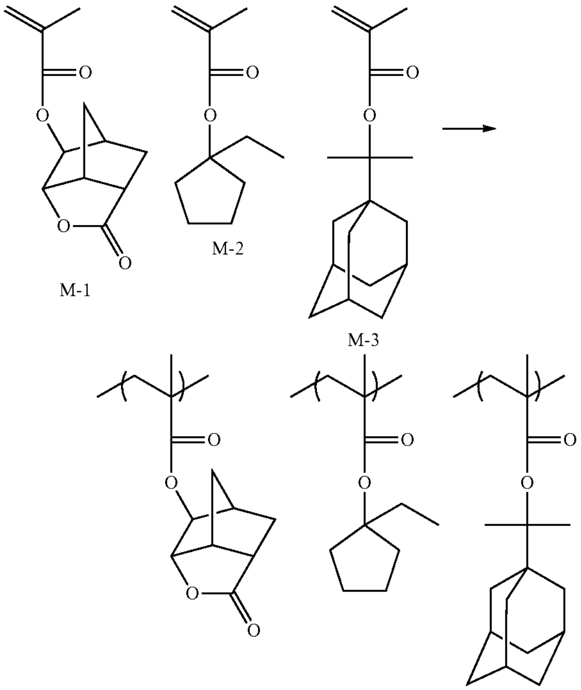

M-1 M-2 M-3

Resin (1)

The weight-average molecular weight (Mw: in terms of polystyrene) of the obtained resin (1), as determined by GPC (carrier: tetrahydrofuran (THF)) was Mw=9,500, and the dispersity was Mw/Mn=1.62. The compositional ratio measured by $^{13}C$-NMR was 40/50/10 in terms of a molar ratio.

Synthesis Example 2: Synthesis of Resins (2) and (12)

By carrying out the same operation as in Synthesis Example 1, the resins (2) to (12) described below were synthesized as an acid-decomposable resin. The structures of the resins (1) to (12) are shown below.

Resin (1)

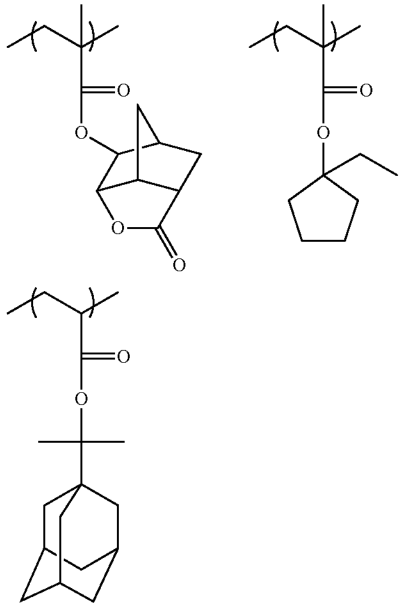

Resins (2)

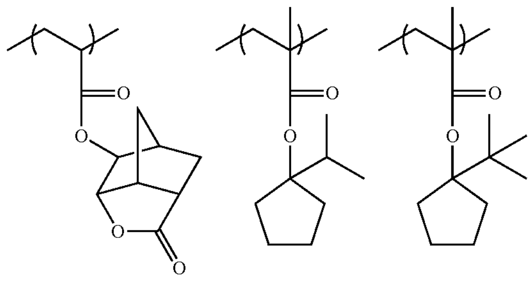

Resins (3)

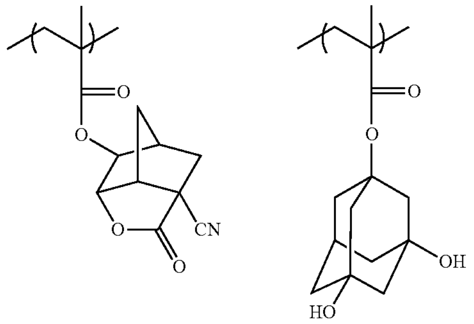

-continued
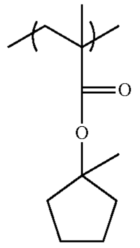
Resin (4)
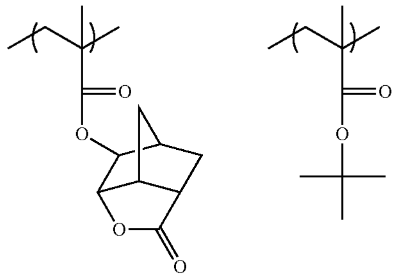
Resin (5)
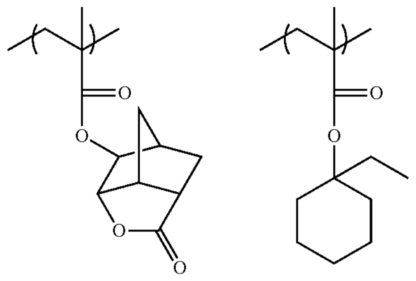
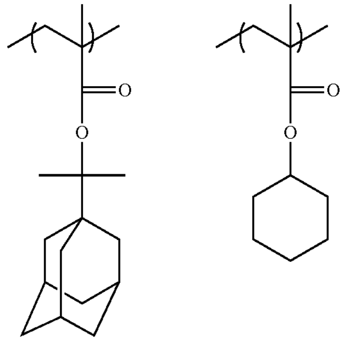
Resin (6)
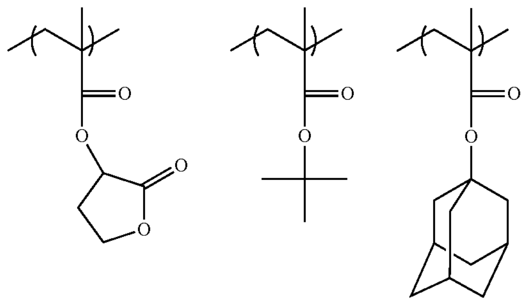
-continued
Resin (7)
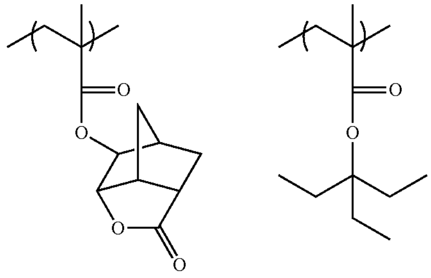
Resin (8)
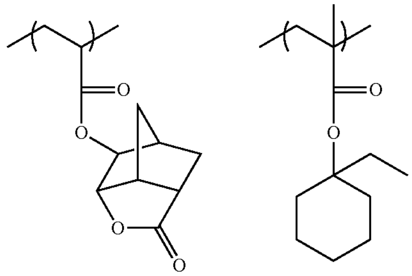
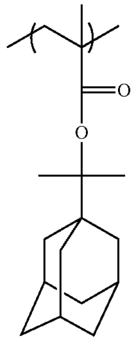
Resin (9)
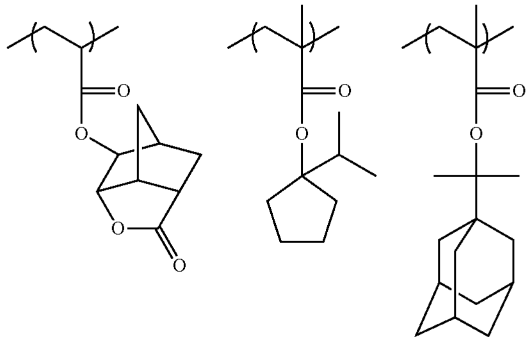
Resin (10)
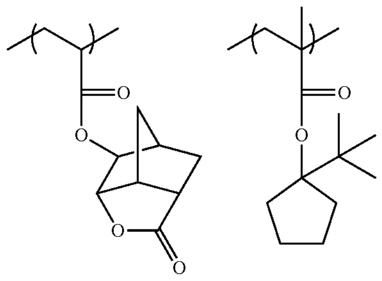

-continued

Resin (11)

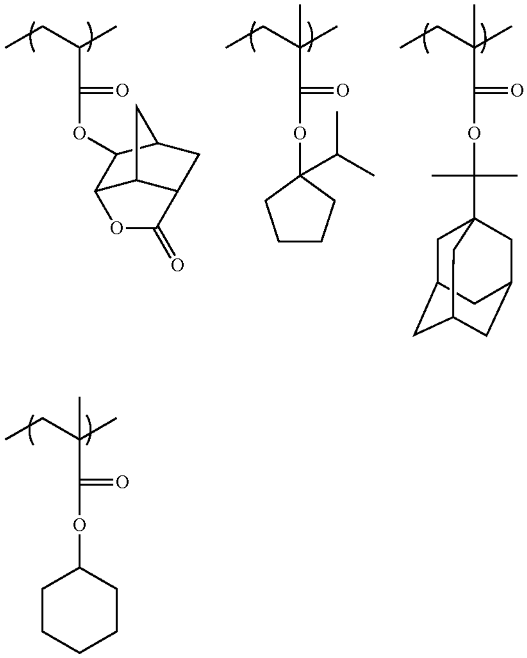

Resin (12)

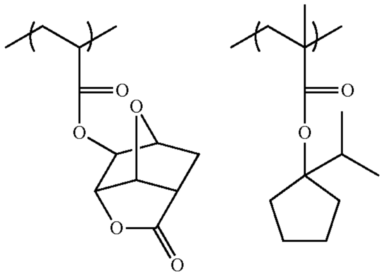

-continued

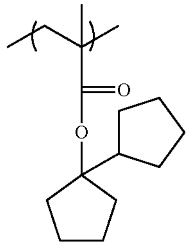

The compositional ratios (molar ratios; corresponding to the repeating units in order from the left side), the weight-average molecular weights (Mw), and the dispersities (Mw/Mn) of the repeating units in the resins (1) to (12) are summarized in Table 1. These were determined by the same methods as for the resin (1) as described above.

TABLE 1

| | Compositional ratio (molar ratio) | | | | Mw | Mw/Mn |
|---|---|---|---|---|---|---|
| Resin (1) | 40 | 50 | 10 | — | 9,500 | 1.62 |
| Resin (2) | 40 | 40 | 20 | — | 17,000 | 1.70 |
| Resin (3) | 45 | 5 | 50 | — | 11,000 | 1.63 |
| Resin (4) | 40 | 60 | — | — | 15,000 | 1.66 |
| Resin (5) | 40 | 40 | 10 | 10 | 10,500 | 1.62 |
| Resin (6) | 40 | 50 | 10 | — | 15,500 | 1.68 |
| Resin (7) | 40 | 60 | — | — | 11,000 | 1.65 |
| Resin (8) | 40 | 40 | 20 | — | 10,000 | 1.64 |
| Resin (9) | 40 | 50 | 10 | — | 9,000 | 1.60 |
| Resin (10) | 40 | 60 | — | — | 10,000 | 1.61 |
| Resin (11) | 40 | 40 | 10 | 10 | 8,500 | 1.60 |
| Resin (12) | 40 | 40 | 20 | — | 9,500 | 1.61 |

<Preparation of Resist Composition>

The components shown in Table 2 below were dissolved in the solvents shown in Table 2 below to prepare solutions having a concentration of the solid content of 3.5% by mass, and the solutions were filtered through a polyethylene filter having a pore size of 0.03 μm to obtain resist compositions Re-1 to Re-13.

TABLE 2

| | Resin (10 g) | Photoacid generator (g) | Basic compound (g) | Hydrophobic resin (0.05 g) | Solvent (mass ratio) | Surfactant (10 mg) |
|---|---|---|---|---|---|---|
| Re-1 | Resin (1) | A1 (1.5) | D-2 (0.61) | 1b | A1 | W-1 |
| Re-2 | Resin (2) | A2 (1.6) | D-5 (0.31) | 2b | A1/A2 (70/30) | — |
| Re-3 | Resin (3) | A3 (1.6) | D-3 (0.30) | 3b | A1/B1 (80/20) | — |
| Re-4 | Resin (4) | A4 (1.6) | D-4 (0.30) | 4b | A1 | W-3 |
| Re-5 | Resin (5) | A5 (1.8) | D-1 (0.70) | 4b | A1 | — |
| Re-6 | Resin (6) | A6 (1.7) | D-6 (0.30) | 1b | A1/B1 (80/20) | — |
| Re-7 | Resin (7) | A7 (2.1) | D-4 (0.30) | 1b | A1/B1 (90/10) | W-2 |
| Re-8 | Resin (8) | A8 (2.0) | D-8 (0.30) | 3b | A1 | — |
| Re-9 | Resin (9) | A9 (2.2) | D-7 (0.30) | 3b | A1/A2 (80/20) | — |
| Re-10 | Resin (10) | A10 (1.9) | D-5 (0.31) | 1b | A1/B1 (90/10) | — |
| Re-11 | Resin (11) | A11 (2.0) | D-5 (0.31) | 4b | A1 | — |
| Re-12 | Resin (12) | A12 (1.8) | D-8 (0.30) | 1b/5b (0.02 g/0.03 g) | A1/A3 (95/5) | W-1 |
| Re-13 | Resin (2) | A1/A13 (1.1/1.3) | D-2 (0.61) | 4b | A1/A2 (70/30) | W-1 |

The abbreviations in Table 2 are shown below.
<Photoacid Generator>
A1
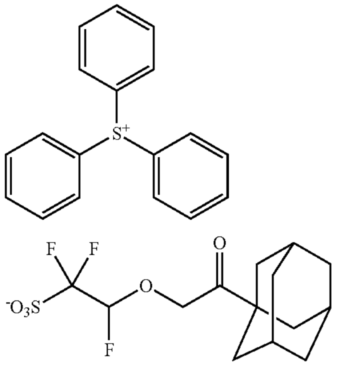
A2
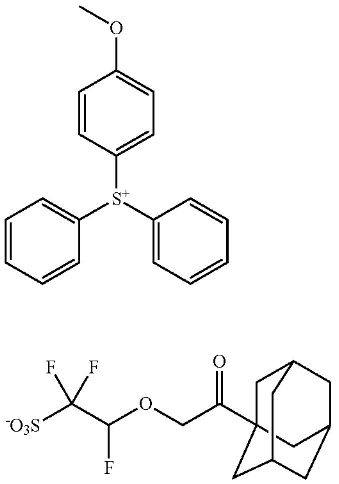
A3
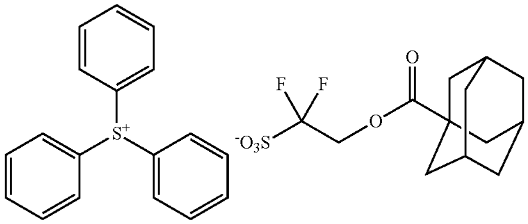
A4
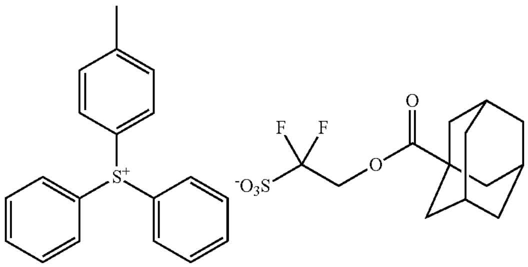
-continued
A5
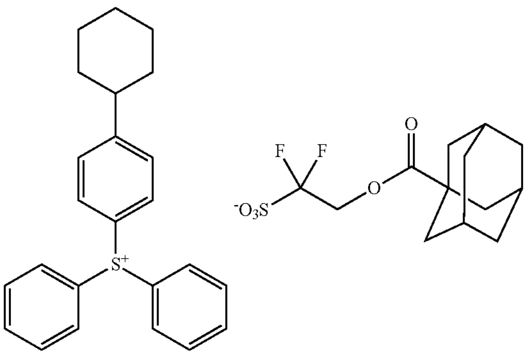
A6
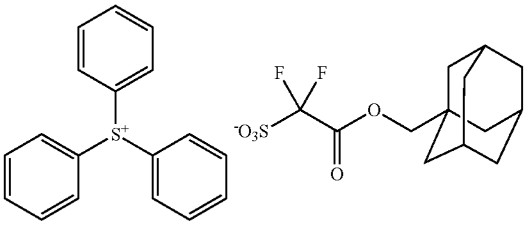
A7
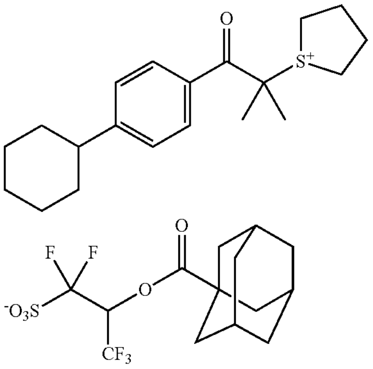
A8
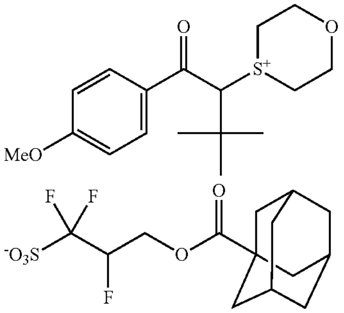
A9
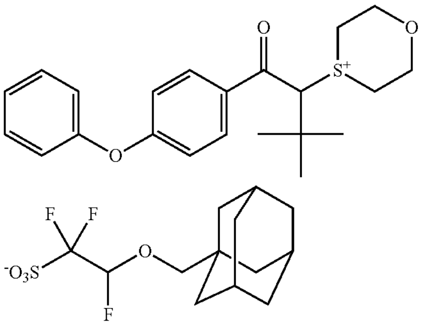

-continued
A10
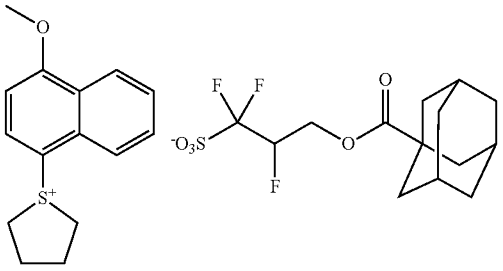
A11
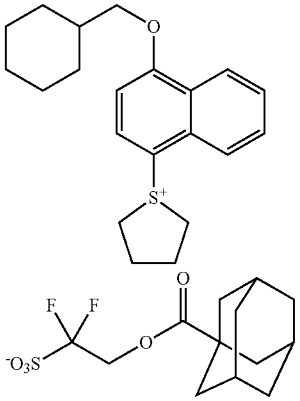
-continued
A12
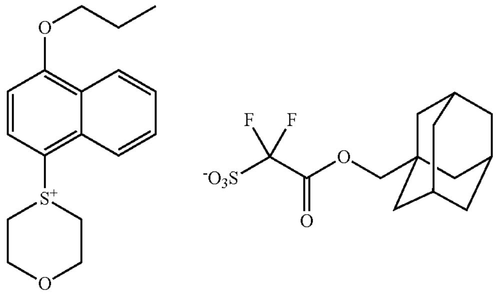
A13
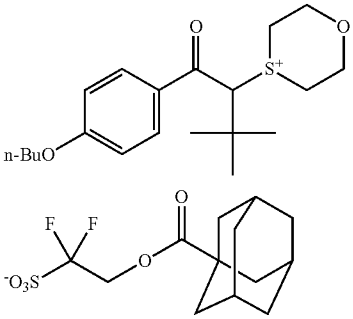
<Basic Compound>
D-1
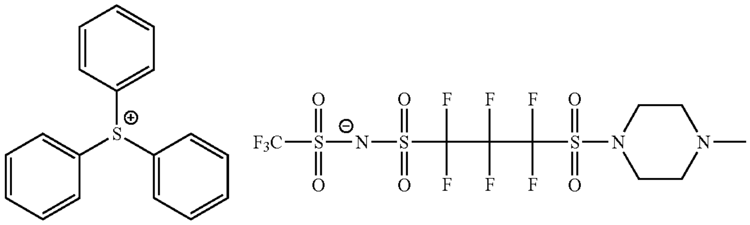
D-2
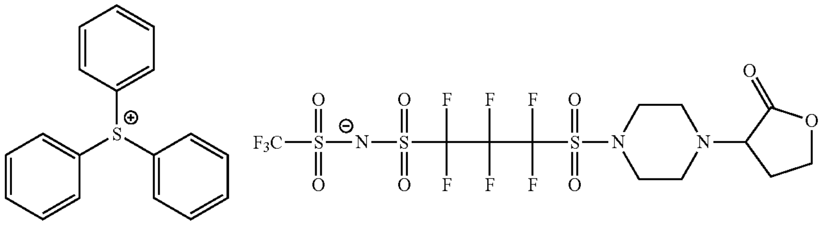
D-3
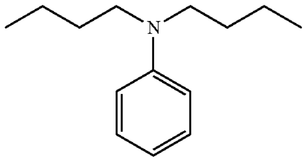
D-4
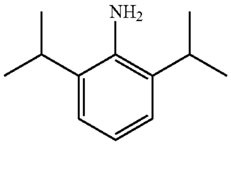
D-5
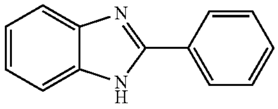
D-6
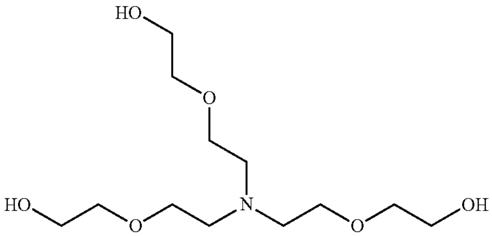

-continued

D-7

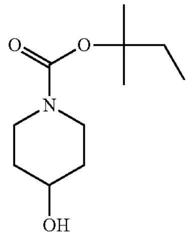

D-8

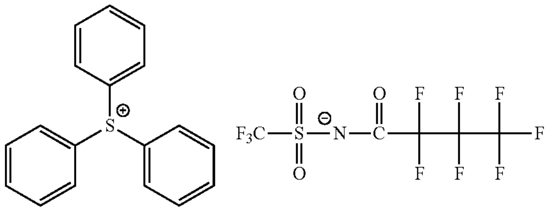

<Hydrophobic Resin>

(1b)

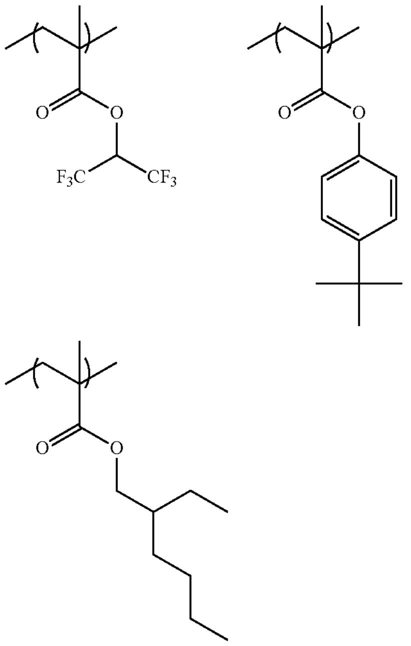

(2b)

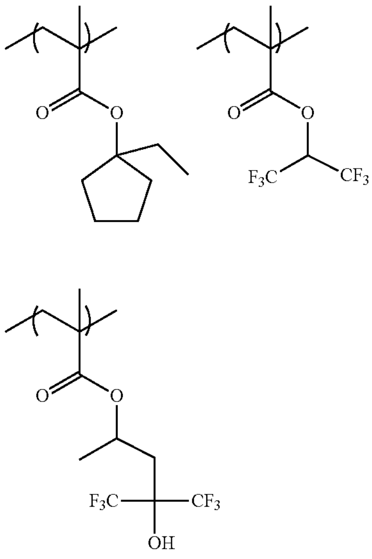

-continued (3b)

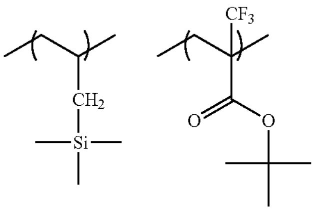

(4b)

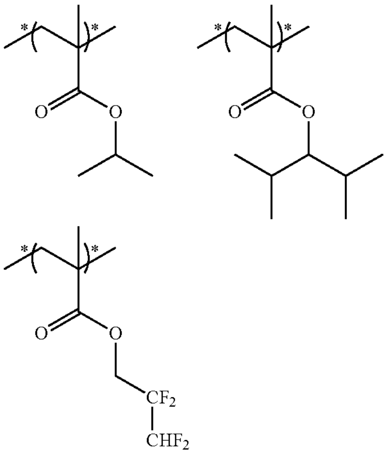

(5b)

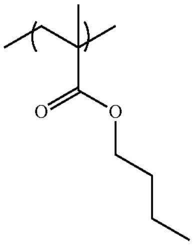

The compositional ratios (molar ratios; corresponding to the repeating units in order from the left side), the weight-average molecular weights (Mw), and the dispersities (Mw/Mn) of the respective repeating units in the hydrophobic resins (1b) to (5b) are summarized in Table 3. These were determined by the same methods as for the resin (1) as described above.

TABLE 3

| | Compositional ratio (molar ratio) | | | | Mw | Mw/Mn |
|---|---|---|---|---|---|---|
| Resin (1b) | 50 | 45 | 5 | — | 7,000 | 1.30 |
| Resin (2b) | 40 | 40 | 20 | — | 18,600 | 1.57 |

TABLE 3-continued

| | Compositional ratio (molar ratio) | | | | Mw | Mw/Mn |
|---|---|---|---|---|---|---|
| Resin (3b) | 50 | 50 | — | — | 25,400 | 1.63 |
| Resin (4b) | 30 | 65 | 5 | — | 28,000 | 1.70 |
| Resin (5b) | 100 | — | — | — | 12,500 | 1.65 |

<Solvent>

A1: Propylene glycol monomethyl ether acetate (PGMEA)

A2: Cyclohexanone

A3: γ-Butyrolactone

B1: Propylene glycol monomethyl ether (PGME)

<Surfactant>

W-1: MEGAFACE F176 (manufactured by DIC, Inc.; fluorine-based)

W-2: MEGAFACE R08 (manufactured by DIC, Inc.; fluorine- and silicon-based)

W-3: PF6320 (manufactured by OMNOVA Solutions Inc.; fluorine-based)

Synthesis Example 3: Synthesis of Resins (X1) to (X6)

The same procedure as in Synthesis Example 1 was carried out to synthesize resins (X1) to (X6) described below, which are included in the topcoat composition. The structures of the resins (X1) to (X6) were shown below.

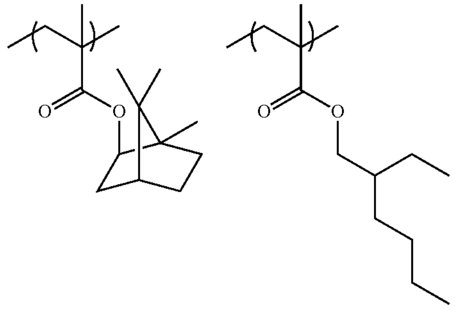

(X1)

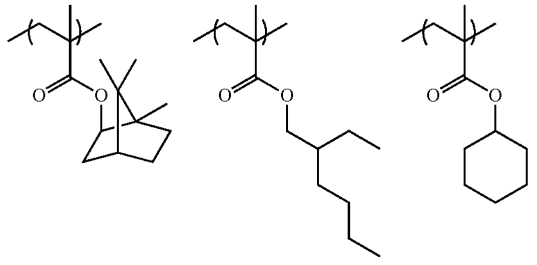

(X2), (X3), (X4)

-continued

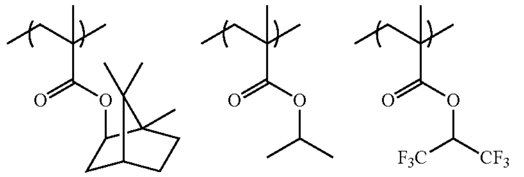

(X5)

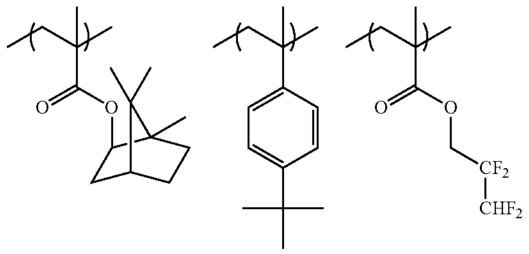

(X6)

The compositional ratios (molar ratios; corresponding to the repeating units in order from the left side), the weight-average molecular weights (Mw), and the dispersities (Mw/Mn) of the respective repeating units in the resins (X1) to (X6) are summarized in Table 4. These were determined by the same methods as for the resin (1) as described above.

TABLE 4

| | Compositional ratio (molar ratio) | | | Mw | Mw/Mn |
|---|---|---|---|---|---|
| Resin (X1) | 60 | 40 | — | 15,000 | 1.7 |
| Resin (X2) | 60 | 30 | 10 | 17,000 | 1.9 |
| Resin (X3) | 60 | 30 | 10 | 16,500 | 1.5 |
| Resin (X4) | 60 | 30 | 10 | 20,500 | 1.5 |
| Resin (X5) | 60 | 30 | 10 | 19,000 | 1.7 |
| Resin (X6) | 60 | 30 | 10 | 15,000 | 1.5 |

<Preparation of Topcoat Composition>

The components shown in Table 5 below were dissolved in the solvents shown in Table 5 below to prepare solutions having a concentration of the solid content of 2.7% by mass, and the solutions were filtered through a polyethylene filter having a pore size of 0.03 μm to obtain topcoat compositions A-1 to A-11.

TABLE 5

| | Resin (mass ratio) | Additive Type | Additive Addition amount (based on solid content) [% by mass] | Solvent |
|---|---|---|---|---|
| A-1 | X1 | — | — | 4-Methyl-2-pentanol |
| A-2 | X1 | TQ-1 | 2 | 1-Butanol |
| A-3 | X1 | TQ-2 | 2 | 4-Methyl-2-pentanol |
| A-4 | X1 | TQ-3 | 2 | Propylene glycol monomethyl ether |

TABLE 5-continued

| | Resin (mass ratio) | Additive Type | Additive Addition amount (based on solid content) [% by mass] | Solvent |
|---|---|---|---|---|
| A-5 | X1 | TQ-4 | 2.5 | 4-Methyl-2-pentanol |
| A-6 | X1 | TQ-5 | 5 | Propylene glycol monomethyl ether |
| A-7 | X2 | TQ-1 | 8 | 1-Butanol |
| A-8 | X3 | TQ-2 | 6 | 4-Methyl-2-pentanol |
| A-9 | X4 | TQ-3 | 3 | 1-Butanol |
| A-10 | X5 | TQ-1 | 1 | 4-Methyl-2-pentanol |
| A-11 | X2/X6 (70/30) | TQ-2 | 2 | Propylene glycol monomethyl ether |

The abbreviations in Table 5 are shown below.

<Additives>

TQ-1

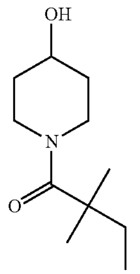

TQ-2

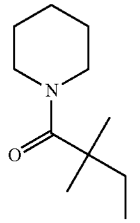

TQ-3

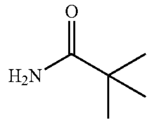

TQ-4

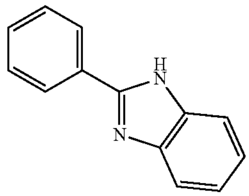

TQ-5

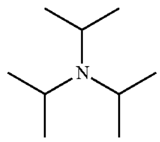

Examples 1 to 16 and Comparative Examples 1 to 3

Using the prepared resist compositions and topcoat compositions, resist patterns were formed and evaluated by the following methods.

(Formation of Hole Pattern)

An organic antireflection film ARC29SR (manufactured by Brewer Science, Inc.) was coated on a silicon wafer, and baking was carried out at 205° C. for 60 seconds to form an antireflection film having a film thickness of 86 nm. A resist composition shown in Table 6 below was coated thereon, and baking was carried out at 100° C. for 60 seconds, to form a resist film having a film thickness of 90 nm.

Next, the topcoat composition shown in Table 6 below was coated on the resist film, and then baking was carried out at the PB temperature (unit: ° C.) shown in Table 6 below for 60 seconds to form an upper layer film having a film thickness of 90 nm (however, in Comparative Example 1, the upper layer film was not formed).

Subsequently, the resist film having the upper layer film formed thereon (in Comparative Example 1, the resist film having the upper layer film not formed thereon) was subjected to pattern exposure via a squarely arrayed halftone mask with hole portions of 65 nm and pitches between holes of 100 nm (the hole portions were shielded), using an ArF excimer laser liquid immersion scanner (manufactured by ASML; XT1700i, NA1.20, C-Quad, outer sigma 0.730, inner sigma 0.630, and XY inclination). Ultrapure water was used as the immersion liquid. Thereafter, heating (Post Exposure Bake: PEB) was carried out at 105° C. for 60 seconds. Then, development was carried out by paddling for 30 seconds using an organic developer described in Table 6 below, and rinsing was carried out by paddling for 30 seconds using a rinsing liquid described in Table 6 below. Subsequently, a hole pattern with a hole diameter of 50 nm was obtained by rotating the wafer at a rotation speed of 2,000 rpm for 30 seconds.

(Formation of Line-and-Space Pattern)

In the same manner as in formation of hole patterns, a film having an organic antireflection film, a resist film, and an upper layer film coated in this order was formed on the silicon wafer.

Then, pattern exposure was carried out via a halftone mask with space portions of 55 nm and pitches between spaces of 110 nm, using an ArF excimer laser liquid immersion scanner (manufactured by ASML; XT1700i, NA1.20, Dipole, outer sigma 0.800, inner sigma 0.564, and Y deflection). Ultrapure water was used as an immersion liquid. Thereafter, heating (Post Exposure Bake: PEB) was carried out at 105° C. for 60 seconds. Then, development was carried out by paddling for 30 seconds using an organic developer described in Table 6 below, and rinsing was carried out by paddling for 30 seconds using a rinsing liquid described in Table 6 below (in a case where rinsing was not carried out, "-" was described in Table 6 below). Subsequently, a line pattern with a line width of 50 nm was obtained by rotating the wafer at a rotation speed of 2,000 rpm for 30 seconds.

(Depth of Focus (DOF))

In the exposure dose for forming a hole pattern with a hole diameter of 50 nm under the exposure and development conditions in (Formation of Hole Pattern) above, exposure and development were carried out by changing the conditions of the exposure focus at a unit of 20 nm in the focus direction. The hole diameter (CD) of each of the obtained patterns was measured using a line-width critical dimension scanning electron microscope SEM (S-9380, Hitachi, Ltd.), and the minimum value or the maximum value in a curve obtained by plotting the respective CDs was defined as a best focus. When the focus was changed at a center of the best focus, a variation width of the focus with which a line width of 50 nm±10% was available, that is, depth of focus (DOF, unit: nm) was calculated. A larger value thereof indicates better performance. The results are shown in Table 6 below.

(Line Edge Roughness (LER))

The line pattern with a line width of 50 nm, formed under the exposure and development conditions in (Formation of Line-and-Space Pattern) above was observed using a line-width critical dimension scanning electron microscope SEM (S-9380, Hitachi, Ltd.). The distance between the basis line where the edge shall be present and the real edge was measured for 50 points at the same intervals falling within a range of 5 μm in the longitudinal direction of the line pattern. The standard deviation for the distance was determined to calculate 3a (unit: nm), which was defined as LER. A smaller value thereof indicates better performance. The results are shown in Table 6 below.

(Exposure Latitude (EL))

The hole size was observed using a critical dimension scanning electron microscope SEM (S-938011, Hitachi, Ltd.), and the optimal exposure dose at which a contact hole pattern having an average hole portion of 50 nm was resolved was defined as a sensitivity ($E_{opt}$) (mJ/cm$^2$). Then, based on the determined optimal exposure dose ($E_{opt}$), the exposure dose when the hole size became ±10% of 50 nm (that is, 45 nm and 55 nm) which were target values was determined. Then, the exposure latitude (EL, unit: %) defined by the following equation was calculated. As the value of EL was increased, the change in performance due to a change in the exposure dose was decreased, which is thus good.

$$[EL\ (\%)]=[(\text{Exposure dose when a hole portion becomes 45 nm})-(\text{Exposure dose when a hole portion becomes 55 nm})]/E_{opt}\times 100$$

TABLE 6

| | Resist composition | Topcoat composition | PB temperature [° C.] | Organic developer | Rinsing liquid | DOF [nm] | LER [nm] | EL [%] |
|---|---|---|---|---|---|---|---|---|
| Example 1 | Re-1 | A-1 | 100 | Butyl acetate | 4-Methyl-2-heptanol | 100 | 5.7 | 19.1 |
| Example 2 | Re-1 | A-1 | 110 | Butyl acetate | 4-Methyl-2-heptanol | 105 | 5.5 | 19.3 |
| Example 3 | Re-1 | A-1 | 120 | Butyl acetate | 4-Methyl-2-heptanol | 120 | 5.4 | 19.5 |
| Example 4 | Re-1 | A-1 | 130 | Butyl acetate | 4-Methyl-2-heptanol | 125 | 5.4 | 19.8 |
| Example 5 | Re-2 | A-1 | 120 | 2-Heptanone | 4-Methyl-2-heptanol | 110 | 5.8 | 19.4 |
| Example 6 | Re-3 | A-1 | 140 | Butyl acetate | 4-Methyl-2-heptanol | 110 | 5.6 | 19.5 |
| Example 7 | Re-4 | A-2 | 120 | Butyl acetate | 4-Methyl-2-heptanol | 120 | 5.5 | 19.6 |
| Example 8 | Re-5 | A-3 | 120 | Butyl acetate | 4-Methyl-2-heptanol | 120 | 5.8 | 19.4 |
| Example 9 | Re-6 | A-4 | 120 | 2-Heptanone | 4-Methyl-2-heptanol | 120 | 5.4 | 19.5 |
| Example 10 | Re-7 | A-5 | 120 | Butyl propionate | n-Decane | 120 | 5.6 | 19.6 |
| Example 11 | Re-8 | A-6 | 120 | Butyl acetate | n-Decane | 120 | 5.8 | 19.5 |
| Example 12 | Re-9 | A-7 | 120 | Butyl acetate | n-Decane | 120 | 5.4 | 19.1 |
| Example 13 | Re-10 | A-8 | 120 | Butyl propionate | 4-Methyl-2-heptanol | 120 | 5.6 | 19.2 |
| Example 14 | Re-11 | A-9 | 120 | Butyl acetate | 4-Methyl-2-heptanol | 120 | 5.7 | 19.6 |
| Example 15 | Re-12 | A-10 | 120 | Butyl acetate | 4-Methyl-2-heptanol | 120 | 5.8 | 19.6 |
| Example 16 | Re-13 | A-11 | 120 | Butyl acetate | 4-Methyl-2-heptanol | 120 | 5.4 | 19.5 |
| Comparative Example 1 | Re-1 | — | — | Butyl acetate | 4-Methyl-2-heptanol | 60 | 6.4 | 17.5 |
| Comparative Example 2 | Re-1 | A-1 | 90 | Butyl acetate | 4-Methyl-2-heptanol | 80 | 6.8 | 17.0 |
| Comparative Example 3 | Re-1 | A-1 | 90 | Butyl acetate | 4-Methyl-2-heptanol | 90 | 6.4 | 16.8 |

As apparent from the results shown in Table 6 above, in Examples 1 to 16 in which the PB temperature was set to 100° C. or higher, DOF and LER were excellent, as compared with Comparative Example 1 in which an upper layer film was not formed, and Comparative Examples 2 and 3 in which an upper layer film was formed but the PB temperature was set to lower than 100° C. Further, EL was also good.

In addition, in comparison of Examples 1 to 4 in which the same resist compositions and topcoat compositions were used, it could be seen that there is a tendency that as the PB temperature increases, both of DOF and LER are improved within a PB temperature range of 100° C. to 130° C.

What is claimed is:

1. A pattern forming method comprising:

a step a of coating an active-light-sensitive or radiation-sensitive resin composition onto a substrate to form a resist film;

a step b of coating a composition for forming an upper layer film onto the resist film, followed by carrying out heating to 100° C. or higher, to form the upper layer film on the resist film;

a step c of exposing the resist film having the upper layer film formed thereon; and a step d of developing the exposed resist film using a developer including an organic solvent to form a pattern, wherein the active-light-sensitive or radiation-sensitive resin composition contains a hydrophobic resin (D), and the hydrophobic resin (D) has at least two of a fluorine atom, a silicon atom, and a $CH_3$ partial structure which is contained in a side chain moiety of the hydrophobic resin (D).

2. The pattern forming method according to claim 1, wherein the step b is a step of carrying out heating to 120° C. or higher.

3. The pattern forming method according to claim 2, wherein the composition for forming an upper layer film includes at least one of a basic compound or a base generator.

4. The pattern forming method according to claim 3, wherein the step d is a step of carrying out development using a developer including butyl acetate.

5. The pattern forming method according to claim 3, wherein the step d is a step of carrying out development using a developer including 2-heptanone.

6. The pattern forming method according to claim 3, wherein the step d is a step of carrying out development using a developer including butyl propionate.

7. The pattern forming method according to claim 2, wherein the step d is a step of carrying out development using a developer including butyl acetate.

8. The pattern forming method according to claim 2, wherein the step d is a step of carrying out development using a developer including 2-heptanone.

9. The pattern forming method according to claim 2, wherein the step d is a step of carrying out development using a developer including butyl propionate.

10. The pattern forming method according to claim 1, wherein the composition for forming an upper layer film includes at least one of a basic compound or a base generator.

11. The pattern forming method according to claim 10, wherein the step d is a step of carrying out development using a developer including butyl acetate.

12. The pattern forming method according to claim 10, wherein the step d is a step of carrying out development using a developer including 2-heptanone.

13. The pattern forming method according to claim 10, wherein the step d is a step of carrying out development using a developer including butyl propionate.

14. The pattern forming method according to claim 1, wherein the step d is a step of carrying out development using a developer including butyl acetate.

15. The pattern forming method according to claim 1, wherein the step d is a step of carrying out development using a developer including 2-heptanone.

16. The pattern forming method according to claim 1, wherein the step d is a step of carrying out development using a developer including butyl propionate.

17. A resist pattern formed by the pattern forming method according to claim 1.

18. A pattern forming method comprising:

a step a of coating an active-light-sensitive or radiation-sensitive resin composition onto a substrate to form a resist film;

a step b of coating a composition for forming an upper layer film onto the resist film, followed by carrying out heating to higher than 120° C., to form the upper layer film on the resist film;

a step c of exposing the resist film having the upper layer film formed thereon; and a step d of developing the exposed resist film using a developer including an organic solvent to form a pattern.

* * * * *